(12) United States Patent
Katou

(10) Patent No.: US 8,887,115 B1
(45) Date of Patent: Nov. 11, 2014

(54) ASSIGNING METHOD, RECORDING MEDIUM, INFORMATION PROCESSING APPARATUS, AND ANALYSIS SYSTEM

(71) Applicant: Fujitsu Limited, Kawasaki (JP)

(72) Inventor: Tomoki Katou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/246,203

(22) Filed: Apr. 7, 2014

(30) Foreign Application Priority Data

Apr. 17, 2013 (JP) ................................. 2013-086651

(51) Int. Cl.
*G06F 17/50* (2006.01)
*G06F 17/16* (2006.01)

(52) U.S. Cl.
CPC ...................................... *G06F 17/16* (2013.01)
USPC ........................................................ 716/119

(58) Field of Classification Search
CPC ................. G06F 17/30; G06F 17/50
USPC ........................................................ 716/119
See application file for complete search history.

(56) References Cited

U.S. PATENT DOCUMENTS

| | | | |
|---|---|---|---|
| 2006/0285740 A1* | 12/2006 | Okita | 382/151 |
| 2007/0035706 A1* | 2/2007 | Margulis | 353/122 |
| 2007/0229806 A1* | 10/2007 | Lally et al. | 356/237.1 |

FOREIGN PATENT DOCUMENTS

| | | |
|---|---|---|
| JP | 2000-227470 | 8/2000 |
| JP | 2003-330977 | 11/2003 |
| JP | 2004-54642 | 2/2004 |
| JP | 2009-5250 | 1/2009 |
| JP | 2012-14246 | 1/2012 |

* cited by examiner

*Primary Examiner* — Vuthe Siek
*Assistant Examiner* — Mohammed Alam
(74) *Attorney, Agent, or Firm* — Fujitsu Patent Center

(57) ABSTRACT

A method includes: calculating a position-dependent processing load to be caused by a process that depends on a position of a cell, for each of cells into which a spatial area specified as a target of an analysis to be executed by processing devices that are included in a first number of processing devices and synchronize for each unit in time domain is divided; and assigning the cells to a second number of processing devices which are part or all of the first number of processing devices, under a condition where a criterion determined with respect to uniformity in a total processing time among processing devices used for the analysis is met. The total processing time of each processing device includes a length of time to be taken to execute each process depending on the position of each of cell(s) to be assigned to this processing device.

18 Claims, 23 Drawing Sheets

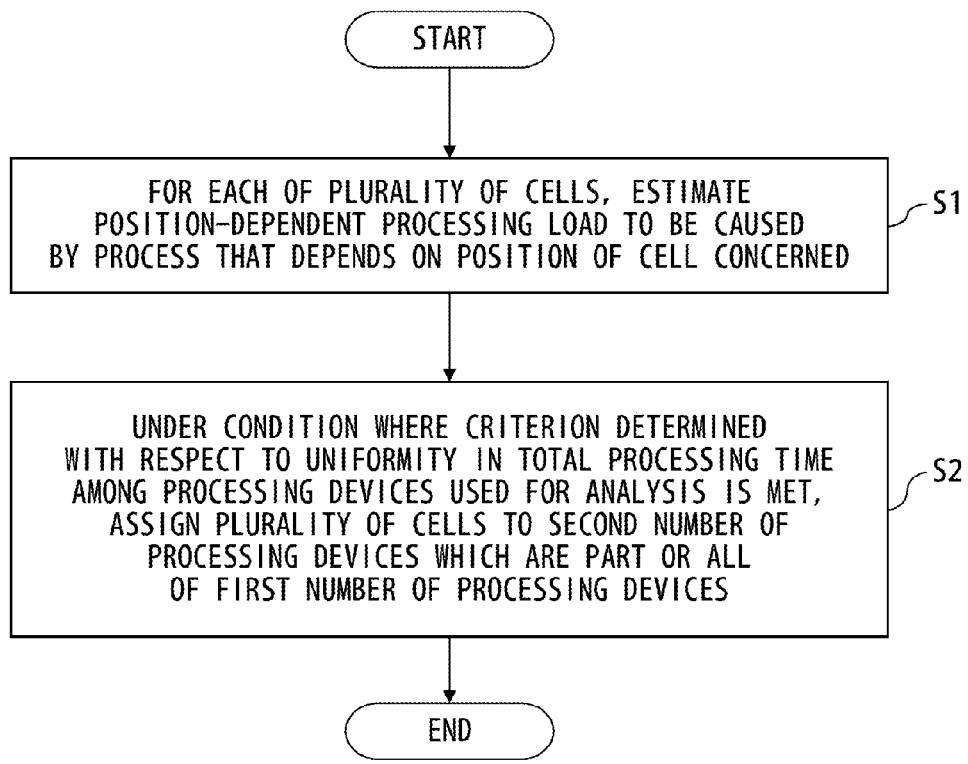
F I G. 1

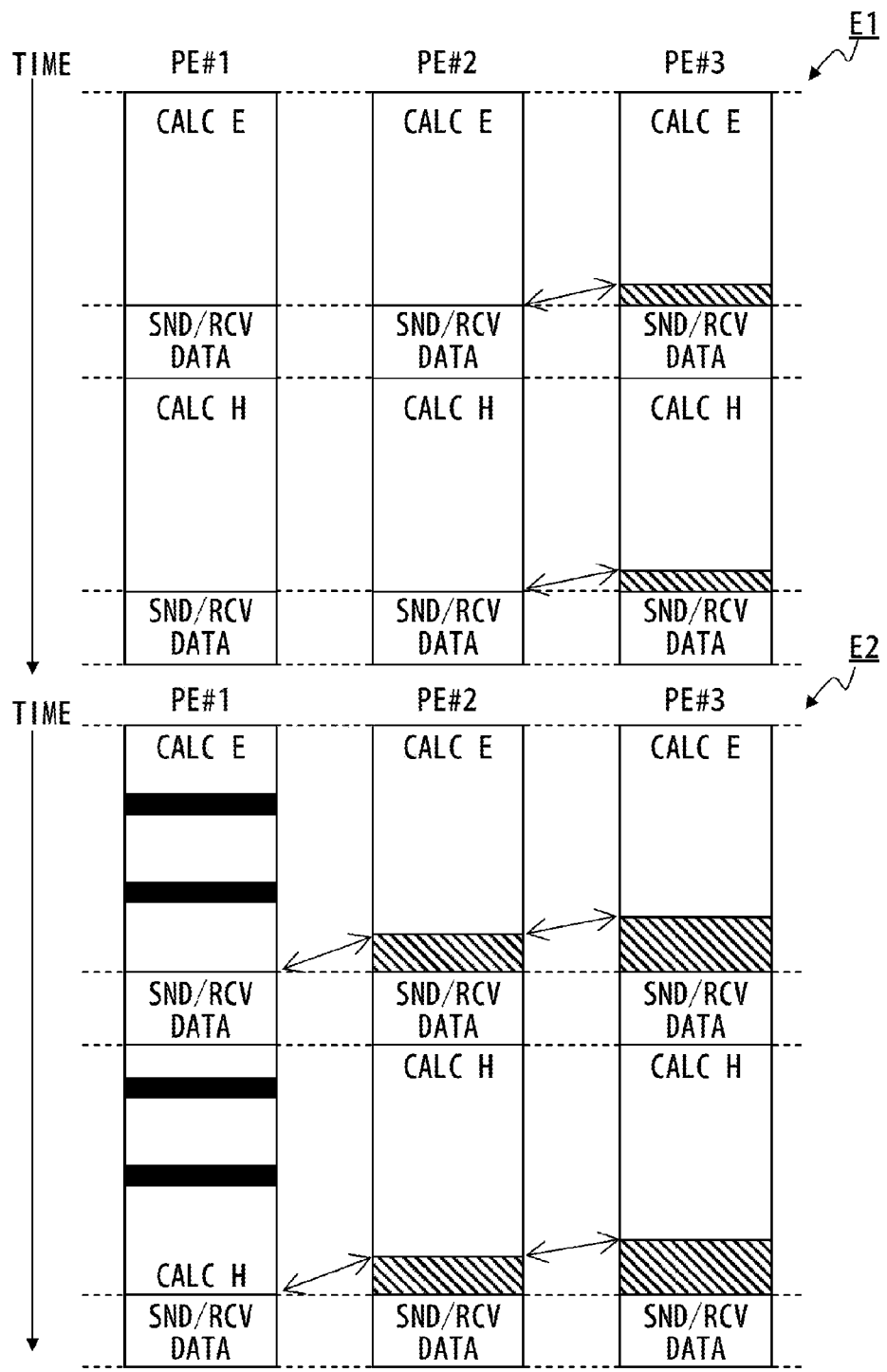
F I G. 2

| | 200 |
|---|---|
| 201 — 202 — COMMAND SET FOR COMPUTING Ex | |
| 203 — COMMAND SET FOR COMPUTING Ey | |
| 204 — COMMAND SET FOR COMPUTING Ez | |
| 205 — COMMAND SET FOR DATA TRANSMISSION/RECEPTION | |
| 206 — COMMAND SET FOR COMPUTING Hx | |
| 207 — COMMAND SET FOR COMPUTING Hy | |
| 208 — COMMAND SET FOR COMPUTING Hz | |
| 209 — COMMAND SET FOR DATA TRANSMISSION/RECEPTION | |
| 210 — COMMAND SET FOR COPYING COMPUTATION RESULT OF Ex | |
| 211 — COMMAND SET FOR COPYING COMPUTATION RESULT OF Ey | |
| 212 — COMMAND SET FOR COPYING COMPUTATION RESULT OF Ez | |
| 213 — COMMAND SET FOR COPYING COMPUTATION RESULT OF Hx | |
| 214 — COMMAND SET FOR COPYING COMPUTATION RESULT OF Hy | |
| COMMAND SET FOR COPYING COMPUTATION RESULT OF Hz | |

| | 201 |
|---|---|
| 221 — SET [i,j,k] | |
| 222 — SDRAM read [Cx] | |
| 223 — SDRAM read [Ex(i,j,k)] | |
| 224 — SDRAM read [Gx] | |
| 225 — SDRAM read [Hz(i,j,k)] | |
| 226 — SDRAM read [Hz(i,j-1,k)] | |
| 227 — SDRAM read [Hy(i,j,k)] | |
| 228 — SDRAM read [Hy(i,j,k-1)] | |
| 229 — CALC | |
| 230 — ... | |
| 231 — CALC | |
| 232 — SDRAM write [Ex(i,j,k)] | |
| BRANCH&JUMP [i,j,k] | |

F I G. 1 0

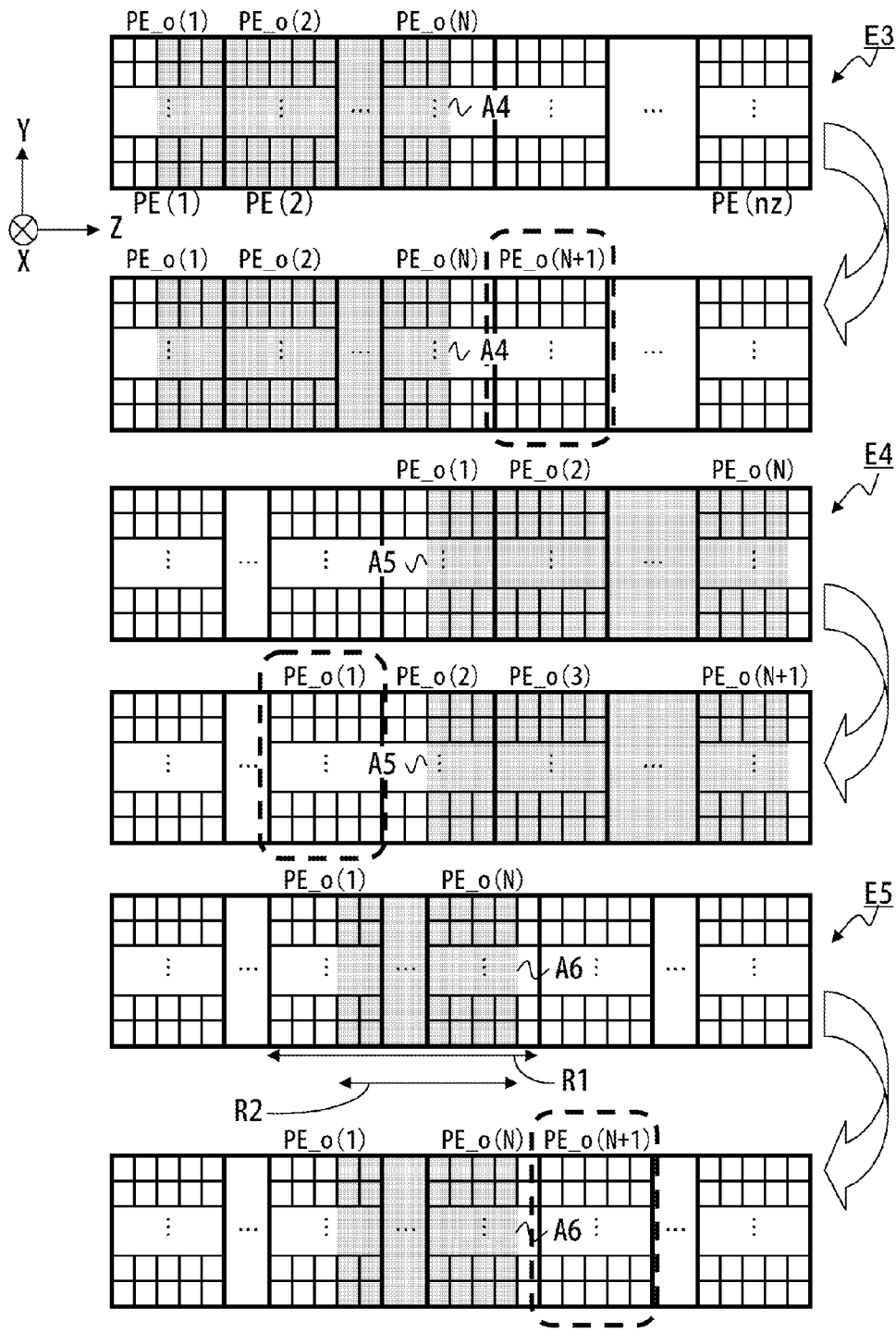
F I G. 1 2

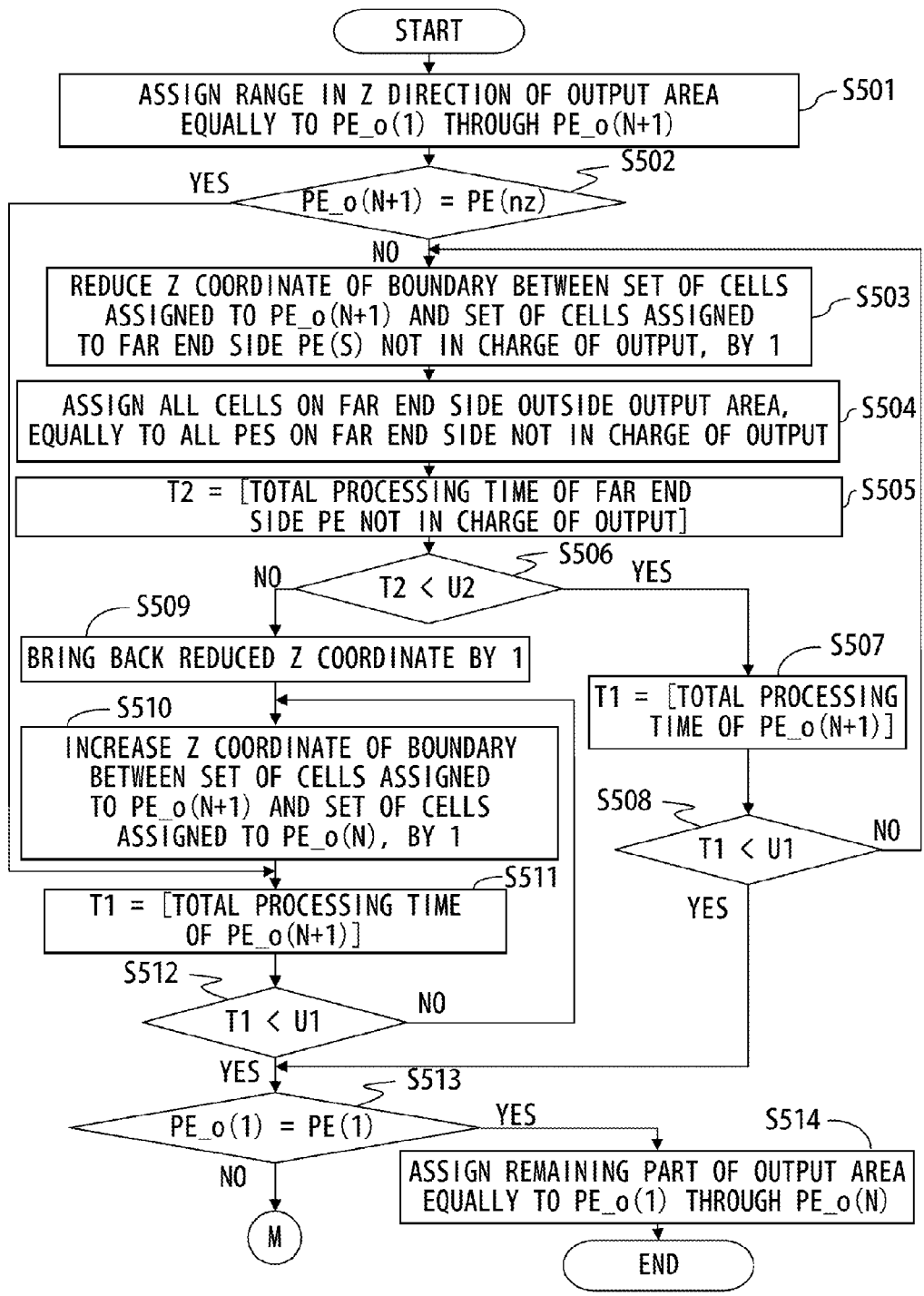
F I G. 1 5

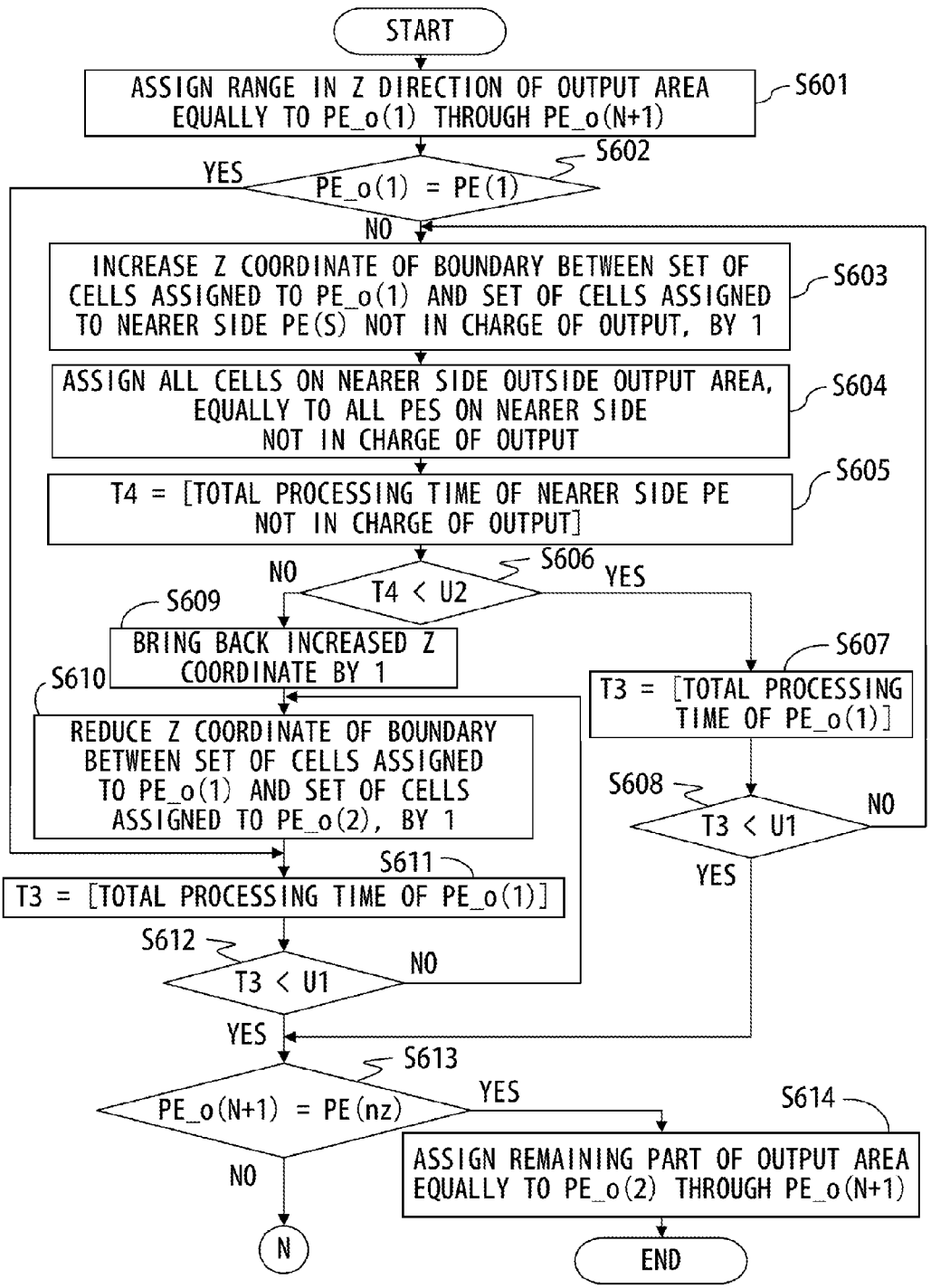
F I G. 1 7

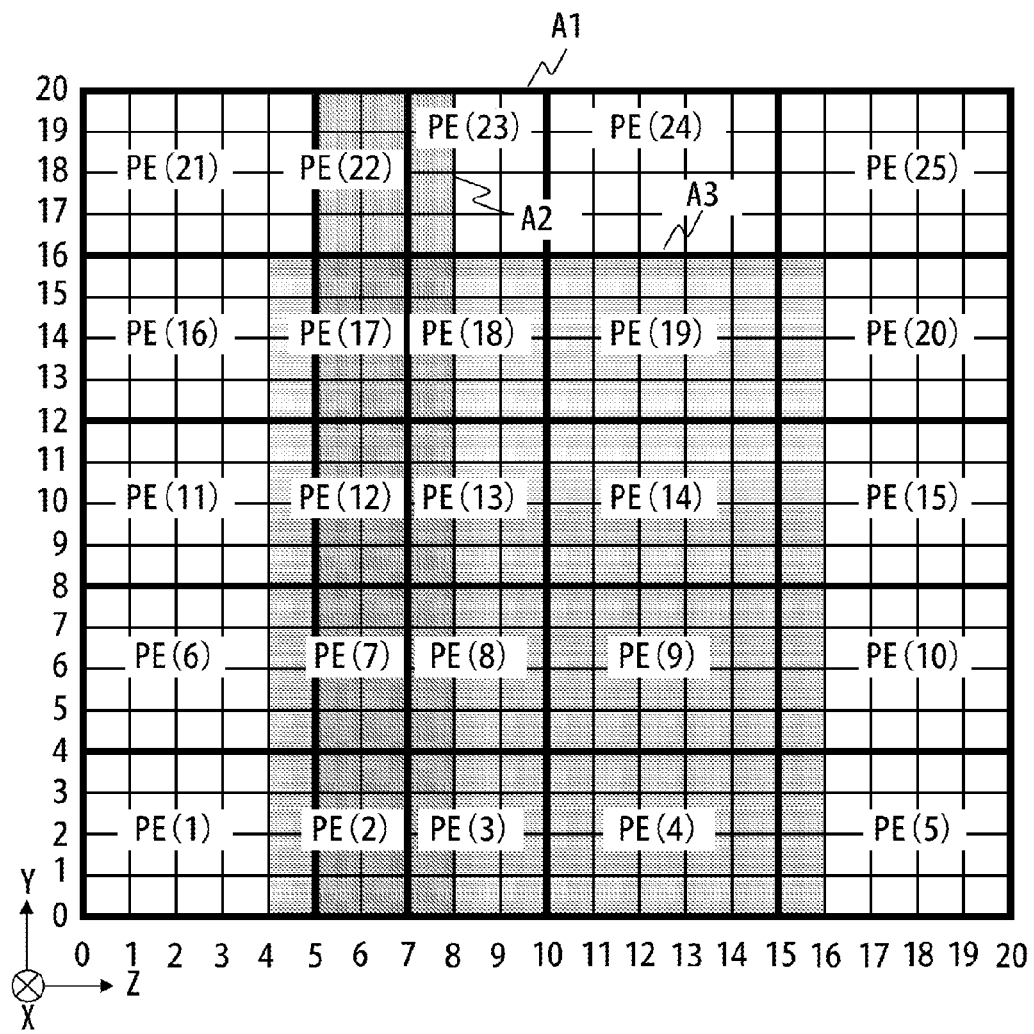
F I G. 19

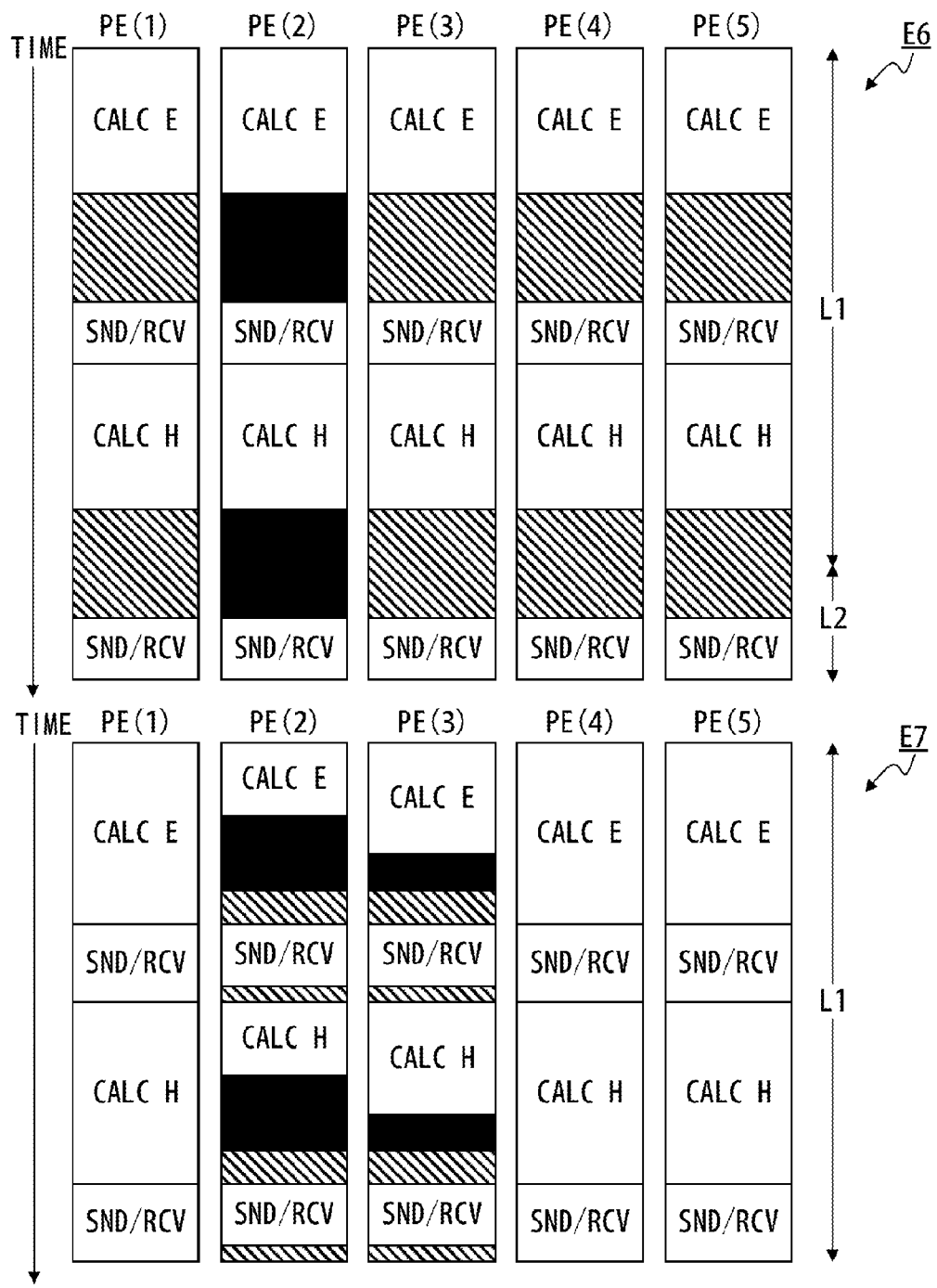
F I G. 20

ASSIGNING METHOD, RECORDING MEDIUM, INFORMATION PROCESSING APPARATUS, AND ANALYSIS SYSTEM

CROSS-REFERENCE TO RELATED APPLICATION

This application is based upon and claims the benefit of priority of the prior Japanese Patent Application No. 2013-086651, filed on Apr. 17, 2013, the entire contents of which are incorporated herein by reference.

FIELD

The embodiments discussed herein are related to a technique for analysis executed by a plurality of processing devices.

BACKGROUND

A number of studies have been carried out about various analyses using a general-purpose or a special-purpose device (for example, electromagnetic field analysis, optical analysis, acoustic field analysis and the like). Among various analysis algorithms, some are algorithms to execute the analysis by a single processing device, and some are parallel algorithms to execute the analysis by a plurality of processing devices.

For example, there is a case in which analysis with a high spatial resolution is desired in a part of the analysis target area. A certain electromagnetic field analysis device is a device for the purpose of achieving effects such as those described below in such a case.

There is no need to make the computational grid fine in the entire area.

It is able to avoid the increase in the total amount of calculation.

It is able to realize a high speed in calculation.

It is able to reduce the calculation cost for a high-accuracy analysis.

Specifically, a computation area hierarchical dividing unit in the electromagnetic field analysis device hierarchically divides an area in which the computation accuracy is insufficient as a high-accuracy computation area, from a computation area determined by a computation accuracy evaluating unit as insufficient in the computation accuracy. Then, based on the computation accuracy information of accuracy data in the analysis target area, a grid area with a high spatial resolution is newly created. That is, a computational grid that is finer than the computational grid created by the computational grid generating unit is created.

Meanwhile, an acoustic field analysis method that makes it possible to reduce the computer load and also to reduce the computation time in a calculation of an acoustic field including a tiny scatterer, has also been proposed. Specifically, in an analysis target acoustic field, a subgrid area consisting of an area including a scatterer and its vicinity area is spatially discretized by the first grid of the same size. In addition, the normal grid area of the analysis target acoustic field that is not the subgrid area is spatially discretized by the second grid being the same size and its side being several multiple of each side of the first grid.

Furthermore, a circuit analysis system that aims to achieve the following goals by executing parallel processing using a plurality of computers has also been proposed.

It is able to execute an FDTD (finite-difference time-domain) analysis process and a circuit simulation process simultaneously.

It is able to realize an improvement in the analysis speed and the analysis accuracy.

Specifically, the circuit analysis system includes first through fifth computers connected through a communication network. The first through second computers execute electromagnetic field analysis by the FDTD method, and the fourth through fifth computers execute the simulation. The area to be the analysis target is divided into a plurality of subareas, and the overlap areas between the subareas. Analyses of the electromagnetic field in the respective subareas are performed in parallel by the first through second computers. In addition, simulations of the equivalent circuit network in the respective subareas are performed in parallel by the fourth through fifth computers. The control unit realized by the third computer controls the synchronization between the computers.

For example, some documents, such as Japanese Laid-open Patent Publication No. 2003-330977, Japanese Laid-open Patent Publication No. 2012-14246, Japanese Laid-open Patent Publication No. 2004-54642, have been known.

SUMMARY

According to an aspect of the embodiments, an assigning method is provided. The assigning method includes calculating, by a computer, a position-dependent processing load to be caused by a process that depends on a position of a cell, for each of a plurality of cells into which a spatial area specified as a target of an analysis to be executed by two or more processing devices that are included in a first number of processing devices and synchronize for each unit of the analysis in time domain is divided. The assigning method also includes assigning, by the computer, the plurality of cells to a second number of processing devices which are part or all of the first number of processing devices, under a condition where a criterion determined with respect to uniformity in a total processing time among processing devices used for the analysis is met. The total processing time of each individual processing device used for the analysis includes a length of time to be taken for the individual processing device to execute each process depending on the position of each of one or more cells to be assigned to the individual processing device among the plurality of cells.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a flowchart of an assigning process of the first embodiment;

FIG. 2 is a diagram for explaining a problem of the time for analysis being prolonged due to the wait time for synchronization;

FIGS. 10-11 are diagrams schematically illustrating a schedule;

FIG. 12 is a diagram illustrating a process to increase PEs to be in charge of output;

FIGS. 15-18 illustrate a flowchart of the reassigning process;

FIG. 19 is a diagram illustrating eventual assignment according to the second embodiment;

FIG. 20 is a diagram illustrating the effect of the analysis time being reduced by the second embodiment;

DESCRIPTION OF EMBODIMENTS

Figure 3:
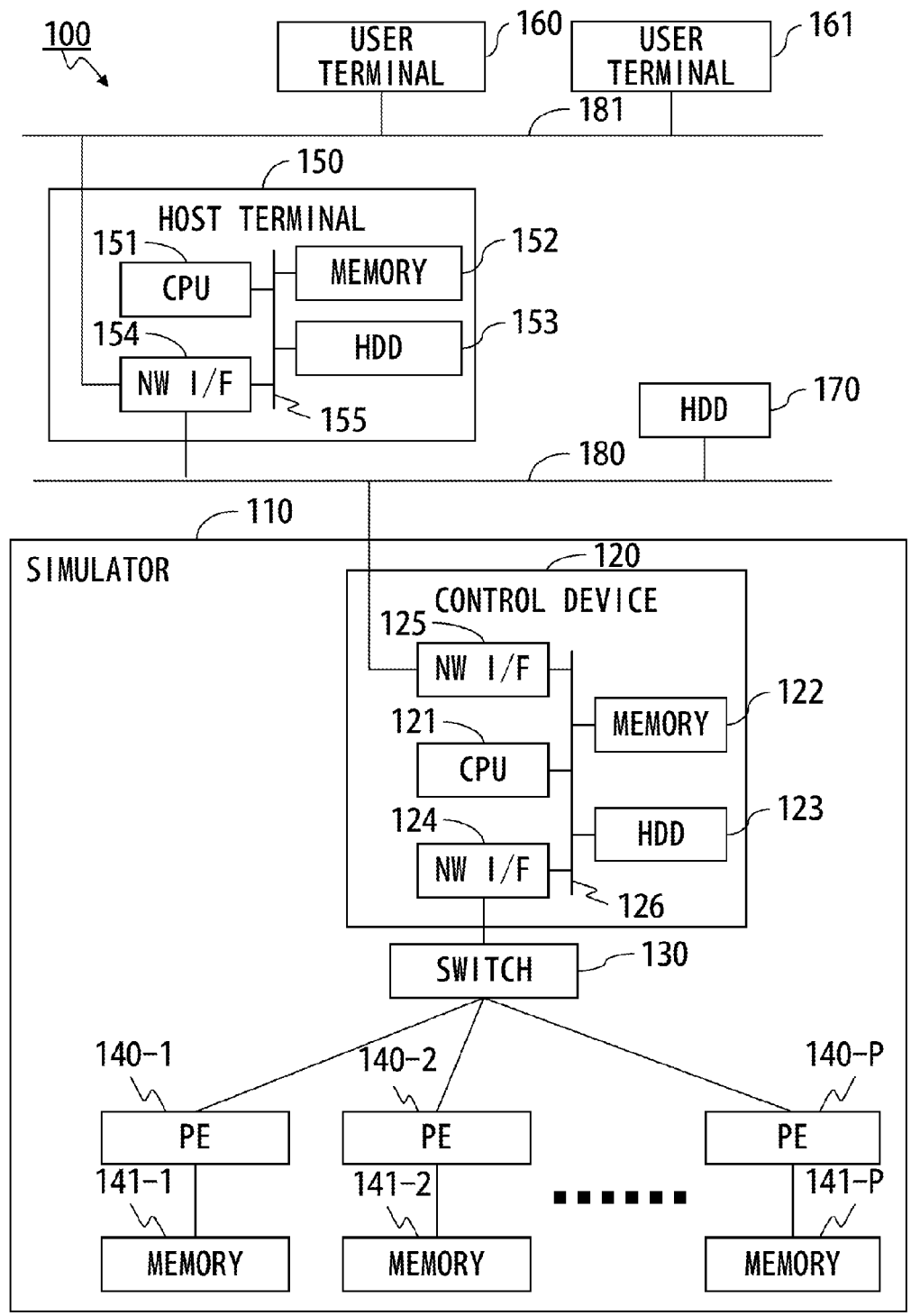
FIG. 3 is a system configuration diagram.

In the analysis executed by two or more processing devices that synchronize for every certain analysis unit, a wait time may arise for synchronization. For example, there may be a case in which, even after the first processing device has finished the process for the certain analysis unit, the second processing device is still executing the process for the analysis unit.

In this case, the first processing device waits, for synchronization, at least until the second processing device finishes the process. The wait time is a factor that makes the time taken for the entire analysis longer.

The embodiments explained below, in an aspect, aims at making the analysis faster. The embodiments explained below reduce the wait time, and therefore, the analysis is made faster.

Hereinafter, the embodiments are explained in detail with reference to the drawings. First, the first embodiment is explained with reference to FIGS. 1-2. After that, the second embodiment is explained with reference to FIGS. 3-20, and furthermore, the third embodiment is explained with reference to FIGS. 21-23. Lastly, other embodiments are also explained.

FIG. 1 is a flowchart of an assigning process of the first embodiment. The assigning process in FIG. 1 may be executed by a single computer, or may also be executed by a plurality of computers. However, for the purpose of making explanation simple, the term "computer" may be simply used below to refer to "a single computer or a plurality of computers".

Incidentally, a certain kind of analysis is executed by two or more processing devices that synchronize for each "analysis unit" in the time domain. An example of this kind of analysis is, for example, the analysis by the parallel FDTD method (parallel finite-difference time-domain method).

A process that is performed in the parallel FDTD method and includes calculation of the electric field with respect to one step time and transmission/reception of data of the electric field is an example of the analysis unit in the time domain. The processing devices synchronize for each analysis unit (for example, they synchronize at the point in time at which the transmission and reception of data of the electric field are started in one analysis unit). In the similar manner, a process that is performed in the parallel FDTD method and includes calculation of the magnetic field with respect to one step time and transmission/reception of data of the magnetic field is also an example of the analysis unit in the time domain. One step time is described as "Lt" in the expressions (1) and (2) discussed later.

Meanwhile, the processing device is also referred to as a "PE (processing element)".

When there are a first number of processing devices, the analysis is executed by two or more of the first number of processing devices. In addition, as the target of the analysis, a certain spatial area is specified. Hereinafter, the specified spatial area is also referred to as an "analysis target area".

The analysis target area is divided into a plurality of cells. Each cell is, in other words, a subarea of the analysis target area. The sizes of the plurality of cells may be the same, or may be uneven. In addition, the analysis target area and the cells may be three-dimensional, two-dimensional, or one-dimensional ones.

In step S1 of FIG. 1, for each of the plurality of cells, a computer estimates (i.e., calculates) a position-dependent processing load to be caused by a process that depends on the position of the cell concerned. Meanwhile, for the purpose of making explanation simple, the processing load which is to be incurred in the processing device by the execution of a process for a certain cell may be simply referred to as a "processing load of the cell" or a "position-dependent processing load of the cell" below.

For example, as a target about which the result of the analysis is to be output, a certain area (hereinafter, referred to as an "output area") in the analysis target area may be specified by a user. When estimating, in step S1, the position-dependent processing load of the cell included in the output area, the computer includes an output load to be caused by an output process to output data, into the position-dependent processing load. For example, the output process may be a process in which the processing device writes data into a non-volatile storage device via a network.

Meanwhile, there may be a case in which, regarding at least one of the plurality of cells, one or more input parameters that are specific to the position are specified. When estimating, in step S1, the position-dependent processing load of each cell for which one or more input parameters are specified, the computer includes a reading-in load to be caused by a reading-in process to read in the one or more input parameters, into the position-dependent processing load. For example, the reading-in process may be a process in which the processing device reads in the one or more input parameters from a prescribed file (or from a certain area on the memory). In addition, the one or more input parameters described above may include at least one of the following two kinds of parameters.

A parameter that defines a wave source (an electric current source or a magnetic current source) positioned in the analysis target area.

A parameter that defines the characteristic of a circuit element positioned in the analysis target area. For example, a parameter such as the resistance value, inductance, conductance, or the like.

In addition, it is preferable that, in step S1, the position-dependent processing load of a cell that is in contact with the boundary between two different media is estimated, by the computer, to be larger than the position-dependent processing load of a cell positioned inside one medium. In addition, when analysis by the parallel FDTD method is performed, it is preferable that, in step S1, the position-dependent processing load of a cell that is in contact with the absorbing boundary is estimated, by the computer, to be larger than the position-dependent processing load of a cell that is not in contact with the absorbing boundary.

Meanwhile, it is preferable that the estimation in step S1 is performed based on the specific implementation of the analysis procedure.

For example, it is assumed that an analysis by the parallel FDTD method is performed. The parallel FDTD method is an analysis method based on the Maxwell's equations. The specific implementation may be different between systems that perform the analysis by the parallel FDTD method. For example, the hardware configuration of a processing device in a certain system and that of a processing device in another system may be different. In addition, the network topology of the processing devices may also vary from system to system. Therefore, the individual systems may also be different in how the analysis based on the Maxwell's equations is specifically programmed and implemented.

Therefore, it is preferable that the estimation in step S1 is performed based on the implementation of the system. It is preferable that, for example, the estimation in step S1 is performed based on various factors as follows that are dependent on the implementation of the system.

The number of times of execution of computation (i.e., operation) for each type of computation such as addition and multiplication.

The number of times of memory access.

The data size of a numerical value.

The amount of numerical data transmitted (i.e., sent) and received between processing devices.

Then, after the estimation in step S1, the computer performs assignment of the cells to the processing devices in step S2. Specifically, the computer assigns the plurality of cells to a second number of processing devices, under a condition where a certain criterion is met. In other words, the computer distributes the plurality of cells to the second number of processing devices under the above-mentioned condition. By the assignment in step S2, to each of the second number of processing devices, one or more of the plurality of cells are assigned.

Here, the second number of processing devices are some or the all of the first number of the processing devices. For example, in a certain kind of environment, there is a possibility that some processing devices may be used for another analysis. Therefore, some of the first number of processing devices may sometimes be unavailable. In addition, depending on a certain factor such as the size of the analysis target area and/or the analysis accuracy that the user desires, there may be a case in which a sufficiently fast analysis is possible without using all of the first number of processing devices. Therefore, the computer may appropriately decide the second number.

The "certain criterion" mentioned above is, specifically, a criterion that is determined with respect to the uniformity among the processing devices in the "total processing time" discussed below. The "total processing time" of a processing device used for the analysis includes a length of time to be taken for this processing device to execute each process that depends on the position of each of one or more cells to be assigned to this processing device from among the plurality of cells. The "total processing time" may further include a length of time to be taken for this processing device to transmit (i.e., send) and receive data to and from one or more other processing devices used for the analysis.

Meanwhile, as described above, the processing devices used for the analysis synchronize for each analysis unit in the time domain. Therefore, the analysis is a series of a plurality of analysis units.

The total processing time may be the time regarding the entire analysis. Alternatively, the total processing time may be the time per a prescribed number of analysis units. The prescribed number may be 1 for example, or may be two or larger.

For example, the prescribed number may be 2. For example, the series of processes with respect to one step time in the parallel FDTD method corresponds to two analysis units. Regarding the parallel FDTD method, a total processing time that includes the following time may be estimated as the total processing time per the two analysis units (see FIG. 2 discussed later too).

A length of time to be taken to execute the calculation of the electric field with respect to one step time.

A length of time to be taken, after the calculation of the electric field, to transmit (i.e., send) and receive data to and from one or more other processing devices.

A length of time to be taken to execute the calculation of the magnetic field with respect to one step time.

A length of time to be taken, after the calculation of the magnetic field, to transmit (i.e., send) and receive data to and from one or more other processing devices.

In addition, as explained regarding step S1, the processing device may perform an output process depending on the positions of the cells assigned to the processing device. In this case, the time to be taken for the output process is included in the total processing time. In addition, the processing device may perform a reading-in process. In this case, the total processing time includes the time to be taken for the reading-in process. Furthermore, the time per cell to be taken for the calculation of the electric field or the magnetic field may also be different between a cell positioned inside one medium and a cell that is in contact with the boundary between two media. Of course, the total processing time of a processing device is also dependent on the number of cells assigned to this processing device, and is also dependent on the performance (for example, the clock frequency, memory throughput and the like) of this processing device.

The computer is able to calculate the total processing times appropriately in step S2 based on the position-dependent processing loads, which have been estimated in step S1. In addition, the computer is able to determine "whether the above-mentioned criterion is met or not" appropriately in step S2 based on the calculated total processing times. Therefore, the computer is able to realize assignment under the condition where the above-mentioned criterion is met.

The process in step S2 may include, more specifically, a process to perform a tentative assignment and a process to determine whether or not the above-mentioned criterion is met under the tentative assignment.

When the above-mentioned criterion is not met under the tentative assignment, the computer tries another tentative assignment. When assignment under which the above-mentioned criterion is met is found, the computer actually adopts the found assignment.

For example, the computer may decide the second number (the number of processing devices to execute the analysis) in step S2 (or before the execution of step S2). Then, in step S2, the computer may fix the decided second number, and regarding the fixed second number, may execute the tentative assignment and determination as described above. That is, step S2 may include processes as described below.

A process of tentatively assigning the plurality of cells to the decided second number of processing devices.

A process of determining whether or not the above-mentioned criterion is met among the second number of processing devices under the tentative assignment.

A process of tentatively reassigning the plurality of cells to the second number of processing device when the criterion is not met among the second number of processing devices under the tentative assignment; more specifically, a process of increasing a third number and trying another tentative assignment according to the increased third number where the third number is the number of processing devices to which cells belonging to a certain group are to be assigned, and the certain group is a group for which the position-dependent processing load is relatively heavy among the plurality of cells (note that the phrase "relatively heavy" herein indicates that the position-dependent processing load of a cell belonging to the certain group is heavier than that of a cell not belonging to the certain group).

Meanwhile, the algorithm for the computer to decide the second number is not particularly limited. The computer may decide the second number according to at least one of the factors as listed below for example, or may decide the second number according to other factors.

The number of processing devices that are being used for another analysis (or that have been reserved for another analysis) among the first number of the processing devices.

The number of users that share the first number of processing devices.

The size of the analysis target area and/or that of the output area.

The analysis accuracy specified by the user.

The shape and/or the material of the analysis target object included in the analysis target area.

The configuration of the circuit in the analysis target object.

The number and/or the layout of wave sources.

In addition, the above-mentioned criterion may be, more specifically, a criterion that the ratio, difference, or both the ratio and difference between the total processing times stay within a determined allowable range among the decided second number of processing devices. The allowable range may be defined in advance by one or more thresholds.

The certain group mentioned above may be, specifically, any of the following sets, or may be the union of two or more of the following sets.

A set of cells included in the output area

A set of cells for which one or more input parameters specific to the position are specified A set of cells in contact with the boundary between two media A set of cells in contact with the absorbing boundary The computer may increase the third number (i.e., the number of processing devices to which cells belonging to the certain group are to be assigned) by newly assigning at least one of the cells belonging to the certain group to the processing device that satisfies both of the following conditions.

Adjacent to a processing device to which at least one of the cells belonging to the certain group is tentatively assigned, in the network topology of the first number of processing devices.

None of the cells belonging to the certain group is tentatively assigned to the processing device concerned.

The computer tries another tentative assignment as described above, according to the third number thus increased. The computer may allow the above-mentioned criterion to be met by performing reassignment described as follows.

The computer assigns first cells including one or more cells belonging to the certain group, to a first processing device of the second number of processing devices.

The computer assigns only second cells not included in the certain group, to a second processing device of the second number of processing devices, where the number of the second cells is larger than the number of the first cells.

The second number may be fixed as described above while step S2 is being executed. Alternatively, the computer may change the second number dynamically during the execution of step S2. That is, step S2 may include the following processes.

A process of tentatively deciding the second number.

A process of tentatively assigning the plurality cells to the tentatively-decided second number of processing devices.

A process of determining whether or not the above-mentioned criterion is met among the second number of processing devices under the tentative assignment.

A process of increasing the second number (i.e., tentatively deciding the second number again) when the above-mentioned criterion is not met among the second number of processing devices under the tentative assignment.

A process of tentatively reassigning the plurality of cells to the increased second number of processing devices.

More specifically, the computer increases the number of processing devices to which cells belonging to a certain group are to be tentatively assigned, when tentatively reassigning the plurality of cells to the increased second number of processing devices. The computer is able to allow the criterion to be met by repeating the above-mentioned reassignment once or more.

Meanwhile, the "certain group" herein is similar to the "certain group" in the example described above in which the second number is fixed during the execution of step S2. That is, the "certain group" is a group of cells with a relatively heavier position-dependent processing load than other cells in the plurality of cells.

The computer may specifically operate as follows in the reassignment of cells to the increased second number of processing devices. By so doing, the computer may allow the criterion to be met.

The computer assigns first cells including one or more cells belonging to the certain group, to a first processing device of the increased second number of processing devices.

The computer assigns only second cells not included in the certain group, to a second processing device of the increased second number of processing devices, where the number of the second cells is larger than the number of the first cells.

Meanwhile, when the second number is changed dynamically during the execution of step S2, the above-mentioned criterion may be a criterion that the ratio, difference or both the ratio and difference between the total processing times stay within a determined allowable range, among the tentatively decided second number of processing devices. The allowable range may be defined in advance by one or more of thresholds.

Regardless of whether the second number is fixed or variable, in step S2, the computer assigns a relatively small number of cells to the processing device to which a cell with a heavy position-dependent processing load is assigned. By so doing, the computer allows the criterion to be met.

An example of a cell with a heavy position-dependent processing load is a cell included in the output area. Therefore, the computer may perform, for example, assignment as described below in step S2.

To assign first cells including one or more cells included in the output area, to a first processing device of the second number of processing devices.

To assign only second cells not included in the output area, to a second processing device of the second number of processing devices, where the number of the second cells is larger than the number of the first cells.

Meanwhile, a cell with a heavy position-dependent processing load is not necessarily limited to the cell included in the output area. The position-dependent processing load of the cell belonging to the above-mentioned certain group is heavy. Therefore, the computer may perform assignment as follows, for example.

To assign first cells including a cell for which one or more input parameters specific to the position are specified, to a first processing device of the second number of processing devices.

To assign only second cells for which no input parameter is specified, to a second processing device of the second number of processing devices, where the number of the second cells is larger than the number of the first cells.

As described above, there are various specific methods of assignment in step S2. Meanwhile, there may be rare cases in which no assignment that satisfies the above-mentioned criterion is found. In that case, it is preferable that, in step S2, the computer selects the assignment with the highest uniformity in the total processing time, from the selectable assignments.

Upon finishing the assignment in step S2, the computer terminates the assigning process in FIG. 1. Meanwhile, according to the assignment in step S2, the second number of processing devices execute the analysis. The analysis executed in this way is completed within a shorter time compared with an analysis in a case in which, for example, the plurality of cells are assigned equally with regards to the number of cells, to the second number of processing devices. That is, according to the first embodiment, the analysis is made faster.

This is because the assignment in step S2 is performed under the condition where the criterion determined with respect to the uniformity in the total processing time among the processing devices is met. Therefore, according to the assignment determined in step S2, the uniformity in the total processing time among the second number of processing devices is high.

Although the total processing times may be slightly different between the second number of processing devices, the difference between the total processing times is not so large. Therefore, the wait time is not so long even in a case in which some processing devices that have already finished their processes wait, for synchronization, until other processing devices that are still executing their processes finish their processes. According to the first embodiment, the entire analysis is made faster by the reduction in the unnecessary wait time for each synchronization.

By the way, the computer that executes the process in FIG. 1 explained above is an example of an information processing apparatus including an estimating unit that performs estimation as in step S1 for example, and an assigning unit that performs assignment as in step S2 for example. In addition, the information processing apparatus may be used as a part of an analysis system including the first number of processing devices and the information processing apparatus. Meanwhile, each of the first number of processing devices is connected directly or indirectly to at least one of the other processing devices. In addition, the information processing apparatus is connected to the first number of processing devices via a network.

The information processing apparatus as described above may be physically a single computer, or may be realized by two or more physical devices (for example a control device 120 and a host terminal 150 in FIG. 3 discussed later). In addition, in FIG. 3 discussed later, PE 140-1 through 140-P (where 1<P) are illustrated as a specific example of the first number of processing devices.

FIG. 2 is a diagram explaining a problem of the time for analysis being prolonged due to the wait time for synchronization. Hereinafter, for the convenience of explanation, the "analysis" described regarding FIG. 1 is assumed specifically as analysis by the parallel FDTD method. In addition, as described above, the processing device is also referred to as the "PE". Hereinafter, explanation is made mainly using the name "PE".

As described above, analysis is made faster according to the assigning process in FIG. 1, but when in FIG. 2, a problem that may happen when the assigning process in FIG. 1 is not performed is illustrated.

An example E1 in FIG. 2 is an example of a case in which no PE performs the output process. Due to space limitations, only the total processing time of each of three PEs (hereinafter, described as "PE#1" through "PE#3") is presented, but four or more PEs may be used for analysis. In addition, the abbreviations "calc E", "snd/rcv data", "calc H", which stand for "calculate the electric field E", "send and receive data", "calculate the magnetic field H", respectively, are used in FIG. 2 due to space limitations.

As is well known, by discretizing the Maxwell's equations in the time domain, the expressions (1) and (2) are obtained. The FDTD method is based on the expressions (1) and (2). Specifically, by discretizing the expressions (1) and (2) in the spatial domain, analysis by the leap-frog algorithm using the Yee cells becomes possible.

$$E^n = \frac{1 - \frac{\sigma \Delta t}{2\varepsilon}}{1 + \frac{\sigma \Delta t}{2\varepsilon}} E^{n-1} + \frac{\Delta t / \varepsilon}{1 + \frac{\sigma \Delta t}{2\varepsilon}} \nabla \times H^{n-\frac{1}{2}} \tag{1}$$

$$H^{n+\frac{1}{2}} = H^{n-\frac{1}{2}} - \frac{\Delta t}{\mu} \nabla \times E^n \tag{2}$$

Meanwhile, in the expressions (1) and (2), vector E is a three-dimensional vector that represents the electric field, and vector H is a three dimensional vector that represents the magnetic field. In addition, Lt indicates a unit time called a "step time". The step time $\Delta t$ is a unit of discretization in the time domain. Then, $\sigma$ indicates the electric conductivity, $\varepsilon$ indicates the electric permittivity, and p indicates the magnetic permeability. The superscripts such as "n" and "n−1" indicates the time counted by using the step time as the unit in time. For example, the vector E with the superscript "n−1" represents the electric field at the time t when $t=(n-1)\cdot\Delta t$. Meanwhile, n is an integer equal to or larger than 0.

As is understood from the expression (1), the electric field at a certain time ($t=n\cdot\Delta t$) is calculated based on the electric field at a past time ($t=(n-1)\cdot\Delta t$) and the magnetic field at a past time ($t=(n-\frac{1}{2})\cdot\Delta t$). In addition, as is understood from the expression (2), the magnetic field at a certain time ($t=(n+\frac{1}{2})\cdot\Delta t$) is calculated based on the magnetic field at a past time ($t=(n-\frac{1}{2})\cdot\Delta t$) and the electric field at a past time ($t=n\cdot\Delta t$).

In the parallel FDTD method, a plurality of PEs are used. Therefore, in the parallel FDTD method, the calculated data of the electric field is transmitted (i.e., sent) and received between PEs, and the calculated data of the magnetic field is also transmitted and received between PEs. Specifically, each PE performs calculation of the electric field, transmission/ reception of the data of the electric field, calculation of the magnetic field, transmission/reception of the data of the magnetic field regarding one step time. In FIG. 2, the total processing time regarding one step time for each of the PE#1 through the PE#3 is presented.

Meanwhile, to which PE a certain PE transmits the data of the electric field may vary and from which PE the certain PE receives the data of the electric field may vary, according to the specific implementation of the parallel FDTD analysis. In the similar manner, to which PE a certain PE transmits the data of the magnetic field may vary and from which PE the certain PE receives the data of the magnetic field may vary, according to the specific implementation of the parallel FDTD analysis.

For example, the cell range covered by a certain PE and the cell range covered by other PEs may partially overlap. The difference in the specific implementation may lie in whether there is an overlap. Another example of the difference in the specific implementation is, for example, the difference in the network topology of PEs (see FIG. 4 discussed later too).

In a case where no PE performs the output process as in the example E1, even when a simple assignment based on the number of cells is performed, the wait time for synchronization is relatively short. In FIG. 2, the wait time is indicated by a shaded pattern. Meanwhile, the "simple assignment based on the number of cells" is an assigning method as described below.

A method of assigning cells, when the performances of all the PEs are equal, by dividing the number of cells included in the analysis target area by the number of PEs, to assign an equal number of cells to each PE.

A method of assigning the number of cells according to the performance of each PE, when there is a performance difference between the PEs, by, for example, a proportional distribution of cell to the PEs according to the performance.

Of course, there is a possibility that, due to the influence of fractions of the division and other factors, as illustrated in example E1, for example, the PE#3 may finish the calculation of the electric field and the magnetic field earlier than the PE#1 and PE#2. In this case, the PE#3 waits, for synchronization, until the PE#1 and PE#2 finish the calculation. That is, transmission/reception of the data of the electric field between PEs is performed after all of the PE#1 through the PE#3 finish the calculation of the electric field. In the similar manner, transmission/reception of the data of the magnetic field is performed between PEs after all of the PE#1 through the PE#3 finish the calculation of the magnetic field.

However, when no PE performs the output process, as illustrated in the example E1, the difference in the total processing times between PEs with respect to one step time is short. That is, even if the simple assigning method as described above is adopted, when no PE performs the output process, the wait time is short. In other words, when no PE performs the output process, the influence of the position-dependency of the processing load of the cell is small, and therefore, it is possible to sufficiently increase the equality in the total processing times by the simple assigning method based on the number of cells as described above.

Meanwhile, in a case in which all the PEs perform the output process, in the similar manner as the example E1, it is possible to sufficiently increase the equality in the total processing times by the simple assigning method.

However, as illustrated in the example E2, there may be a case in which only a certain PE (specifically, for example, the PE#1) performs the output process, and the other PEs (specifically, for example, the PE#2 and PE#3) do not perform the output process. Meanwhile, in FIG. 2, the time during which the output process is performed, is painted black.

The output process may be, as illustrated in the example E2, performed in the middle of the calculation of the electric field and in the middle of the calculation of the magnetic field. The output process may be performed before the start or after the completion of the calculation of the electric field. In the similar manner, the output process may be performed before the start or after the completion of the calculation of the magnetic field.

Meanwhile, as illustrated in the example E2, the output process may be performed while being broken up into twice or more per the process with respect to one step time. In an opposite manner, the output process may be performed collectively at one go per the process with respect to one step time.

In addition, the user may specify as, for example, "output the calculation result once every 300 step times". In this case, the output process may be included in one process in the 300 processes each of which being a process with respect to one step time. Alternatively, the output process may be spread over multiple processes (for example, it may be 300 processes or may be 50 processes and the like) each of which being a process with respect to one step time.

As described above, there may be various ways as to how to spread the output process over the time, according to the embodiment. However, in any case, it may be regarded that "as the entire analysis, the time taken on average by the PE#1 to perform the output process per process regarding one step time does not depend on how to spread the output process. Therefore, hereinafter, discussion about how to disperse the output process is omitted.

Now, as in the example E2, when only a particular one or multiple PEs perform the output process, if the simple assigning method based on the number of cells (and the processing performance of each PE) as described above is adopted, it results in a large difference in the total processing times among the PEs. That is, the unnecessary wait time is increased. As a result, the time taken for the entire analysis also becomes unnecessarily longer.

The problem of the extended analysis time is a problem newly found in the course of study and development by the inventor. Therefore, hereinafter, the background of this problem is explained in detail.

The parallel FDTD method is widely used for electromagnetic field analysis and optical analysis and the like. In recent years, the number of cells used in the parallel FDTD method is on an increasing trend.

For example, for the reduction of errors (in other words, the improvement in the analysis accuracy), it is beneficial to divide the analysis target area into smaller cells. Therefore, as the analysis accuracy requested by the user increases, the number of cells also increases.

Meanwhile, there is an upper limit in the number of cells that a simulator is capable of handling in many cases. For example, there are many simulators with an upper limit of about several thousand cells. However, there may be a case in which the user desires to analyze a model including a large number of cells that exceeds the upper limit.

In this case, the user divides the model into a plurality of submodels. Assuming that the division is performed appropriately so that the number of cells of each submodel is within the upper limit, the simulator is able to execute analysis for each submodel. The user obtains the eventual analysis result by integrating the analysis results of the respective submodels.

However, it is very convenient if it is possible to analyze the entire model at one go without division. That is, a simulator that is capable of analyzing a model including a very large number (for example, about hundreds of millions to ten billion) of cells at one go without division is desirable.

In addition, in the FDTD method, it is possible to reduce analysis errors by making the size of the Yee grid (that is, the length of one side of the cell) small. For example, when the size of the Yee grid is 1/20 of the wavelength of the electric wave of the analysis target, it is possible to reduce the error to 0.3% or less.

Therefore, in order to perform analysis of the electromagnetic wave in the high frequency range (that is, the electromagnetic wave with a short wavelength) with a good accuracy, it is desirable to make the cells fine appropriately according to the wavelength. In recent years, a growing number of products (for example, mobile phones, smartphones and the like) use the electromagnetic wave in the high frequency range, and therefore, many users desire to analyze the electromagnetic wave in the high frequency range. As the size of the cell becomes smaller according to the electromagnetic wave of the short wavelength, the number of cells naturally increases.

As described above, due to various factors, the number of cells in the analysis target area is on an increasing trend. In several years, there is even a possibility that analysis of a model including about ten billon cells for example becomes common. When the number of cells is about ten billion, it is desirable to increase the number of PEs according to the number of cells. For example, a PC cluster having several hundreds of PCs (Personal Computers) may be used for analysis, and of course, a super computer may be used.

Incidentally, the output area is specified arbitrarily by the user according to the purpose of analysis and the conditions of analysis. The number of output areas specified in the analysis target area is not limited to one, and two or more output areas may be specified. In addition, the size of the output area may also be specified arbitrarily by the user.

Therefore, the amount of output data is different depending on the specification by the user. However, as a general trend, the following is true. That is, as the analysis target (for example, a PC, smartphone, mobile phone, printed wiring board and the like) is divided into finer cells, the number of cells included in the output area tends to increase. For example, when the analysis target area is divided into about ten billion cells, the amount of output data may become a TB (terabyte) order.

In addition, as the frequency of the electromagnetic wave of the analysis target is higher, it is desirable to make the time interval of the output shorter. For example, in an analysis about the electromagnetic wave in the high frequency band of several GHz (gigahertz) or more, the preferable length of the time interval of the output is very short. When the temporal change over a certain length of period is simulated, the shorter the time interval of the output, the larger the number of times of output. Therefore, the higher the frequency of the electromagnetic wave of the analysis target, the amount of output data is larger.

As described above, due to the refinement of cells and the frequency of the electromagnetic wave of the analysis target, the data amount to be output may become huge. Then, in the parallel FDTD method, a plurality of spatially successive cells are generally assigned to one PE. Therefore, in many cases, the cells included in the output area are not assigned to many PEs in an evenly dispersed manner but are assigned disproportionally to a small number of PEs. That is, the load due to the processing to output a large amount of data reaching several TBs is placed disproportionally on a small number of PEs in many cases.

When the amount of data to be output is small, the influence that the imbalance of the output load has on the entire analysis is also small. For example, when the amount of data to be output is about several GBs (gigabytes), even when the output load is placed disproportionally to a small number of PEs, the influence is not to large. When the influence of the imbalance is small, even when the simple assignment based on the number of cells (and the processing capacity of each PE) as explained in relation to the example E1 is performed, the problem of the extended analysis time due to the wait time is small.

The simple assignment based on the number of cells (and the processing capacity of each PE) as described above is based on an implicit presupposition that "all the processing loads of the cells are almost equal". That is, in the simple assignment as described above, "the processing load being different according to the position of the cell" is not taken into consideration. When the influence of the imbalance in the output load is small, even when the simple assignment is performed (that is, even when the position-dependency of the processing load is ignored), the analysis time does not extend to a significant degree.

However, actually, for example, the processing load of the cell is different depending on whether or not the cell is included in the output area. That is, there is a gap in processing loads between the cells, and each processing load of the cell depends on the position of the cell. Therefore, if a simple assignment that ignores the position-dependency of the processing load is performed, as the amount of data to be output increases, the influence that the imbalance of the output load has on the entire analysis also increases to an extent which is not negligible. That is, the imbalance of the output load is a bottle neck for making the analysis faster. Then, the problem of the unnecessary extension of the analysis time due to the increase in the wait time is expected to become more severe in the future.

Then, as described above, the output load seems to increase further in the future. Therefore, it is desirable to avoid the problem of unnecessary extension of the analysis time due to the imbalance in the output load. In other words, it is desirable to prevent the load of several specific PEs from becoming heavier than the load of other PEs due to the position-dependency of the processing load.

In addition, in the FDTD method, the length of the time $\Delta t$ is set so that the Courant condition is met. According to the Courant condition, the smaller the cell size, the shorter the step time $\Delta t$. That is, when temporal change over a certain length of period is simulated, the number of steps of analysis also increases according to the refinement of cells. As the number of steps increases, the influence that the wait time per a series of processes with respect to one step time has on the entire analysis also increases. Therefore, also from the viewpoint of the length of the step time $\Delta t$, it is desirable to reduce the imbalance of the load, taking the position-dependency of the processing load into consideration.

Here, again, the example E2 in FIG. 2 is explained. In the example E2, the position-dependency of the processing load is not taken into consideration. That is, the example E2 is an example of a case in which the simple assignment similar to that in the example E1 is performed.

In the example E1, wince the processing time of the PE#1 and the PE#2 is the same, the PE#2 does not need to wait until the PE#1 finishes the process. However, in the example E2, the processing time of the PE#1 that performs the output process is longer than the processing time of the PE#2 by the time taken for the output process. For that reason, in the example E2, not only the PE#3 but also the PE#2 waits for a while, before transmission/reception of data, for synchronization, for the PE#1 to complete the process (that is, the process to calculate the electric field or the magnetic field).

As is understood by comparing the wait time in the examples E1 and E2, the time taken for a series of processes with respect to one step time is longer in the example E2 than in the example E1. Then, the difference in the processing times in the example E2 and the example E1 is caused by the load of the output process placed disproportionally on a specific PE (the PE#1 in the example of FIG. 2).

In the simple assignment, the position-dependency of the processing load is ignored, but actually, there is an imbalance in the output load. Therefore, when a simple assignment is performed as in the example E2, due to the imbalance in the output load, the wait time at the PEs (that is, the PE#2 and PE#3) that do not perform the output process increases. In such wait time, the PE is idle, and therefore such wait time is unnecessary.

Therefore, when there is an imbalance in the output load as in the example E2, there is a room for increasing the efficiency of the entire analysis by changing the assignment to reduce the wait time. That is, by changing the assignment to reduce the wait time, an effect to shorten the time taken for the entire analysis is obtained. Then, as the data amount to be output increases in the future, it is expected that the effect of shortening the analysis time becomes prominent.

Then, as described above, in the first embodiment, the computer takes the position-dependency of each processing load of the cell into consideration (see step S1), and decides the assignment of cells to PEs so that the equality in the total processing times among the PEs satisfies the criterion (see step S2). Accordingly, the difference in the total processing times among PEs that is observed in the example E2 is reduced. Therefore, according to the first embodiment, the unnecessary wait time is reduced, and the entire analysis is made faster.

Meanwhile, the heavy load generated depending on the position of the cell is not limited to the output load illustrated in the example E2. As explained regarding step S1 in FIG. 1 as well, the load of the cell on a position on which the wave source and the circuit element are placed is heavy due to the reading-in process to read in one or more input parameters.

In addition, the processing load of the cell that is in contact with the boundary of two different media is heavier than the processing load of the cell positioned inside one medium. This is because, on the boundary of media, the formula used for the calculation of the electric field and the magnetic field is complicated. Furthermore, the processing load of the cell that is in contact with the absorbing boundary is heavier than the processing load of the cell that is not in contact with the absorbing boundary. This is because, on the absorbing boundary, the formula used for the calculation of the electric field and the magnetic field is complicated.

As described above, due to various factors, the processing load of the cell may differ depending on the position of the cell. However, the assigning process in FIG. 1 is beneficial for shortening the analysis time, regardless of what the position-dependency of the processing device is caused by.

By the way, regarding step S2 in FIG. 1, a case in which the computer fixedly decides the "second number" (of processing devices) and a case in which the computer dynamically changes the "second number" have been illustrated. The second embodiment explained below corresponds to the former case, and the third embodiment corresponds to the latter case. Hereinafter, the second embodiment is explained with reference to FIGS. 3-20, and the third embodiment is explained with reference to FIGS. 21-23.

FIG. 3 is a system configuration diagram. A system 100 in FIG. 3 includes a simulator 110 that performs analysis by the parallel FDTD method, a host terminal 150, and one or more user terminals. In FIG. 3, two user terminal 160 and 161 are illustrated.

The simulator 110 includes a control device 120, a switch 130, a plurality of PEs and a plurality of memories connected to the plurality of PEs. As explained in detail later, in the second embodiment, the control device 120 and the host terminal 150 cooperate to execute the processes similar to those in FIG. 1.

FIG. 3 illustrates P PEs, i.e., PE 140-1 through 140-P, and P memories, i.e., memories 141-1 through 141-P (where 1<P). The memory 141-$p$ is connected to the PE 140-$p$ (1≤$p$≤P). For the convenience of illustration, the connection between PEs is omitted in FIG. 3. Meanwhile, "P" is a specific example of the "first number" (of processing devices) explained regarding FIG. 1.

As explained in detail later, the PE 140-$p$ (1≤$p$≤P) receives a program for analysis by the parallel FDTD method (in other words, a command set including a plurality of commands) through the control device 120. Then, the PE 140-$p$ stores the received program in the memory 141-$p$, and using the memory 141-$p$ as a work area, executes the program.

Each of the PEs 140-1 through 140-P may be any of the following. The analysis by the parallel FDTD method is executed by some or all of the PEs 140-1 through 140-P.

General-purpose CPU (Central Processing Unit). For example, a CPU in a PC.

ASIC (Application-Specific Integrated Circuit) for parallel analysis.

FPGA (Field Programmable Gate Array).

GPU (Graphic Processing Unit).

Each of the memories 141-1 through 141-P may be, for example, an SRAM (Static Random Access Memory), or may be a DRAM (Dynamic Random. Access Memory), or may be a combination of the two.

The system 100 also includes an HDD (Hard Disk Drive) 170 to save the analysis result. The HDD 170 may be an HDD used as an NAS (Network-Attached Storage), or may be a local HDD of a computer that is not illustrated in the drawing, connected to a network 180.

The HDD 170 may also be omitted (for example, an HDD 153 described later may be used instead of the HDD 170). Alternatively, the HDD 170 may be connected to a network 181 described later, instead of the network 180. Depending on the embodiment, the HDD 170 may be connected to network that is not illustrated in the drawing and accessed by each PE.

The simulator 110 and the host terminal 150 and the HDD 170 are connected through the network 180. In addition, the host terminal 150 is also connected to the user terminals 160-161 through the network 181.

The type of the networks 180 and 181 is not particularly limited. For example, the network 180 may be a LAN (Local Area Network), VLAN (Virtual LAN), WAN (Wide Area Network), Internet, or a combination of them. In addition, the network 181 may also be, for example, a LAN, VLAN, WAN, Internet, or a combination of them.

By the way, the control device 120 in the simulator 110 includes a CPU 121, a memory 122 and a local HDD 123. In addition, the control device 120 includes a network interface 124 to connect the control device 120 to the switch 130. Furthermore, the control device 120 also includes a network interface 125 to connect the control device 120 to the network 180. Meanwhile, in FIG. 3, due to space limitations, the "network interface" is abbreviated as "NW I/F". The respective components in the control device 120 are connected to each other via a bus 126.

The host terminal 150 may be a general-purpose computer such as a workstation and a PC. The host terminal 150 includes a CPU 151, a memory 152 and a local HDD 153.

Furthermore, the host terminal 150 also includes a network interface 154 to connect the host terminal 150 to the networks 180 and 181. The respective components in the host terminal 150 are connected to each other via a bus 155.

The network interface 154 may be, for example, an extension-card type NIC (Network Interface Card), or may be an on-board type NIC. The network interface 154 may be, specifically, an interface device for Ethernet (registered trademark), and includes a physical port for inserting a cable, a circuit called a "PHY chip" for performing processing of the physical layer, a circuit called a "MAC chip" for performing processing of the MAC sublayer, and the like.

The network interface 125 is also a device similar to the network interface 154. The network interface 124 is an interface device according to the type of the network between the PEs 140-1 through 140-P and the control device 120 (that is, the network through the switch 130). Depending on the type of the network between the PEs 140-1 through 140-P and the control device 120, the network interface 124 may also be an interface device for Ethernet.

Meanwhile, while only a single switch 130 is illustrated in FIG. 3, two or more switches may be used. For example, a plurality of switches may be connected in a cascade pattern.

Each of the user terminals 160 and 161 are a terminal such as a PC. While omitted in FIG. 3, each of the user terminals includes a CPU, a memory, a local HDD, a network interface and the like.

Meanwhile, instead of the HDD 123 (or together with the HDD 123), an SSD (Solid-State Drive) may be used. In the similar manner, instead of the HDD 153 (or together with the HDD 153), an SSD may be used. In addition, instead of the HDD 170 (or together with the HDD 170), an SSD may be used. The HDD and SSD are both an example of the non-volatile storage device.

In addition, while omitted in FIG. 3, in each PE 140-*p* (1≤*p*≤P), further, a local HDD for the PE may be connected, and instead of the HDD (or together with the HDD), an SSD may be used. Alternatively, the PEs 140-1 through 140-P may be connected to a common HDD and/or a common SSD.

By the way, in the control device 120, the CPU 121 loads the program onto the memory 122, and using the memory 122 also as a work area, executes the program. The program may be installed in the HDD 123 in advance, or may be downloaded by the control device 120 via the network 180. In addition, the control device 120 may be equipped with a reading device for a storage medium (e.g., the control device 120 may be equipped with a media drive or a card reader). In that case, the program may be provided while being stored in the storage medium, and may be copied onto the HDD 123 via the reading device.

In the similar manner, in the host terminal 150, the CPU 151 loads the program onto the memory 152, and using the memory 152 also as a work area, executes the program. The program may be installed in the HDD 153 in advance, or may be downloaded by the host terminal 150 via the network 180 or 181. In addition, the host terminal 150 may be equipped with a reading device for a storage medium. In that case, the program may be provided while being stored in the storage medium, and may be copied onto the HDD 153 via the reading device.

Meanwhile, examples of a storage medium (i.e., a recording medium) that may be used in the control device 120 and/or the host terminal 150 are various computer-readable storage media as listed below. These storage media are a tangible medium, not a transitory medium such as a signal carrier wave.

An optical disc such as a CD (Compact Disc) and a DVD (Digital Versatile Disk)

A magneto-optical disk

Magnetic disk

A memory card using a semiconductor memory such as a flash memory

In addition, not only the storage media described above, but also the memory 122, the memories 141-1 through 141-P, the memory 152, the HDD 123, and the HDD 153 are also an example of the tangible, non-transitory medium.

Figure 4:
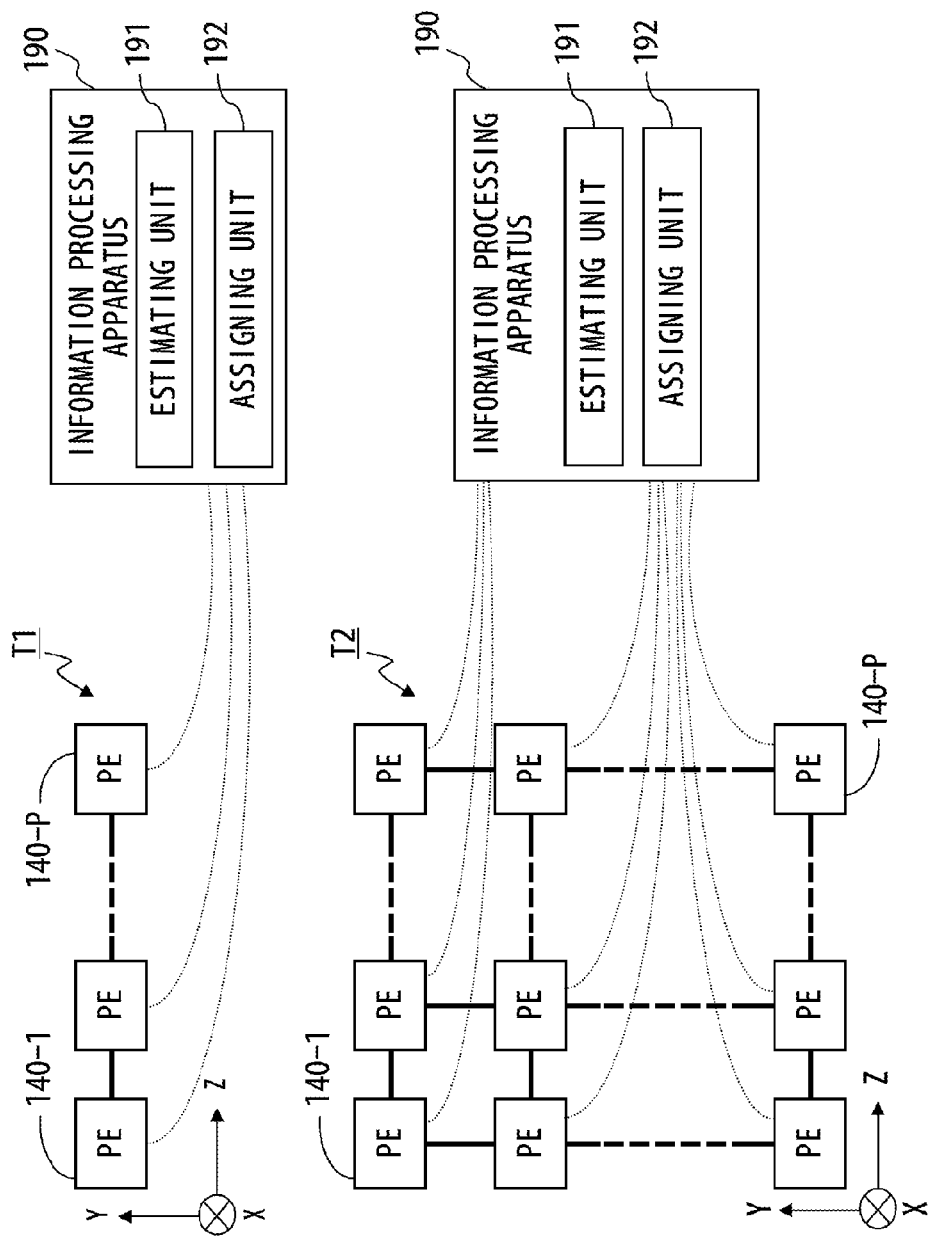
FIG. 4 is a diagram illustrating examples of a network topology of processing elements (PEs)

Now, as described above, for the convenience of the illustration, the connection between PEs is omitted in FIG. 3, but the PEs are connected by a topology according to the embodiment. The PEs are connected by interconnect of an appropriate type (for example, InfiniBand and the like). The type of interconnect is not particularly limited. FIG. 4 is a diagram illustrating examples of the network topology of PEs.

The PEs 140-1 through 140-P may be connected one-dimensionally as topology T1 in FIG. 4. Alternatively, the PEs 140-1 through 140-P may be connected in a two-dimensional mesh pattern as topology T2 in FIG. 4. The PEs 140-1 through 140-P may also be connected by another topology such as a three-dimensional mesh pattern. Meanwhile, the coordinate axes illustrated in FIG. 4 are explained later.

Incidentally, in FIG. 4, in addition to the PEs 140-1 through 140-P, an information processing apparatus 190 is also illustrated. The connection information processing apparatus 190 corresponds to the control device 120 and the host terminal 150 in FIG. 3.

While the control device 120 and the host terminal 150 are separate in the system 100 in FIG. 3, as is understood from the flowchart in FIGS. 5-7 discussed later, the control device 120 and the host terminal 150 cooperate to perform assignment of a plurality of cells to a plurality of cells. For example, the control device 120 performs estimation similar to the one in step S1 in FIG. 1, and the control device 120 and the host terminal 150 share a series of processes for the assignment in step S2. An embodiment in which the control device 120 operates as the host terminal 150 is also possible.

In other words, a single device may include both the estimating unit 191 that performs the estimation in step S1 in FIG. 1 and the assigning unit 192 that performs the assignment in step S2, or the estimating unit 191 and the assigning unit 192 may be spread over a plurality of devices. For example, the estimating unit 191 may be implemented on the control device 120, and the assigning unit 192 may be spread and implemented in the control device 120 and the host terminal 150. Describing it from another viewpoint, the information processing apparatus 190 may be a single apparatus (a single computer for example) physically, or may be two or more apparatuses (the control device 120 and the host terminal 150 for example) physically.

As illustrated with a dotted line in FIG. 4, each of the PEs 140-1 through 140-P is connected to the information processing apparatus 190. Each of the PEs 140-1 through 140-P and the information processing apparatus 190 may be connected by a network that is independent from the interconnect between PEs. For example, in FIG. 3, the control device 120 corresponding to a part of the information processing apparatus 190 is connected to each PE through the switch 130. In addition, the host terminal 150 corresponding to a part of the information processing apparatus 190 is connected to each PE indirectly through the network 180 and the control device 120.

Figure 5:
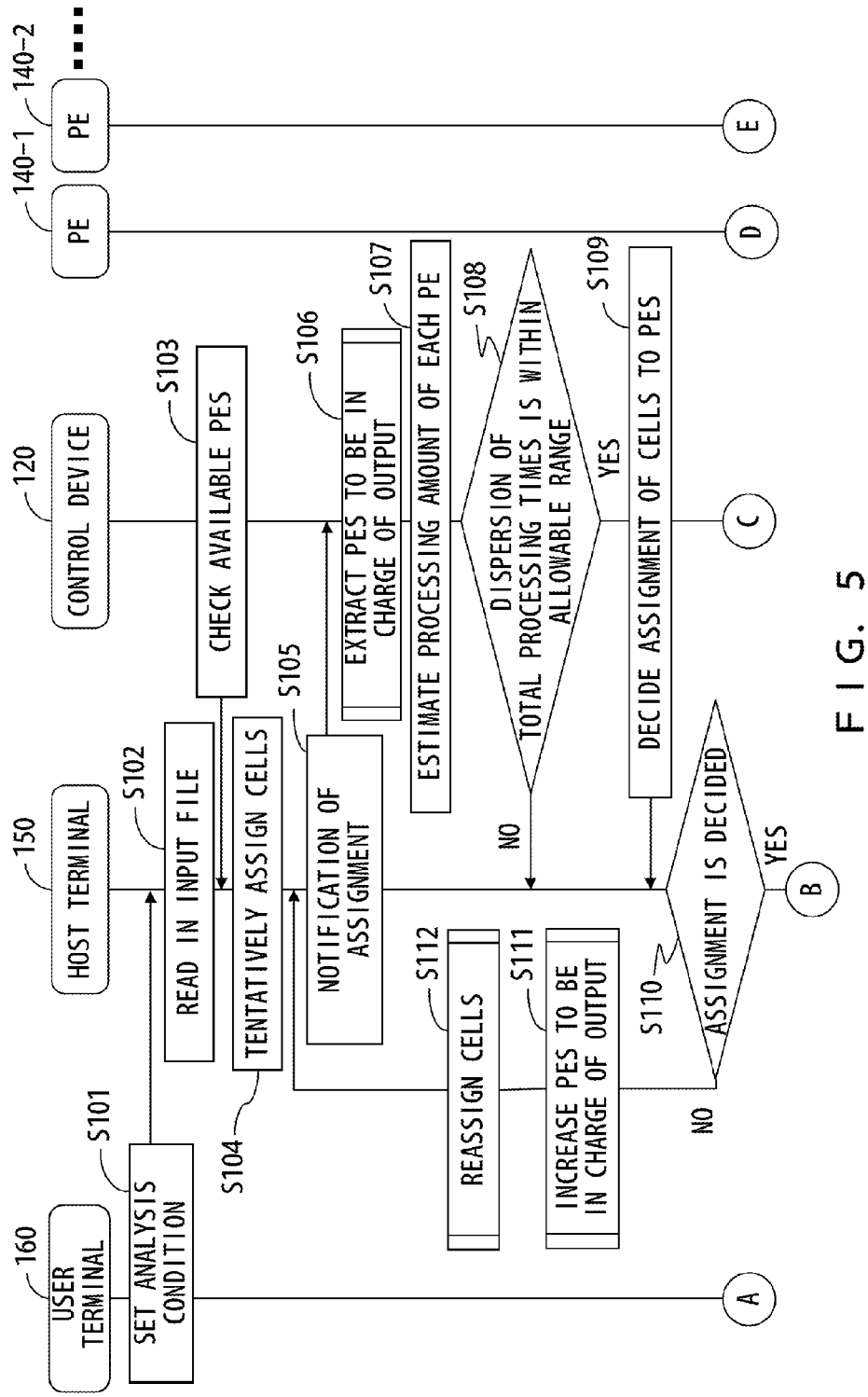
FIGS. 5-7 illustrate an operation sequence diagram of a system of the second embodiment.
Figure 6:
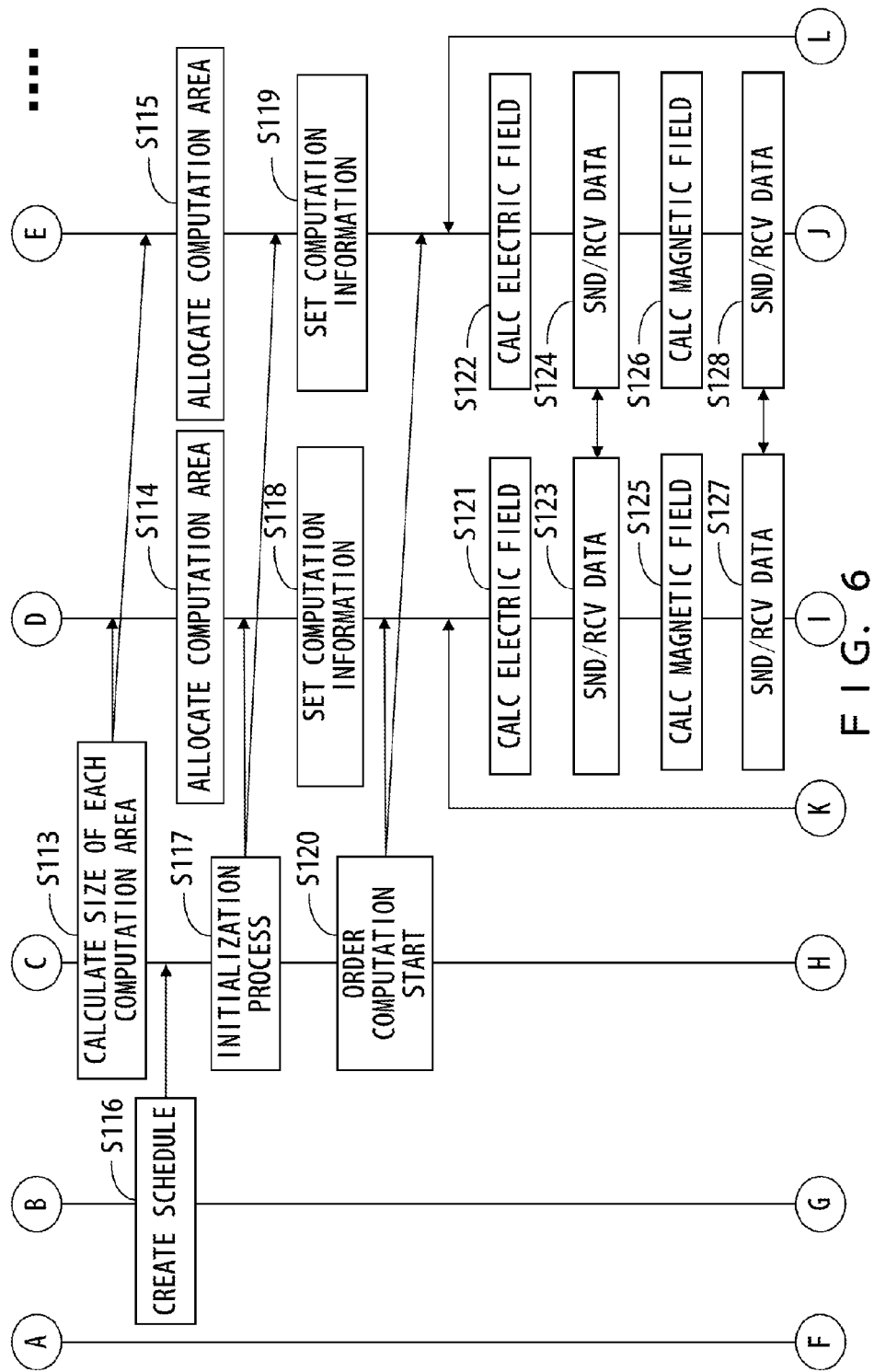
Figure 7:
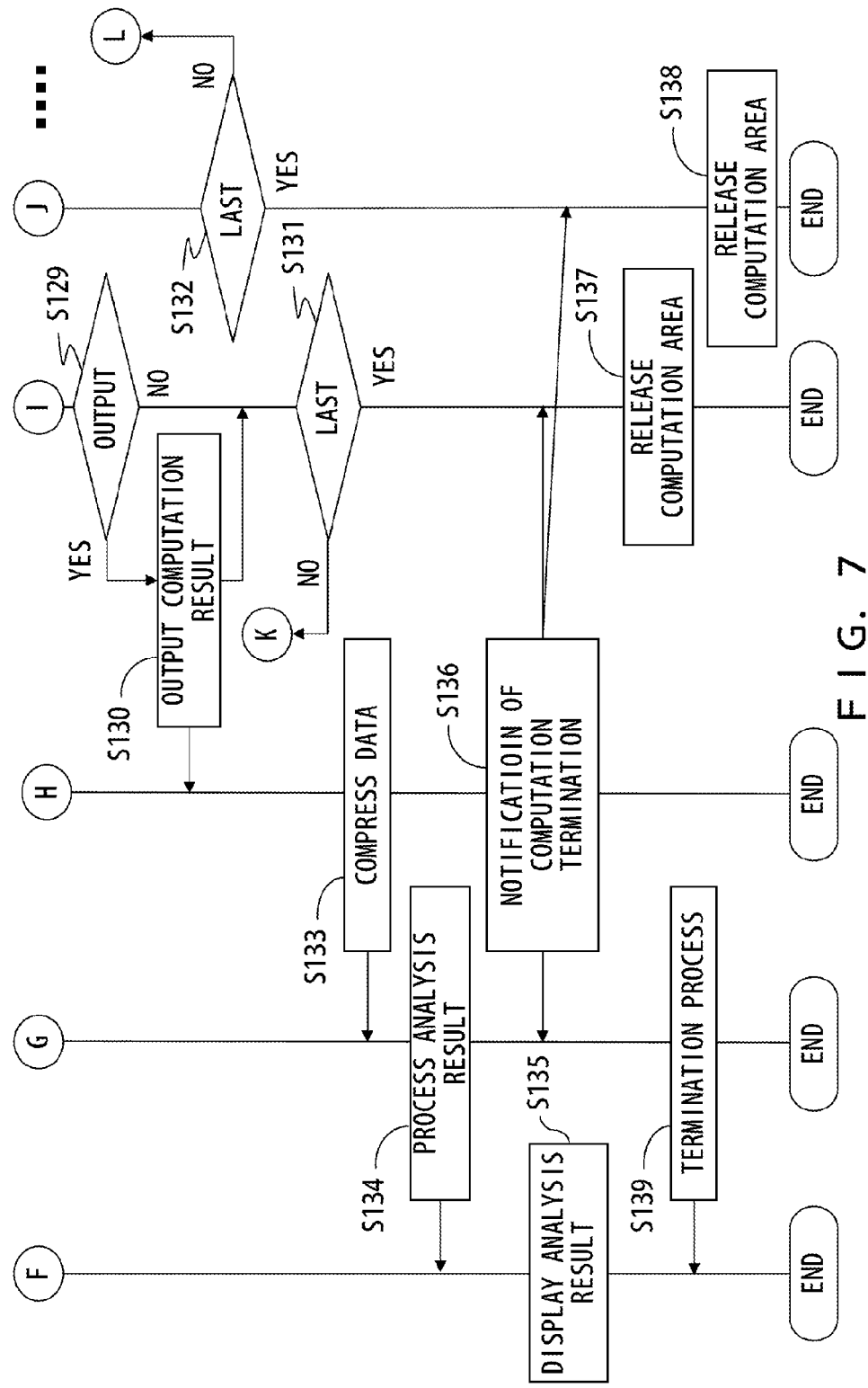

Next, with reference to FIGS. 5-7, the operation of the system 100 in FIG. 3 is explained. FIGS. 5-7 illustrate an operation sequence diagram of the system 100 according to the second embodiment. For the convenience of explanation, FIGS. 5-7 illustrate the case in which the user terminal 160, of the user terminals 160-161, is used. In addition, due to space limitations, of the PEs 140-1 through 140-P, only the PEs 140-1 and 140-2 are illustrated in FIGS. 5-7.

In step S101, the user terminal 160 receives input from the user regarding the analysis conditions, and sets the analysis conditions based on the input. Specifically, the user terminal 160 writes the analysis conditions into a prescribed file. The analysis conditions include various conditions as described below for example.

The shape, size, position of the analysis target object.

The electric permittivity and the magnetic permeability depending on the material of the analysis target object.

The electric permittivity and the magnetic permeability depending on the medium (for example, the air) around the analysis target object.

The sizes of cells (meanwhile, the sizes of all the cells may be equal, or the sizes of the cells may be unequal).

The type of the absorbing boundary condition to be used (for example, PEC (Perfect Electric Conductor), PMC (Perfect Magnetic Conductor), PBC (Periodic Boundary Condition), Mur, PML (Perfectly Matched Layer), or the like).

The length of the step time $\Delta t$.

In a case in which there is a wave source, one or more parameters that define the position of the wave source and the characteristics of the wave source.

In a case in which the simulator 110 simulates the behavior of a circuit element as well (e.g., in a case in which the analysis target object is a printed wiring board and the like), one or more parameters that define the characteristics of the circuit element.

The user terminal 160 transmits the file into which the analysis conditions are written (hereinafter, referred to as an "input file") to the host terminal 150 through the network 181. Then, in step S102, the host terminal 150 receives the input file via the network interface 154, and stores the received input file in the HDD 153. Then, the host terminal 150 reads in the content of the input file. In addition, the host terminal 150 makes an inquiry to the control device 120 about the available PE in the PEs 140-1 through 140-P.

Then, in step S103, the control device 120 checks the available PEs, and notifies the host terminal 150 of the available PEs. For example, there may be a case in which some of the PEs are already used for another analysis in response to the request from the user of the user terminal 161. In such a case for example, one or more of the PEs 140-1 through 140-P may be unavailable.

Next, in step S104, the host terminal 150 tentatively assigns cells to some available PEs.

Specifically, the host terminal 150 decides the PE to be used for analysis, from available PEs. It is desirable that the host terminal 150 selects the PE to be used for analysis from available PEs, according to "in which range in the network of PEs (see FIG. 4 for example) the available PEs exist".

For example, when P=60 and there are 40 available PEs, the host terminal 150 may decide to use all the 40 PEs for analysis. Alternatively, the host terminal 150 may decide to use for the analysis some (for example, 25 PEs) of the 40 available PEs only. The number of the PEs decided to be used for analysis as described above is the "second number" (of processing devices) explained regarding FIG. 1.

The host terminal 150 may appropriately perform coordinate axis conversion according to the shape of the analysis target object. For example, it is assumed that the analysis target object is defined using a three-dimensional orthogonal coordinate system by the input file, and the coordinate axes are referred to as the "X' axis", "Y' axis", and "Z' axis" for convenience. The host terminal 150 may decide the coordinate axis with which the range occupied by the analysis target object is longest (or the number of cells in the range occupied by the analysis target object is largest) among the X' axis, Y' axis, and Z' axis, as the X axis in the analysis. Alternatively, the host terminal 150 may also perform coordinate axis conversion according to another appropriate policy.

The X axis, Y axis, and Z axis illustrated in FIG. 4 may be the X axis, Y axis, and Z axis after coordinate axis conversion is performed as described above.

For example, the PEs 140-1 through 140-P may be connected one-dimensionally along one certain direction associated with any of the X axis, Y axis, and Z axis for analysis. The topology T1 in FIG. 4 is an example of a topology in which the direction in which PEs 140-1 through 140-P are connected is associated with the Z axis.

Alternatively, the PEs 140-1 through 140-P may be connected two-dimensionally along two directions associated with any two coordinate axes of the X axis, Y axis, and Z axis for analysis. For example, the topology T2 is an example of a two-dimensional topology associated with the Y axis and Z axis. Depending on the embodiment, the network topology of the PEs 140-1 through 140-P may be a three-dimensional topology associated with the X axis, Y axis, and Z axis for analysis.

Of course, the coordinate axis conversion as described above may be omitted. That is, the host terminal 150 may decide to use the X' axis, Y' axis, and Z' axis used in the input axis as the X axis, Y axis, and Z axis in the analysis, respectively.

In any case, in step S104, the host terminal 150 decides which PE is to be used for analysis, and decides the coordinate axis as well. Therefore, the host terminal 150 is able to calculate the number of cells in the X axis direction, the number of cells in the Y axis direction, and the number of cells in the Z axis direction, based on the definition in the input file. That is, the host terminal 150 is able to calculate the number of cells included in the analysis target area.

Therefore, further in step S104, the host terminal 150 tentatively assigns cells to the PEs based on the number of PEs used for the analysis and the number of cells included in the analysis target area. The tentative assignment in step S104 is an initial assignment, and may be changed at a subsequent step. Therefore, the tentative assignment at step S104 may be arbitrary assignment. For example, in step S104, a simple assignment based on the number of cells as explained regarding FIG. 2 may be used.

Hereinafter, for the convenience of explanation, let "n" be the number of PEs that the host terminal 150 has decided to use for the analysis (note that "n" indicating the number of PEs is a different variable from "n" in the expressions (1) and (2)). In addition, the n PEs may be described as "PE(1)-PE(n)", which means "the PE(1) through the PE(n)".

While the performances of the PEs 140-1 through 140-P may be different from each other, hereinafter, to simplify the explanation, it is assumed that the performances of the PEs 140-1 through 140-P are equivalent. In addition, while cells of two kinds or more of sizes may be defined by the input file, hereinafter, to simplify the explanation, it is assumed that the sizes of all the cells are equal.

Figure 8:
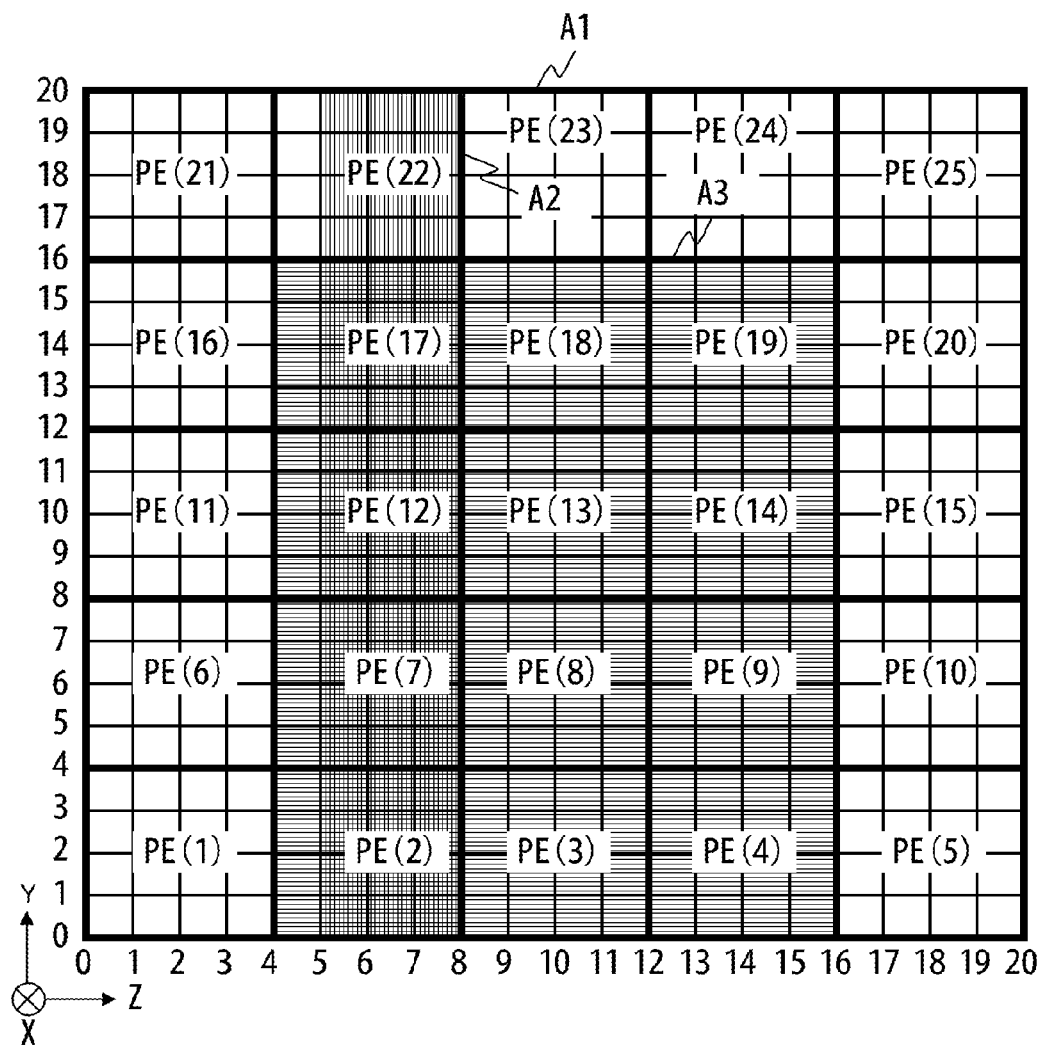
FIG. 8 is a diagram illustrating an example of simple initial assignment based on the number of cells.

For example, in step S104, the host terminal 150 may tentatively decide the number of cells to assign to each PE, by dividing the total number of cells included in the analysis target area by the number n of PEs to be used for the analysis. In FIG. 8, an example of the initial assignment in step S104 is presented.

Specifically, the example in FIG. 8 is an example of a case in which the PEs 140-1 through 140-P are connected in a two-dimensional mesh shape as in the topology T2 in FIG. 4.

In addition, it is assumed that, in step S104, the host terminal 150 has decided to use 25 PEs in P PEs. That is, n=25 is assumed. More specifically, it is assumed that the host terminal 150 has decided to use 25 (=5×5) PEs defined by successive five PEs in the Y direction and successive five PEs in the Z direction in the topology T2 for analysis.

In the example in FIG. 8, an analysis target area A1 includes 20 cells in the Y direction and includes 20 cells in the Z direction. Meanwhile, the number of cells included in the X direction in the analysis target area A1 is not explicitly illustrated in FIG. 8. When PE(1)-PE(25) connected in a two-dimensional mesh shape as in the topology T2 are used, regardless of the number of cells in the X direction, processes such as reassignment discussed later may be applied. For the convenience of explanation, hereinafter, the number of cells in the X direction may be described as "XN".

Hereinafter, for the convenience of explanation, the coordinates in units of cells is referred to as "grid coordinates". The analysis target area A1 is an area where the grid coordinates (X,Y,Z) satisfy $0 \leq X \leq XN$, $0 \leq Y \leq 20$, and $0 \leq z \leq 20$.

In FIG. 8, the lower side of the large rectangle representing the analysis target area A1 (that is, the rectangle of 20×20 cells) corresponds to the plane on which the analysis target object is placed in the three-dimensional space (for example, the surface of a desk, or a floor, and the like). The remaining three sides of the rectangle representing the analysis target area A1 are all absorbing boundaries.

According to the definition in the input file, the output area A2 is an area where the grid coordinates (X,Y,Z) satisfy $0 \leq X \leq XN$, $0 \leq Y \leq 20$, and $5 \leq Z \leq 8$. In FIG. 8, the output area A1 is indicated by vertical hatching.

In addition, according to the definition in the input file, the analysis target object occupies an area (hereinafter, referred to as an "object area A3") where the grid coordinates (X, Y, Z) satisfy $0 \leq X \leq XN$ and $0 \leq Y \leq 16$ and $4 \leq z \leq 16$. In FIG. 8, the object area A3 is indicated by horizontal hatching. In addition, the cells belonging to both the output area A2 and the object area A3 are indicated as grid hatching.

In the analysis target area A1, the medium (for example, the air or vacuum) of the area other than the object area A3 is defined in the input file. Of course, the medium of the analysis target object is also defined in the input file.

The number of cells in the Y direction of the analysis target area A1 is 20, and the PEs to be used for analysis are five PEs successive in the Y direction. Therefore, the host terminal 150 decides, in step S104, the number of cells in the Y direction to assign to each PE as 4(=20/5).

In addition, the number of cells in the Z direction of the analysis target area A1 is 20, and the PEs to be used for analysis are five PEs successive in the Z direction. Therefore, in step S104, the host terminal 150 decides the number of cells in the Z direction to assign to each PE as 4(=20/5).

That is, the host terminal 150 deices, tentatively, to assign 16×XN(=XN×4×4) cells equally to each of the 25 PEs. In FIG. 8, the range of the cells assigned to the PE(1)-PE(25) is indicated by the thick line. For example, according to FIG. 8, to the PE(12), 16×XN cells in which the grid coordinates (X,Y,Z) satisfy $0 \leq X \leq XN$ and $8 \leq Y12$ and $4 \leq Z \leq 8$ are tentatively assigned.

Now, the explanation is brought back to FIG. 5. After deciding the tentative assignment of cells to PEs as in FIG. 8 for example, the host terminal 150 notifies the control device 120 of the tentative assignment in step S105. Meanwhile, in the notification in step S105, based on the input file, the following information is also included.

The definitions of the analysis target area A1, output area A2 and object area A3.

The electric permittivity and the magnetic permeability depending on the material of the analysis target object.

The electric permittivity and the magnetic permeability depending on the medium around the object area A3.

In a case in which one or more parameters are defined regarding the wave source and/or the circuit element in the input file, the one or more parameters.

The type of the absorbing boundary condition.

The length of the step time $\Delta t$.

Meanwhile, hereinafter, to simplify the explanation, the case in which input parameters regarding the wave source and the circuit element are not specified is mainly explained. In other words, hereinafter, mainly, the case in which the primary factor of the position-dependency of the processing load of the cell is "whether or not the cell is included in the output area" is explained.

Upon receiving the notification in step S105, the control device 120 extracts the PEs to be in charge of output in the notified tentative assignment, in step S106. The process of step S106 may be, specifically, an extracting process as illustrated in FIG. 9 for example.

Figure 9:
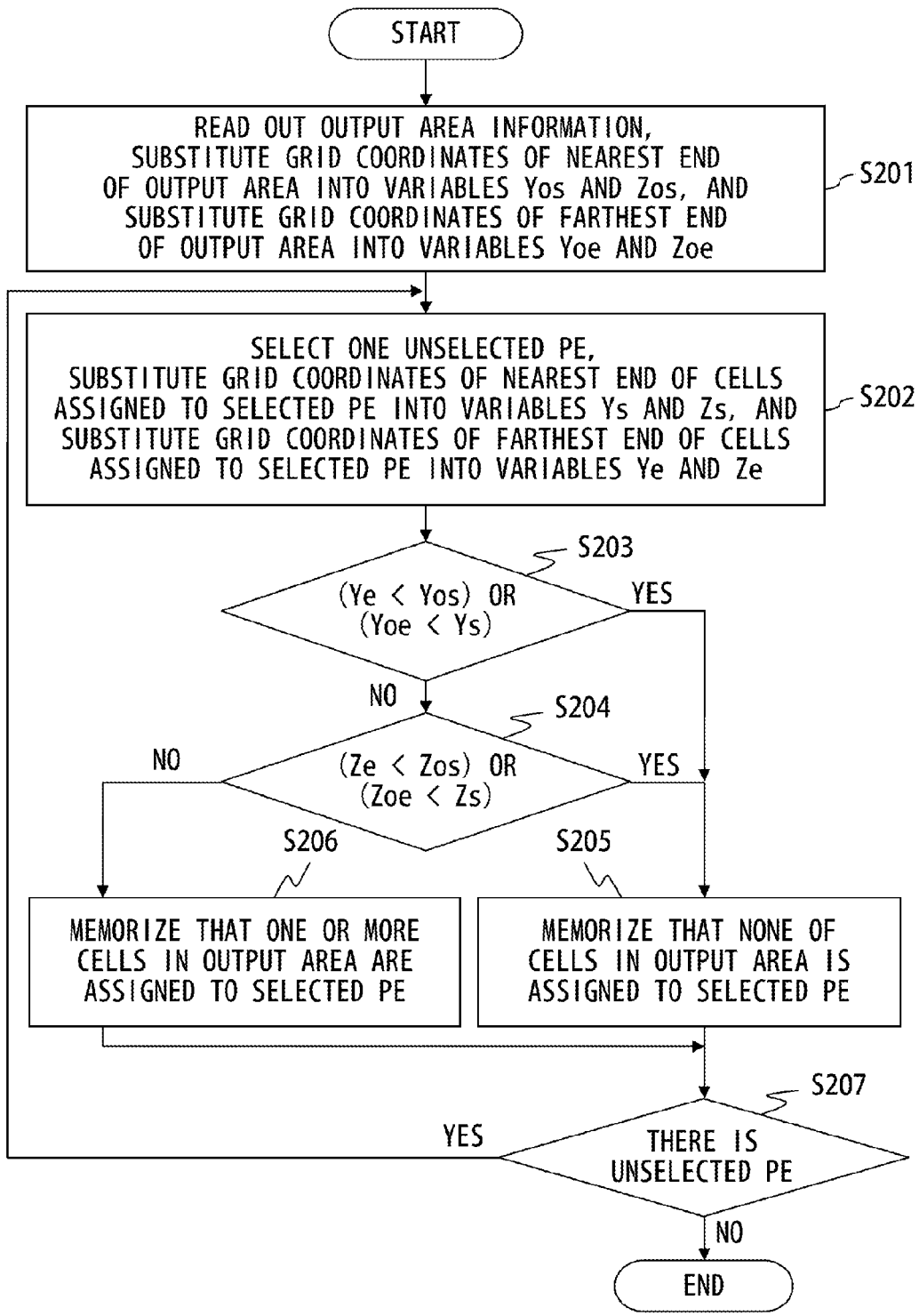
FIG. 9 is a flowchart of a process to extract PEs to be in charge of output.

The extracting process in FIG. 9 is an example of an extracting process in a case in which n PEs of the PEs that are connected in a two-dimensional mesh shape in the Y direction and the Z direction as the topology T2 in FIG. 4 are used for analysis. The control device 120 is able to extract the PEs to be in charge of output also in a case in which n PEs of the PEs that are connected by another topology are used for analysis, by a process similar to that in FIG. 9.

Specifically, in step S201 in FIG. 9, the control device 120 reads out output area information that defines the output area (for example, the output area A2 in FIG. 8). The output definition information is included in the notification in step S105.

Hereinafter, the closest point to the origin in the output area is referred to as the "nearest end" of the output area. In addition, the farthest point from the origin in the output area is referred to as the "farthest end" of the output area.

In step S201, based on the read output area information, the control device 120 substitutes the grid coordinates (more specifically, the grid coordinates in the Y direction and the Z direction) of the nearest end of the output area into variables Yos and Zos. In addition, the control device 120 substitutes the grid coordinates (more specifically, the grid coordinates in the Y direction and the Z direction) of the farthest end of the output area into variables Yoe and Zoe. For example, in the example in FIG. 8, Yos=0, Zos=5, Yoe=20, and Zoe=8.

Next, in step S202, the control device 120 selects one PE that is not selected yet as a target of the judgments in steps S203-S204, from among the n PEs used for analysis. Hereinafter, the PE selected in step S202 is referred to as "selected PE".

The control device 120 substitutes the grid coordinates (more specifically, the grid coordinates in the Y direction and the Z direction) of the nearest end of the cells assigned to the selected PE by the tentative assignment notified from the host terminal 150, into variables Ys and Zs. In addition, control device 120 substitutes the grid coordinates (more specifically, the grid coordinates in the Y direction and the Z direction) of the farthest end of the cells assigned to the selected PE by the tentative assignment, into variables Ye and Ze.

For example, in the example in FIG. 8, it is assumed that the PE(2) is selected in step S202. In this case, Ys=0, Zs=4, Ye=4, and Ze=8.

Next, in step S203, the control device 120 judges whether or not a condition (i) holds true.

$$(Ye < Yos) \text{ OR } (Yoe < Ys) \qquad (i)$$

When the condition (i) does not hold true, the control device 120 executes step S204 next. Specifically, the control device 120 judges whether or not a condition (ii) holds true.

$$(Ze < Zos) \text{ OR } (Zoe < Zs) \qquad (ii)$$

In the example in FIG. 8, when the selected PE is the PE(1) for example, Ze=4 and Zos=5, and the condition (ii) holds true. By contrast, when the selected PE in the example in FIG. 8 is the PE(2) for example, Ze=8 and Zos=5 and Zoe=8 and Zs=4, and the condition (ii) does not hold true.

When at least one of the conditions (i) and (ii) holds true, next, step S205 is executed. Specifically, in step S205, the control device 120 memorizes that "none of the cells in the output area is assigned to the selected PE". That is the control device 120 memorizes that "the selected PE is not in charge of output".

By contrast, when neither of the conditions (i) and (ii) holds true, step S206 is executed. Specifically, in step S206, the control device 120 memorizes that "one or more of the cells in the output area are assigned to the selected PE". That is, the control device 120 memorizes that "the selected PE is in charge of output".

When the process in step S205 or S206 is finished, the control device 120 judges whether or not any PE that has not been selected yet is left in the n PEs used for analysis. When any PE that has not been selected yet is left, the control device 120 executes step S202 again. By contrast, if all the n PEs have been selected already, the extracting process in FIG. 9 is finished.

When the extracting process in FIG. 9 is finished, next, the control device 120 estimates the processing amount of each of the n PEs, in step S107 in FIG. 5. In the second embodiment, the processing amount is represented by the total processing time with respect to one step time.

Specifically, the control device 120 estimates the total processing time T(h) taken for the PE(h) to execute a series of processes in one step time. The total processing time T(h) is expressed as the expression (3).

$$T(h) = \sum_{g=1}^{Ncell(h)} (Tin(h, g) + Tcal(h, g) + Ttxrx(h, g) + Tout(h, g)) \qquad (3)$$

In the expression (3), Ncell(h) is the number of cells being assigned tentatively to the PE(h). That is, Ncell(h) is the number of cells that the PE(h) is in charge of under the tentative assignment. Meanwhile, hereinafter, to simplify the explanation, the "g-th cell of the Ncell(h) cells being assigned to the PE(h)" is simply referred to as the "g-th cell".

In addition, in the expression (3), Tin(h,g) is, when there are one or more input parameters that are specific to the position of the g-th cell, the time taken for the PE(h) to read-in the/those one or more input parameters. For example, when the wave source is placed on the g-th cell, or, when the circuit element being the simulation target is placed on the g-th cell, Tin(h,g) is positive. On the other hand, regarding the g-th cell, when there is no input parameter that is specific to the position of the g-th cell, Tin(h,g)=0.

Meanwhile, the larger the number of parameters to be read regarding the g-th cell, the longer Tin(h,g). The frequency of the reading-in of the parameters may be different depending on the types of the parameters. For example, there may be a parameter that is read only once before the analysis starts, a parameter that is read once for each process with respect to one step time, and a parameter that is read once for each series of processes with respect to prescribed number of step times, and the like. Meanwhile, the Tin(h,g) is an average reading time per process with respect to one step time. Therefore, the Tin(h,g) also depends on the reading-in frequency of each parameter.

In addition, in the expression (3), Tcal(h,g) is the time taken for the PE(h) to perform the calculation of the electric field and the calculation of the magnetic field, regarding the g-th cell tentatively assigned to the PE(h). Tcal(h,g) may differ depending on the position of the g-th cell tentatively assigned to the PE(h). This is because, the specific calculation procedure of the electric field and the magnetic field differs depending on various factors as described below that are dependent on the position of the cell position.

Whether or not the cell is in contact with the absorbing boundary

Whether or not the cell is in contact with the boundary of two media

Whether or not the wave source or the circuit element being the simulation target is placed in the cell In addition, in the expression (3), Ttxrx(h,g) is the sum of the following transmission time and the reception time.

When the PE(h) transmits data of the electric field and/or the magnetic field calculated by the PE(h) regarding the g-th cell tentatively assigned to the PE(h) to another PE, the time taken for the transmission.

When the PE(h) receives data of the electric field and/or the magnetic field regarding the g-th cell assigned tentatively to the PE(h) from another cell, the time taken for the reception.

Meanwhile, depending on the position of the g-th cell tentatively assigned to the PE(h), neither the transmission of data nor the reception of data is performed with another PE regarding the g-th cell. Therefore, there may be a case in which Ttxrx(h,g)=0. For example, in all the cells assigned to the PE(h), regarding the inside cells, which is not in contact with any cell assigned to another PE, Ttxrx(h,g)=0.

In addition, in the expression (3), Tout (h, g) is the time taken for the output process regarding the g-th cell tentatively assigned to the PE(h). When the g-th cell tentatively assigned to the PE(h) is included in the output area, Tout(h,g) is positive. On the other hand, when the g-th cell tentatively assigned to the PE(h) is not included in the output area, Tout(h,g)=0.

Meanwhile, for example, the interval of the output may be specified in the input file in step S102 such as "output data once every simulation for the 30 step times". The time Tout (h, g) indicates the time taken per one step time regarding the output process on average.

By the way, let (Xs(h),Ys(h),Zs(h)) be the grid coordinates of the nearest end in all the cells assigned to the PE(h). Meanwhile, let (Xe(h),Ye(h),Ze(h)) be the grid coordinates of the farthest end in all the cells assigned to the PE(h). Then, Ncell (h) in the expression (3) is expressed as the expression (4).

$$Ncell(h) = (Xe(h) - Xs(h)) \times (Ye(h) - Ys(h)) \times (Ze(h) - Zs(h)) \qquad (4)$$

For example, in the example in FIG. 8, the number Ncell(2) of cells tentatively assigned to the PE(2) is as in the expression (5).

$$Ncell(2)=(XN-0)\times(4-0)\times(8-4)=16\times XN \quad (5)$$

Hereinafter, details of Tcal(h,g) and Ttxrx(h,g) and Tout(h, g) in the expression (3) are illustrated.

For example, in the analysis program according to FDTD method, there is a case in which a technique to express all the grid coordinates (i+½,j,k), (i,j+½,k) and (i,j,k+½) by the indexes (i,j,k) of a three-dimensional array is adopted. When this type of programming technique is adopted, for example, the electric field may be calculated according to the following expressions (6)-(8). In the expressions (6)-(8), "(i,j,k)" indicates the indexes of a three-dimensional array.

$$Ex(i, j, k) = Cx \square Ex(i, j, k) + \quad (6)$$
$$Gx\square[\{Hz(i, j, k) - Hz(i, j-1, k)\} - \{Hy(i, j, k) - Hy(i, j, k-1)\}]$$

$$Ey(i, j, k) = Cy \square Ey(i, j, k) + \quad (7)$$
$$Gy\square[\{Hx(i, j, k) - Hx(i, j, k-1)\} - \{Hz(i, j, k) - Hz(i-1, j, k)\}]$$

$$Ez(i, j, k) = Cz \square Ez(i, j, k) + \quad (8)$$
$$Gz\square[\{Hy(i, j, k) - Hy(i-1, j, k)\} - \{Hx(i, j, k) - Hx(i, j-1, k)\}]$$

Meanwhile, in the expressions (6)-(8), Ex, Ey, Ez are the X component, Y component, Z component of the electric field vector, respectively. In addition, Hx, Hy, Hz are the X component, Y component, Z component of the magnetic field vector, respectively. Then, Cx, Cy, Cz, Gx, Gy, and Gz are coefficients.

The expressions (6)-(8) are, specifically, expressions for the calculation of the electric field regarding the cell that satisfies the following two conditions.

Positioned inside a certain single medium (therefore, not in contact with another medium, and not in contact with the absorbing boundary either).

Does not include a wave source, a circuit element, or the like.

Meanwhile, Ex(i,j,k) in the right-hand side of the expression (6) is a value calculated already regarding the immediately preceding step time and stored in the memory. Meanwhile, Ex(i,j,k) in the left-hand side is the X component of the electric field vector regarding the step time being the current calculation target.

When a certain PE calculates the X component of the electric field vector regarding a cell according to the expression (6), the control device 120 estimates the sum of the following three times as the time taken for the calculation of the X component of the electric field vector (see FIG. 10 discussed later too).

The time taken for the PE to read in the seven values that appear on the right-hand side of the expression (6) (that is, to read Cx, Ex(i,j,k), Gx, Hz(i,j,k), Hz(i,j−1,k), Hy(i,j,k), and Hy(i,j,k−1)) from the memory.

The time taken for the PE to execute three subtractions, two multiplications and one addition.

The time taken for the PE to write the value obtained as a result of the calculation (that is, to write Ex(i,j,k) in the left-hand side) into the memory.

That is, the control device 120 estimates the sum of the time taken for eight (=7+1) times of memory access and the time taken for calculations such as subtraction, multiplication, addition as the time taken for the calculation of the X component of the electric field vector.

The similar applies to the expressions (7) and (8). That is, the control device 120 estimates the sum of the time taken for eight times of memory access, and the time taken for calculations such as subtraction, multiplication, addition, as the time taken for the calculation of the Y component of the electric field vector. In addition, the control device 120 estimates the sum of the time taken for eight times of memory access and the time taken for calculations such as subtraction, multiplication, addition, as the time taken for the calculation of the Z component of the electric field vector.

The illustration of the calculation formulas regarding the magnetic field is omitted. However, the control device 120 estimates the time taken for the calculation of the magnetic field based on the formulas used by the PE for the calculation of the electric field.

For example, it is assumed that the g-th cell tentatively assigned to the PE(h) is positioned inside a certain single medium and does not include a wave source and a circuit element. In this case, the time taken for the calculation of each component of the magnetic field regarding the g-th cell may be regarded as almost equal to the time taken for the calculation of each component of the electric field. Therefore, in this case, Tcal(h,g) in the expression (3) is as in the expression (9). The unit of time in the expression (9) is seconds.

$$Tcal(h, g) = 6 \times \left( \frac{Nmem(h, g) \times Size}{TPmem} + Cal(h, g) \right) \quad (9)$$

In the expression (9), the reason why the value 6 is multiplied is that the expression (9) is an expression used for the case described above (that is, the times taken for the calculation of the six values including the three components of the electric field and the three components of the magnetic fields are regarded almost equal to each other). When the times taken for the calculation of different components are different, instead of multiplying 6 as in the expression (9), the control device 120 estimates the times taken to for the PE to calculate the respective components, and adds the estimated times.

In addition, Nmem(h,g) in the expression (9) represents the number of times of memory access per calculation of one component. More specifically, Nmem(h,g) is the number of times of memory access performed for the PE(h) to calculate one component of the electric field (or the magnetic field) regarding the tentatively assigned g-th cell. In the example in the expression (6), Nmem(h,g)=8. Depending on the position of the cell and the actual programming, there may be a case in which the PE calculates the electric field and the magnetic field according to different formulas than the expressions (6)-(8). That is, the value of Nmem(h,g) may be different depending on the actual calculation procedure executed by the PE.

In addition, Size in the expression (9) represents the size of data of one component. For example, when each component of the electric field and the magnetic field is expressed by a 4-byte floating point value, Size=4. The "Size" is a constant decided by the specification of the simulator 110.

In addition, TPmem in the expression (9) is the transmission throughput between the PE and the memory (where the unit of TPmem is bytes per second). For the sake of simplicity, in the expression (9), it is supposed that the transmission throughputs between the PE 140-$p$ and memory 141-$p$ are equal regardless of p ($1 \leq p \leq P$). Therefore, in the expression (9), the throughput TPmem is a constant.

In addition, Cal(h,g) in the expression (9) represents the time taken for the arithmetic operations such as addition, multiplication and the like per calculation of one component. For example, when the PE(h) calculates the electric field according to the expressions (6)-(8) regarding the tentatively assigned g-th cell, Cal(h,g) is the time taken for the PE(h) to execute three subtractions, two multiplications and one addition. Cal(h,g) is a value according to the hardware specification of the PE(h) (for example, the clock frequency, the number of clock cycles taken for one addition, subtraction, multiplication, division and the like), and the actual calculation procedure executed by the PE(h).

Meanwhile, when the time taken for the arithmetic operation is significantly smaller compared with the memory access time, the influence of Cal(h,g) is small. Therefore, in this case, an appropriate constant having a small value may be used instead of Cal(h,g).

By the way, Tcal(h,g) in the expression (3) may be calculated by the expression (9), or may be calculated by another formula, depending on the position of the g-th cell tentatively assigned to the PE(h).

For example, it is assumed that one of the six planes of a cuboid analysis target area is a plane expressed as X=0. When the absorbing boundary condition applied to this plane is PEC, the expressions (10) and (11) may be used for the calculation of the electric field.

$$Ey(1,j,k) = 0.0 \quad (10)$$

$$Ez(1,j,k) = 0.0 \quad (11)$$

The time taken for the calculation by the expression (10) is only the time taken for one memory access to write the constant 0.0 into the memory. The similar applies to the expression (11).

Alternatively, when the absorbing boundary condition applied to this plane is PMC, the expressions (12) and (13) may be used for the calculation of the electric field, and the expressions (14) and (15) may be used for the calculation of the magnetic field.

$$Ey(1, j, k) = Cy(1, j, k)\square Ey(1, j, k) + \quad (12)$$
$$Gy(1, j, k)\square(Hx(1, j, k) - Hx(1, j, k-1) - 2.0\square Hz(1, j, k))$$

$$Ez(1, j, k) = Cz(1, j, k)\square Ez(1, j, k) + \quad (13)$$
$$Gz(1, j, k)\square(2.0\square Hy(1, j, k) - Hx(1, j, k) + Hx(1, j-1, k))$$

$$Hz(0,j,k) = -Hz(1,j,k) \quad (14)$$

$$Hy(0,j,k) = -Hy(1,j,k) \quad (15)$$

The calculation according to the expression (12) includes seven times of memory access, three multiplications, two subtractions and one addition. That is, the load of the calculation according to the expression (12) is the load generated by seven times of memory access, three multiplications, two subtractions and one addition. Therefore, the time taken for the calculation according to the expression (12) is the time taken for seven times of memory access, three multiplications, two subtractions and one addition.

Meanwhile, the load of the calculation according to the expression (13) is the load generated by seven times of memory access, three multiplications, one subtraction and two additions.

Meanwhile, the load of the calculation according to the expression (14) is the load generated by two times of memory access, and one calculation to invert to the positive/negative signs. The load of the calculation according to the expression (15) is the same as the load of the calculation according to the expression (14).

Alternatively, when the absorbing boundary condition applied to the plane expressed as X=0 is PBC, the expressions (16) and (17) may be used for the calculation of the electric field. Meanwhile, "i" in the expressions (16) and (17) is an index corresponding to the X coordinate of the farthest end of the analysis target area.

$$Ey(1, j, k) = Cy\square Ey(1, j, k) + \quad (16)$$
$$Gy\square(Hx(1, j, k) - Hx(1, j, k-1) - Hz(1, j, k) + Hz(i', j, k))$$

$$Ez(1, j, k) = Cz\square Ez(1, j, k) + \quad (17)$$
$$Gz\square(Hy(1, j, k) - Hy(i', j, k) - Hx(1, j, k) + Hx(1, j-1, k))$$

The load of the calculation according to the expression (16) is the load generated by eight times of memory access, two multiplications, two additions and two subtractions. The load of the calculation according to the expression (17) is the same as the load of the calculation according to the expression (16).

Of course, another absorbing boundary condition such as Mur and PML and the like may also be applied. As is apparent by the comparison of the expressions (10)-(17) with the expressions (6)-(8), depending on the position of the cells, and also depending on the applied absorbing boundary condition, the following numbers may differ in various ways.

The number of times of memory access accompanying the calculation of the electric field The number of arithmetic operations accompanying the calculation of the electric field The number of times of memory access accompanying the calculation of the magnetic field The number of arithmetic operations accompanying the calculation of the magnetic field In addition, the time Tcal(h,g) may differ also depending on the presence/absence of the wave source, port element, circuit element (resistor, capacitor, inductor and the like). Furthermore, in a case such as when the parallel FDTD method is used for the evaluation of the influence of the electromagnetic wave on the human body, SAR (Specific Absorption Rate) is also used as one of the input parameters. The time Tcal(h,g) may differ also depending on whether or not SAR is used.

As described above, the factors that influences the time Tcal(h,g) regarding each cell (for example, the number of times of memory access, the number of additions, the number of subtractions, the number of multiplications and the like) may differ depending on the position of the cell. Then, the different time Tcal(h,g) for each cell depending on the position is, specifically, decided by the content of the input file in step S102. For example, the following matters are all examples of the factor that affects the time Tcal(h,g), and these factors are all defined in the input file.

Whether the cell at a certain position is in contact with the boundary of different media Whether a wave source is placed in the cell at a certain position Whether the cell at a certain position is in contact with the absorbing boundary Which absorbing boundary condition is used Therefore, the control device 120 determines, based on the definition in the input file, specifically by which method the time Tcal(h,g) is to be calculated. Then, the control device 120 calculates the time Tcal(h,g) according to the appropriate formula (for example, the expression (9)) which depends on the position of each cell.

Now, in the expression (3), the time Ttxrx (h, g) taken for transmission/reception of data is also included. As described above, of all the cells assigned to the PE(h), regarding the inside cell that is not in contact with any cell assigned to another PE, Ttxrx (h, g)=0. Therefore, the time taken for transmission/reception of data, may also be expressed as the expression (18).

$$\sum_{g=1}^{Ncell(h)} Ttxrx(h, g) = \frac{Nadj(h) \times 12 \times \text{Size}}{TPlink} \quad (18)$$

Nadj (h) in the expression (18) is, roughly speaking, the number of cells to be the target of transmission/reception between the PE(h) and another PE. Size in the expression (18) is the same as Size in the expression (9). TPlink in the expression (18) is the transmission throughput of the link between PEs, and its unit is bytes per second. Meanwhile, in the expression (18), the value 12(=2×2×3) is multiplied for the following reasons.

Because two types of processes, transmission and reception, are performed.

Because two types of data (that is, data of the electric field and data of the magnetic field) are transmitted and received.

Three components (that is, the X component, Y component, Z component) of the vector of the electric field and the vector of the magnetic field respectively are transmitted and received.

Hereinafter, Nadj(h) is explained more specifically.

To the PE(h), cells in a cuboid range that satisfies Xs(h) ≤X≤Xe(h) and Ys(h)#≤Y≤Ye(h) and Zs(h)·≤Z≤Ze(h) are assigned. Another PE to which cells adjacent to the range in the positive or the negative direction of the X axis, Y axis, or Z axis is referred to as an "adjacent PE" for the sake of convenience.

For the PE(h), only one adjacent PE may exist, or two or more adjacent PEs may also exist. The number of adjacent PEs depends on the topology of PEs (see FIG. 4), the position of the PE(h) in the topology, and the assigning method of cells to the PE. For example, in the example in FIG. 8, the adjacent PEs of the PE(2) are PE(1) and PE(7) and PE(3).

Meanwhile, for example in the positive direction of the Z axis, the number of PE adjacent to the PE(2) is 1 in the example in FIG. 8. However, deepening on the connection topology of PEs and the assigning method of cells to the PEs, two or more PEs may be adjacent to the PE(2) in the positive direction of the Z axis. The similar applies to the other directions.

Therefore, the number of adjacent PEs adjacent to the PE(h) in a certain direction is 0, 1, or 2 or more. In the Ncell(h) cells tentatively assigned to the PE(h), those in contact with cells assigned to one or more adjacent PEs in a certain direction are referred to as "boundary plane cells" for the sake of convenience. Nadj (h) in the expression (18) is the largest number in the numbers of the boundary plane cells in the directions in which adjacent PEs exist.

For example, there may be a case in which PEs are connected as in the topology T1 in FIG. 4. Here, assuming that the PE that is not at the right end or the left end and positioned in between in FIG. 4 is able to perform data transmission/reception with the cell on its immediate left, in parallel with data transmission/reception with the PE on its immediate right, Nadj(h) is as in the expression (19).

$$Nadj(h)=(Xe(h)-Xs(h))\times(Ye(h)-Ys(h)) \quad (19)$$

Alternatively, there may be a case in which PEs are connected as in the topology T2 in FIG. 4. In the topology T2, the number of adjacent PEs is 2, 3 or 4. Here, assuming that each PE is able to perform data transmission/reception with all the adjacent PEs for the PE in parallel, Nadj (h) is as in the expression (20).

$$Nadj(h)=\max((Xe(h)-Xs(h))\times(Ye(h)-Ys(h)), (Xe(h)-Xs(h))\times(Ze(h)-Zs(h))) \quad (20)$$

Meanwhile, when the link between PEs is a half-duplex link, the value 12 may be multiplied in the expression (18) as described above. On the other hand, when the link between PEs is a full-duplex link, instead of 12, the value 6(=2×3) may also be used.

In any case, the control device 120 appropriately estimates the time taken for the PE(h) to perform transmission/reception of data, according to the hardware specification of each PE and the physical configuration of the network between PEs. For example, when the PE(h) does not have a function to communicate simultaneously with two or more adjacent PEs, Nadj(h) is different from the expressions (19)-(20).

In addition, depending on the hardware specification of each PE, TPlink in the expression (18) may be replaced with min(TPmem,TPlink). This is because, depending on the hardware specification of the PE, there is a possibility that the following times become a bottleneck (that is, the following times may decide the time taken for the data transmission/reception process).

The time taken for the PE to readout transmission-target data from the memory.

The time taken for the PE to write received data into the memory.

However, in such a case when a pipeline process is performed in the PE, in the estimation of the time taken for data transmission/reception, there is no problem in ignoring the influence of the transmission throughput TPmem between the PE and the memory. The expression (18) is an example of a formula applied when there is no problem in ignoring the influence of the transmission throughput TPmem between the PE and the memory.

As illustrated in various ways above, the specific method by which the control device 120 estimates Ttxrx(h,g) may be different according to the hardware specification of each PE and the physical configuration of the network between PEs.

Now, in the expression (3), the time Tout(h,g) taken for outputting data is also included. As illustrated above, when the g-th cell assigned tentatively to the PE(h) is not included in the output area, Tout(h,g)=0. Therefore, regarding the time taken for the output process, it may also be expressed as the expression (21).

$$\sum_{g=1}^{Ncell(h)} Tout(h, g) = \frac{Nout(h) \times Nreq \times \text{Size}}{TPmem \times Intv} \quad (21)$$

Nout(h) in the expression (21) is the number of cells that are included in the output area among the Ncell(h) cells tentatively assigned to the PE(h). Here, let (Xos(h),Yos(h),Zos(h)) and (Xoe(h),Yoe(h),Zoe(h)) be the coordinates (more specifically, the grid coordinates) of the nearest end and the farthest end of the cells included in the output area among the Ncell (h) cells tentatively assigned to the PE(h), respectively. Then, Nout(h) is expressed as the expression (22). For example, in the example of FIG. 8, Nout(2)=12×XN.

$$Nout(h)=(Xoe(h)-Xos(h))\times(Yoe(h)-Yos(h))\times(Zoe(h)-Zos(h)) \quad (22)$$

Meanwhile, Nreq in the expression (21) is the number of types of data that the user has requested as the output target. Since there are a total of six types of data that are to be an output target (that is, the X component, Y component, Z component of the electric field vector and the X component, Y component, Z component of the magnetic vector), 1≤Nreq≤6. Meanwhile, the control device 120 is able to recognize Nreq from the content specified in the input file.

In addition, Size and TPmem in the expression (21) are the same as Size and TPmem in the expression (9).

Intv in the expression (21) indicates the output interval. Specifically, the output interval Intv represents the rate that the user has requested data to be output, in the format "once per a specified number of step times". For example, when the user inputs, in step S101, that he/she desires data to be output once per 30 times the step time Δt, the output interval of "30" is set in the input file. In this case, the control device 120 is able to recognize Intv=30, based on the input file.

Meanwhile, the control device 120 recognizes which of the following two conditions holds true, as a result of the extracting process in FIG. 9, and therefore, is able to perform calculation by the expression (21) efficiently.

Regarding any g that satisfies 1≤g≤Ncell(h), Tout(h,g)=0. That is, Nout(h)=0.

Regarding a certain g that satisfies 1≤g≤Ncell(h), 0<Tout(h,g). That is, 0<Nout(h).

By the way, data output from the PE is transmitted to the control device 120 via the switch 130, and written into the HDD 170 via the network 180 by the control device 120. Therefore, depending on the specific configuration of the system 100, the time taken for the output process may depend on various factors (for example, the transmission throughput between the PE and the control device 120 via the switch 130). The control device 120 estimates Tout(h,g) by an appropriate method according to the specific hardware specification of the system 100.

For example, the expression (21) corresponds to the case in which the time taken for the output process mainly depends on the memory access time. As illustrated in the example E2 in FIG. 2, the output process may be executed in a spread manner over time. When the output process is spread over the time, there is no problem in ignoring the influence that the transmission throughput of the network path from the PE to the HDD 170 has on the time taken for the output process. In this case, the time taken for the output process is mainly defined by the time taken for the memory access by which the PE reads out the output-target data. The expression (21) is a formula that is appropriate for such a case.

As illustrated in various ways above, the control device 120 estimates the total processing time of each of the PE(1)-PE(n) by an appropriate method according to factors as described below, in step S107 in FIG. 5.

The content of the input file

The hardware specification of the PE, network and the like (for example, it includes the specification regarding the respective transmission throughputs between the PE and the memory, between PEs, between the PE and the switch 130. In addition, it also includes the specification about the clock frequency of each PE, whether a pipeline process is performed in each PE, the number of stages of the pipeline, the size of the floating point data, and the like).

The specific calculation procedure by each PE (in other words, how the parallel FDTD method is programmed and implemented specifically).

From a certain viewpoint, the process performed by the control device 120 in step S107 includes the estimation of each position-dependent processing load of the cell in step S1 of FIG. 1 (for example, the estimation of the number of times of memory access and the number of calculations). Furthermore, the process in step S107 includes the calculation of the processing time from the estimated processing load. Specifically, for example, the process as described below may be included.

Division by the throughput as in the expressions (9), (18), and (21)

Decision of the processing time Cal(h,g) from the number of various calculations such as addition, multiplication and the like.

Meanwhile, the calculation of the total processing time T(h) of each PE(h) in step S107 corresponds to the total processing time of each processing device, performed in step S2 of FIG. 1 to judge "whether or not the criterion with respect to the uniformity in the total processing time is met". Then, the judgment in step S2 about "whether or not the criterion with respect to the uniformity in the total processing time is met" corresponds to step S108.

Specifically, in step S108, the control device 120 judges whether the dispersion of the total processing time T(h) is within the allowable range (1≤h≤n). The judgment in step S108 may be based on the comparison of a statistic, such as the standard deviation of the n total processing times (or the interquartile range (IQR) of then total processing times), with a threshold. Alternatively, a value obtained by dividing the standard deviation or the IQR by the average value of the n total processing times may be compared with an appropriate threshold. However, in the present embodiment, in step S108, specifically, a judgment as described below is performed.

In step S108, the control device 120 calculates the reference value (hereinafter, described as "Tref") of the total processing time T(h) in the PEs that are not in charge of output. The reference value Tref may be, specifically, a statistic of the total processing time T(h) of the PEs that are not in charge of output. It is preferable that the minimum value is used as the statistic, but the first quartile, the average value, or the like may also be used as the statistic.

Alternatively, to simplify the process, the control device 120 may select anyone of the PEs that are not in charge of output, and may use the total processing time T(h) of the selected PE as the reference value Tref. This is because, the initial assignment in step S104 and the reassignment in step S112 are performed so that the difference between total processing times among the PEs that are not in charge of output does not become so large.

Then, when the condition (iii) is satisfied regarding all the PEs that are in charge of output, the control device 120 determines that "the dispersion of the total processing time is within the allowable range". On the other hand, when there are one or more PEs that do not satisfy the condition (iii), the control device 120 determines that "the dispersion of the total processing time is not within the allowable range". Meanwhile, "Ta" in the condition (iii) is a prescribed threshold being larger than 1 (for example, about 1.1-1.3).

$$T(h)/Tref < Ta \quad (iii)$$

Meanwhile, as explained regarding FIG. 9, the control device 120 has already recognized "in the PE(1)-PE(n), which PEs are in charge of output, and which PEs are not in charge of output". For this reason, the control device 120 is able to obtain the reference value Tref, and also is able to make the above determination.

Upon determining that the dispersion of the total processing time is within the allowable range, the control device 120 executes step S109 next. In step S109, the control device 120 decides to adopt the current tentative assignment. That is, in this case, the assignment of cells to the PE(1)-PE(n) are eventually decided in step S109. The control device 120 notifies the host terminal 150 of the assignment having eventually been decided.

On the other hand when the control device 120 determines that "the dispersion of the total processing time is within the allowable range" in step S108, the control device 120 notifies that the host terminal 150 of "the assignment not being decided yet". In addition, in this case, the control device 120 also notifies the host terminal 150 of "which PEs are in charge of output in the current tentative assignment".

Therefore, in step S110, the host terminal 150 is able to judge "whether or not the assignment has been decided", based on the notification from the control device 120.

When the assignment is decided, the host terminal 150 executes step S116 in FIG. 6 next. When the assignment has not been decided yet, the host terminal 150 executes steps S111-S112 next, and further, executes step S105 again.

Specifically, in step S111, the host terminal 150 performs a process to increase the PEs to be in charge of output. Details of step S111 are described later.

Then, in step S112, the host terminal 150 reassigns cells to the PE(1)-PE(n) based on the result of step S111. The reassignment in step S112 is also a tentative assignment. Details of step S112 are also described later.

Next, the host terminal 150 executes step S105 again. That is, the host terminal 150 notifies the control device 120 of the redone tentative assignment. Meanwhile, in the second and subsequent execution of step S105, the host terminal 150 may omit the notification of various information defined in the input file (for example, the definition of the output area and the like) to the control device 120.

As described above, upon receiving the notification about new assignment, the control device 120 executes the steps after the steps s106 again. Therefore, even when the dispersion of the total processing time is out of the allowable range by the first assignment in step S104, as a result of one or more executions of reassignment, an assignment with which the dispersion is within the allowable range is found. As a result, the steps after step S113 in FIG. 6 are executed.

From a certain viewpoint, the judgment in step S108 is a judgment about whether or not the criterion explained regarding step S2 of FIG. 1 (that is, the criterion with respect to the uniformity in the total processing times among processing devices) is met. When the dispersion of the total processing time T (h) is within the allowable range, criterion is met, and the when the dispersion is out of the allowable range, the criterion is not met. Then, until an assignment that satisfies the criterion is found, the reassignment in steps S111-S112 are repeated, and therefore, the assignment eventually decided in step S109 satisfies the criterion. That is, in the similar manner as step S2, in the second embodiment, the assignment is also performed under the condition that the criterion described above is met.

Now, after eventually deciding the assignment in step S109, the control device 120 executes step S113 of FIG. 6. In step S113, the control device 120 calculates the size of the "computation area" regarding each of the PE(1)-PE(n). Here, the "computation area" of the PE(h) is an area on the memory used by the PE(h) to calculate the electric field and the magnetic field for all the cells assigned to the PE(h). The computation area of the PE(h) includes, at least, the following areas.

The area to store the X component, Y component, Z component of the electric field vector calculated regarding each cell assigned to the PE(h)

The area to store the X component, Y component, Z component of the magnetic field vector calculated regarding each cell assigned to the PE(h)

The control device 120 calculates the size of each computation area, based on the assignment decided in step S109. Then, the control device 120 notifies each of the PE(1)-PE(n) of the size of the computation area.

Meanwhile, in FIGS. 5-7, a case in which both the PEs 140-1 and 140-2 are used for analysis is illustrated (for example, the PE(1) may be the PE 140-1, and the PE(2) may be the PE 140-2). Therefore, the PE 140-1 receives the notification about the size of the area on the memory 141-1 used by the PE 140-1 from the control device 120. In the similar manner, the PE 140-2 receives the notification about the size of the area on the memory 141-2 used by the PE 140-2 from the control device 120.

In step S114, the PE 140-1 allocates the computation area, based on the notification from the control device. In the similar manner, in step S115, the PE 140-2 allocates the computation area, based on the notification from the control device.

Meanwhile, after determining that "the assignment has been decided" in step S110, the host terminal 150 creates a "schedule" of each PE(h) in step S116 (1≤h≤n). Here, the "schedule" of the PE(h) is a series of commands executed by the PE(h). The individual command included in the schedule is, specifically, a machine code.

Figure 11:
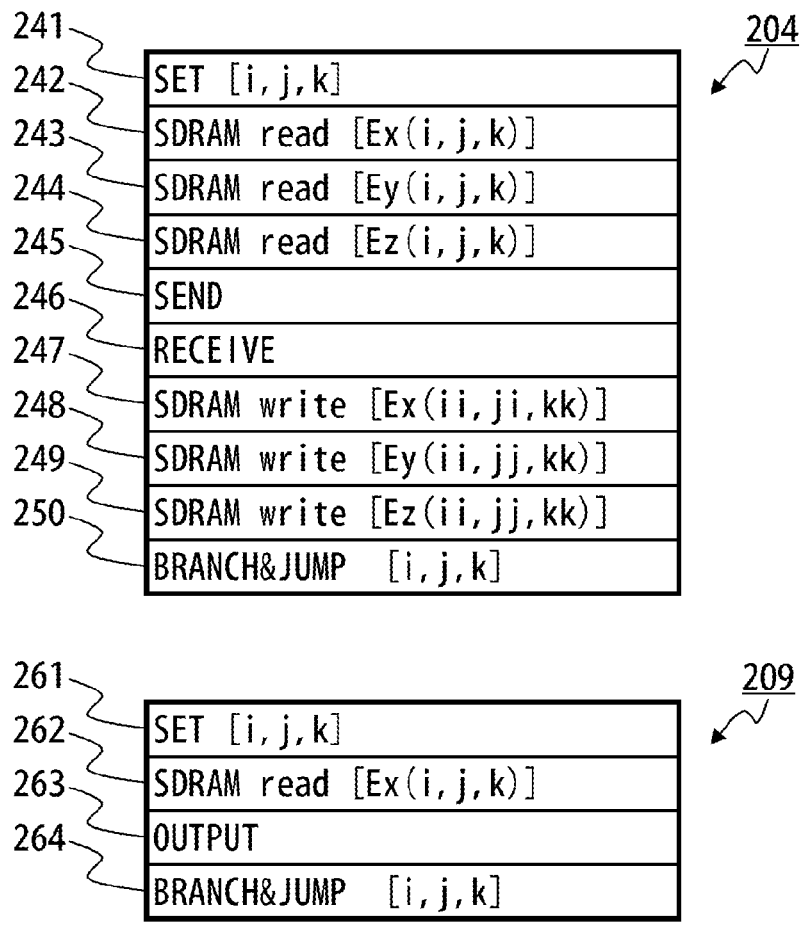

FIGS. 10-11 are diagrams schematically illustrating the schedule. In step S116, the host terminal 150 may create a schedule illustrated in FIGS. 10-11, for each of the PE(1)-PE (n).

Meanwhile, the order among the command sets, the order among the commands, the number of commands, and the specific content of the commands and the like in FIGS. 10-11 are given as examples for explanation, and they may be appropriately changed according to the embodiment. In addition, depending on the output interval, a command to judge whether or not to execute output may further be added. In addition, the specific content of each command is different depending on the type of the PE. For example, when the PE is FPGA or ASIC, the schedule may include a set of input parameters given to the circuit as input.

Now, the schedule 200 in FIG. 10 is an example of the schedule for the PE that is in charge of output. More specifically, FIG. 10 illustrates an example of a case in which the user has requested that the X component, Y component, and Z component be output regarding each of the electric field vector and the magnetic field vector. That is, FIG. 10 illustrates an example of a case in which Nreq=6 in the expression (21).

The schedule 200 includes command sets 201-214 listed below. Each command set includes one or more commands.

A command set 201 to compute the X component Ex of the electric field vector A command set 202 to compute the Y component Ey of the electric field vector A command set 203 to compute the Z component Ez of the electric field vector A command set 204 for transmission/reception of data of the electric field vector A command set 205 to compute the X component Hx of the magnetic field vector A command set 206 to compute the Y component Hy of the magnetic field vector A command set 207 to compute the Z component Hz of the magnetic field vector A command set 208 for transmission/reception of data of the magnetic field vector A command set 209 for outputting the computation result of Ex to the HDD 170 via the switch 130 and the control device 120 (that is, for copying the computation result of Ex)

A command set 210 for copying the computation result of Ey

A command set 211 for copying the computation result of Ez

A command set 212 for copying the computation result of Hx

A command set 213 for copying the computation result of Hy

A command set 214 for copying the computation result of Hz

FIG. 10 schematically illustrates details of the command set 201 from the command sets 201-204. Meanwhile, FIG. 11 schematically illustrates details of the command sets 204 and 209.

For example, there may be a case in which, to a certain PE, only the cells positioned inside a certain medium are assigned. FIG. 10 schematically illustrates an example of the command set 201 in such a case. As described above, regarding the cell positioned inside a medium, the X component Ex of the electric field may be calculated by the expression (6). The expression (6) is presented again below.

$$Ex(i,j,k)=Cx\square Ex(i,j,k)+Gxj\{\square[(i,j,k)-Hz(i,j-1,k)\}-\{Hy(i,j,k)-Hy(i,j,k-1)\}]\quad(6)$$

FIG. 10 schematically illustrates details of the command set 201 based on the expression (6). Specifically, the command set 201 includes commands 221-232 as described below. In the example in FIG. 10, it is assumed that each of the memories 141-$p$ is a SDRAM (Synchronous Dynamic Random Access Memory) $1 \leq p \leq P$).

Some commands 221 for setting values respectively to index variables i, j, and k (in FIG. 10, for the sake of convenience, the commands 221 are illustrated by one block)

The command 222 for reading out the coefficient Cx in the expression (6) from the memory The command 223 for reading out Ex(i,j,k) in the right-hand side of the expression (6) from the memory The command 224 for reading out the coefficient Gx in the expression (6) from the memory The command 225 for reading out Hz(i,j,k) in the expression (6) from the memory The command 226 for reading out Hz(i,j−1,k) in the expression (6) from the memory The command 227 for reading out Hy(i,j,k) in the expression (6) from the memory The command 228 for reading out Hy(i,j,k−1) in the expression (6) from the memory Some commands for performing arithmetic operations according to the expression (6). Meanwhile, in FIG. 10, for the convenience of illustration, only the commands 229 and 230 are illustrated.

The command 231 for writing the value obtained as a result of calculation into the memory as Ex(i,j,k)

The commands 232 for conditional branching and jump

Meanwhile, in FIG. 10, for the sake of convenience, the commands 232 are illustrated by one block. Specifically, the commands 232 include a command to judge "whether the calculation of the X component of the electric field vector has been completed for all the assigned cells, or whether there still remains the next cell". The commands 232 further include a command to update one of the index variables i, j, and k in the latter case, and a command to jump to the address of the command 222.

By the way, in the explanation above regarding step S107 of FIG. 5, it is described that the estimation is performed according to the specific implementation of the program. FIGS. 10-11 are also a diagram that illustrates an example of the specific program implementation.

For example, according to the command set 201 in FIG. 10, the PE executes 7 times of read access by the commands 222-228 and one time of write access by the command 231. The example of "Nmem(h,g)=8" described regarding step S107 corresponds to the details of the command set 201 above.

Now, FIG. 11 schematically illustrates details of the command set 204 for transmission/reception of data of the electric field vector. Specifically, the command set 204 includes commands 241-250 as described below.

Some commands 241 for setting values respectively to index variables i, j, and k (in FIG. 11, for the sake of convenience, the commands 241 are illustrated by one block).

The command 242 for reading, from the memory, Ex(i,j,k) that is to be transmitted to the adjacent PE The command 243 for reading, from the memory, Ey(i,j,k) that is to be transmitted to the adjacent PE The command 244 for reading, from the memory, Ez(i,j,k) that is to be transmitted to the adjacent PE from the memory One or a plurality of commands 245 for transmitting read Ex(i,j,k), Ey(i,j,k), and Ez(i,j,k) to the adjacent PE One or a plurality of commands 246 for receiving, from the adjacent PE, data of the electric field vector of the coordinates represented by the indexes (ii,jj,kk)

The command 247 for writing received Ex(ii,jj,kk) into the memory

The command 248 for writing received Ey(ii,jj,kk) into the memory

The command 249 for writing received Ez(ii,jj,kk) into the memory

The command 250 similar to the command 232 for conditional branching and jump. The jump-to address is the address of the command 242.

Meanwhile, to which PE the PE executing the command set 204 in FIG. 11 sends data and from which PE it receives data depend on the implementation of the parallel FDTD method. The transmission destination and/or the transmission source of data depend on details of the implementation such as "whether or not an assignment with which the ranges of cells covered respectively by adjacent two PEs overlap".

Now, FIG. 11 also schematically illustrates details of the command set 209 for outputting the computation result of Ex to the HDD 170 via the switch 130 and the control device 120 (that is, for copying the computation result of Ex). Specifically, the command set 209 includes commands 261-264 as described below.

Some commands 261 for setting values respectively to index variables i, j, and k (in FIG. 11, for the sake of convenience, the commands 261 are illustrated by one block).

The command 262 for reading, from the memory, Ex(i,j,k) that is to be output

The command 263 for outputting read Ex (i, j, k) to the HDD 170 (in the other words, for transmitting read Ex(i,j,k) to the control device 120 via the switch 130)

Some commands 264 similar to the command 232 for conditional branching and jump. The jump-to address is the address of the command 262.

The expression (21) above includes a division by the transmission throughput between the PE and the memory because, by the memory access by the command 262, the time taken for the output process is affected.

Now, the explanation is brought back to FIG. 6 again. In step S116, the host terminal 150 creates a schedule such as in FIGS. 10-11 for each of the PE(1)-PE(n), and transmits each created schedule to the control device 120.

Then, in step S117, the control device 120 performs an initialization process. That is, the control device 120 transmits the schedule for the PE(h) to each PE(h) (1≤h≤n).

Therefore, the PE 140-1 receives the schedule for the PE 140-1. Then, the PE 140-1 sets "computation information" in step S118. Meanwhile, the "computation information" here is information used for the execution of analysis by the PE 140-1, and information including at least the received schedule for the PE 140-1.

For example, when the PE 140-1 is a general-purpose CPU, the schedule for the PE 140-1 is, specifically, a program described with machine codes for the CPU. In this case, in step S118, specifically, the PE 140-1 loads the received schedule for the PE 140-1 onto the memory 141-1.

In the similar manner, the PE 140-2 receives the schedule for the PE 140-2. Then, the PE 140-2 sets computation information in step S119.

In addition, the control devices 120 orders the PE(1)-PE(n) to start computation, in step S120. Then, according to the order, the PE(1)-PE(n) start the computation.

Specifically, the PE 140-1 calculates the electric field in step S121, and in parallel with it, the PE 140-2 calculates the electric field in step S122.

Next, the PE 140-1 performs transmission/reception of data of the electric field in step S123, and in parallel with it, the PE 140-2 performs transmission/reception of data of the electric field in step S124. For example, in a case such as when the ranges of the cells assigned respectively to the PEs 140-1 and 140-2 overlap, an implementation in which the PE 140-1 sends data to the PE 140-2, and the PE 140-1 receives data from the PE 140-2 may be adopted. The bidirectional arrow connecting the steps S123 and S124 illustrates such implementation. Depending on the implementation of the parallel FDTD method, the transmission destination of data and the transmission source of the data for a certain PE may be different.

After the completion of transmission/reception of data of the electric field, the PE 140-1 calculates the magnetic field in step S125, and in parallel with it, the PE 140-2 calculates the magnetic field in step S126.

Next, the PE 140-1 performs transmission/reception of data of the magnetic field in step S127, and in parallel with it, the PE 140-2 performs transmission/reception of data of the magnetic field in step S128. The steps S127-S128 are similar to the steps S123-S124.

Now, for the convenience of explanation, it is assumed as follows.

As illustrated in the schedule 200 in FIG. 10, it is assumed that an implementation in which the output process is performed after transmission/reception of data of the magnetic field is adopted.

While it is omitted to simplify the explanation in the schedule 200 in FIG. 10, it is assumed that the schedule for the PE 140-1 also includes a conditional branching command regarding the output interval and the like.

It is assumed that a cell or cells included in the output area is/are assigned to the PE 140-1.

It is assumed that no cell included in the output area is assigned to the PE 140-2.

According to the assumption as described above, the PE 140-1 that operates according to the computation information set in step S118 judges "whether or not to perform the output process" in step S129, after the completion of data of the magnetic data in step S127. This judgment is performed according to the conditional branching command include in the schedule for the PE 140-1, as in the assumption above.

In addition, the output interval specified in the argument of the conditional branching command is a value specified in the input file in step S102. That is, the host terminal 150 refers to the value of the output interval specified in the input file, and includes a command according to the output interval specified by the user into the schedule in creation of the schedule in step S116.

Upon determining to "perform the output process" in step S129, the PE 140-1 outputs the computation result next in step S130. For example, when the user has specified data of both the electric field and the magnetic field to be output, the PE 140-1 transmits data of the electric field calculated in step S121 and data of the magnetic field calculated in step S125 to the control device 120 via the switch 130.

After the output of the computation result in step S130, the PE 140-1 executes step S131. Alternatively, upon determining "not to perform the output process" in step S129, the PE 140-1 executes step S131 after the judgment in step S129.

Specifically, in step S131 the PE 140-1 judges whether or not the analysis has already been finished up to the last step time to be analyzed. When the analysis has not proceeded to the last step time yet, the PE 140-1 next executes step S121 again. That is, when the analysis has not proceeded to the last step time yet, the PE 140-1 performs the process regarding the next step time.

Now, according to the assumption above, no cell included in the output area is assigned to the output area regarding PE 140-2. Therefore, after the completion of transmission/reception in step S128, the PE 140-2 executes the judgment in step S132. That is, in step S132, the PE 140-2 judges whether the analysis has already been finished to the last step time of the analysis target. When the analysis has not proceeded to the last step time, the PE 140-2 next executes step S122 again.

By the way, the data output in step S130 is written into the HDD 170 via the control device 120. Then, the data written into the HDD 170 is provided to the user.

More specifically, as illustrated in FIG. 7 for example, the control device 120 may compress the data in step S133 and may write the compressed data into the HDD 170. The control device 120 may notify the host terminal 150 of the writing of the data into the HDD 170.

In addition, the host terminal 150 may process data on the HDD 170 (that is, the analysis result). For example, the host terminal 150 may visualize the numerical data of the electric field and/or the magnetic field. That is, the host terminal 150 may generate video data illustrating the temporal change of the electric field and/or the magnetic field. The host terminal 150 transmits the processed analysis result to the user terminal 160.

Then, in step S135, the user terminal 160 displays the analysis result. Therefore, the user is able to see the analysis result.

By the way, while it is omitted in FIGS. 5-7 to simplify the explanation, the control device 120 may monitor the progress of the analysis by the PE(1)-PE(n). For example, each PE(h) may notify the control device 120 of the termination every time when a series of processes with respect to one step time is terminated (for example immediately before the judgment in step S131 and S132). Then, the control device 120 is able to monitor the progress of the analysis based on the notification from each PE(h).

When the analysis is completed for all the step times, in step S136, the control device 120 notifies the PE(1)-PE(n) and the host terminal 150 of the completion of the computation. Then, according to the notification, in step S137, the PE 140-1 releases the computation area. In the similar manner, in step S138, the PE 140-2 also releases the computation area. In addition, in step S139, the host terminal 150 performs an appropriate termination process. The termination process may be, for example, a process to notify the user terminal 160 of the termination.

Next, further details regarding the processes in FIGS. 5-7 described above are explained.

The specific example of steps S111-S112 explained below may be applied when the PEs 140-1 through 140-P are connected one-dimensionally in the Z direction as in the topology T1 in FIG. 4. In this case, n PEs of the P PEs connected in the Z direction are used for analysis.

In addition, the specific example of steps S111-S112 explained below may also be applied to a case where the PEs 140-1 through 140-P are connected in a two-dimensional mesh shape in the Y direction and the Z direction as in the topology T2. In this case, it is assumed that n PEs determined to be "used for analysis" in step S104 are specifically a total of (ny×nz) PEs, with ny PEs aligned in the Y direction and nz PEs aligned in the Z direction. That is, it is assumed that n=ny×nz in this case. Meanwhile, ny is an integer being equal to or larger than 1 and equal to or smaller than n, and nz is also an integer being equal to or larger than 1 and equal to or smaller than n. When the PEs 140-1 through 140-P are connected as in the topology T1, ny=1.

Hereinafter, for the convenience of explanation, in the PE(1)-PE(n), the ny PEs connected in the Y direction are also referred to as "a column of PEs". In addition, the in the PE(1)-PE(n), the nz PEs connected in the Z direction are also referred to as "a row of PEs".

In step S111 of FIG. 5, the host terminal 150 focuses on a certain row of PEs that includes a PE in charge of the output area, from among the n PEs. Then, in the focused row, the host terminal 150 increases the number of the PEs to be in charge of output by one in the positive direction of the Z axis or in the negative direction of the Z axis. Then, in step S112, the host terminal 150 changes the assignment of cells among the nz PEs in the row focused in step S111. Furthermore, when ny>1, the host terminal 150 changes the assignment in the remaining rows in the similar manner.

Figure 13:
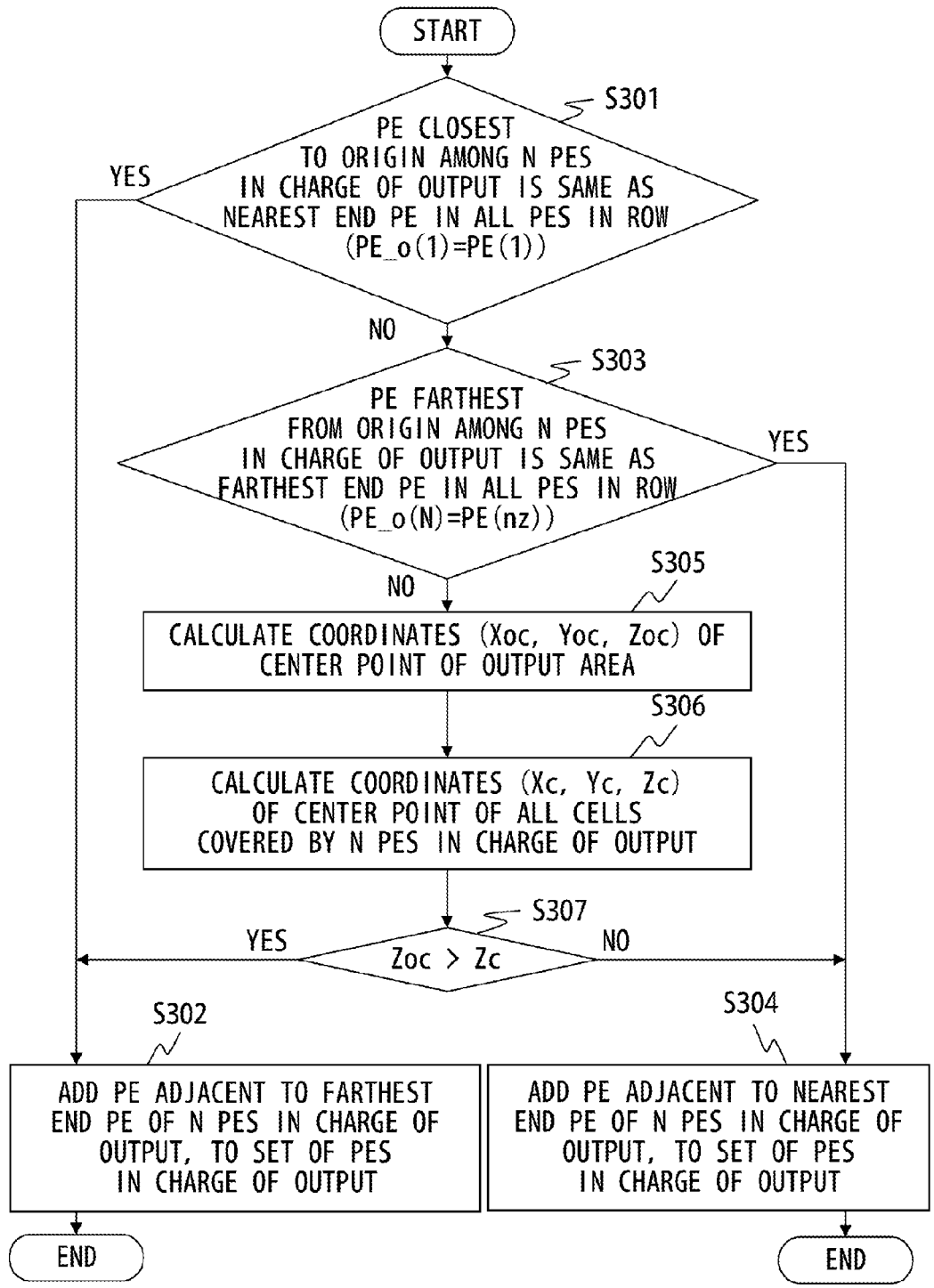
FIG. 13 is a flowchart of the process to increase PEs to be in charge of output.

Hereinafter, referring to FIGS. 12-13, step S111 is explained in greater details. FIG. 12 is a diagram illustrating a process to increase PEs that are to be in charge of output, in the nz the PEs of a certain row. In addition, FIG. 13 is a flowchart for the process illustrated in FIG. 12.

FIG. 12 illustrates three examples E3-E5 in which the host terminal 150 focuses on the PE(1)-PE(nz) in the PE(1)-PE(n).

In FIG. 12, the small rectangular represents the individual cell. In addition, a plurality of cells assigned to each PE are enclosed by a thick line. The cells belonging to the output areas A4-A6 are indicated by a halftone dot pattern.

As illustrated in FIG. 12, PE(1) is a PE to which the cells closest to the origin in the z direction in the analysis target area are assigned. On the other hand, PE(nz) is a PE to which the cells farthest from the origin in the z direction in the analysis target area are assigned.

In addition, hereinafter, for the convenience of explanation, in the nz PEs on which the host terminal 150 focuses in step S111, the number of PEs that are in charge of output is assumed as N ($1 \leq N < nz$). Then, the N PEs are also described as "PE_o(1)-PE_o(N)".

Meanwhile, as illustrated in FIG. 12, let PE_o(1) be the PE to which the cells closest to the origin in the Z direction in the output area are assigned. On the other hand, let PE_o(N) be the PE to which the cells farthest from the origin in the Z direction in the output area are assigned.

When PE_o(1)=PE(1) as in example E3, the host terminal 150 adds the PE adjacent to the PE_o(N) in the positive direction of the Z axis to the set of PEs that are in charge of output. The PE added in this way is indicated as the "PE_o (N+1)" in example E3.

When PE_o(N)=PE(nz) as in example E4, the host terminal 150 adds the PE adjacent to the PE_o(1) in the negative direction of the Z axis to the set of PEs that are in charge of output. In this case, the previous PE_o(k) is the new PE_o(k+1) ($1 \leq k \leq N$). In addition, the PE newly added to the set of PEs that are in charge of output is the new PE_o(1).

There may be a case, as in example E5, where PE_o(1)≠PE (1) and PE_o(N)≠PE(nz). In this case, the host terminal 150 may add the PE adjacent to the PE_o(N) in the positive direction of the Z axis to the set of PEs that are in charge of output, or, may add the PE adjacent to the PE_o(1) in the negative direction of the Z axis to the set of PEs that are in charge of output. For assignment with a better balance, it is preferable that the host terminal 150 decides the PE to add to the set of PEs that are in charge of output based on the following two ranges R1 and R2.

The range R1 in the Z direction of the cells tentatively assigned to PE_o(1)-PE_o(N).

The range R2 in the Z direction of the output area A6

More specifically, the host terminal 150 calculates the Z coordinate (hereinafter, described as "Zoc") of the center point of the cells tentatively assigned to the PE_o(1)-PE_o (N). In addition, the host terminal 150 calculates the Z direction (hereinafter, described as "Zc") of the center point of the output area A6. The coordinates Zoc and Zc are grid coordinates expressed in units of cells.

Then, when Zoc>Zc as in example E5, the host terminal 150 adds the PE adjacent to the PE_o(N) in the positive direction of the Z axis to the set of PEs that are in charge of output. The PE added in this way is indicated as "PE_o(N+1)" in example E5.

On the other hand, when Zoc≤Zc, the host terminal 150 adds the PE adjacent to the PE_o(1) in the negative direction of the Z axis to the set of PEs that are in charge of output. In this case, the previous PE_o(k) is the new PE_o(k+1) ($1 \leq k \leq N$). In addition, the PE added newly to the set of PEs that are in charge of output is the new PE_o(1).

The process explained with reference to FIG. 12 above is performed, specifically, according to the flowchart in FIG. 13.

In step S301, the host terminal 150 judges whether or not the following two are the same.

The nearest end PE (that is, the PE_o(1)) closest to the origin among the N PEs (that is, the PE_o(1)-PE_o(N)) that are in charge of output in the row on which the host terminal 150 focuses.

The nearest end PE among the total of nz PEs in the row on which the host terminal 150 focuses (for example, the PE(1) in the case where the host terminal 150 focuses on the row of PE(1)-PE(nz)).

When the two are the same (for example, the case such as in example E3 in FIG. 12), the host terminal 150 executes step S302 next. On the other hand, when the two are different PEs, the host terminal 150 executes step S303 next.

In step S302, the host terminal 150 adds the PE that is adjacent in the positive direction of the Z axis to the farthest end PE (that is, PE_o(N)) of the N PEs that are in charge of output in the row on which the host terminal 150 focuses on, to the set of PEs in charge of output. The PE added in this way is indicated as "PE_o(N+1)" in examples E3 and E5 in FIG. 12. When the execution of step S302 is completed, the process in FIG. 13 is also completed.

In step S303, the host terminal 150 judges whether or not the following two are the same.

The farthest end PE (that is, PE_o(N)) that is farthest from the origin among the N PEs (that is, the PE_o(1)-PE_o(N)) that are in charge of output in the row on which the host terminal 150 focuses The farthest end PE among the total of nz PEs in the row on which the host terminal 150 focuses (for example, the PE(nz) in the case where the host terminal 150 focuses on the row of the PE(1)-PE(nz))

When the two are the same (for example, the case such as example E4 in FIG. 12), the host terminal 150 executes step S304 next. On the other hand, when the two are different PEs, the host terminal 150 executes step S305 next.

In step S304, the host terminal 150 adds the PE adjacent to the nearest end PE (that is, PE_o(1)) in the N PEs that are in charge of output in the row on which the host terminal 150 focus in the negative direction of the Z axis to the set of PEs that are in charge of output. As illustrated in example E4 in FIG. 12, the previous PE_o(k) is the new PE_o(k+1) ($1 \leq k \leq N$). In addition, the PE newly added to the set of PEs that are in charge of output is the new PE_o(1). When the execution of step S304 is completed, the process in FIG. 13 is also completed.

In step S305, the host terminal 150 calculates the coordinates (Xoc,Yoc,Zoc) of the center point of the output area. Here, the grid coordinates of the nearest end of the output area are assumed as (Xos,Yos,Zos), and the grid coordinates of the farthest end of the output area are assumed as (Xoe,Yoe,Zoe). In step S305, the host terminal 150 calculates, specifically, the coordinates (Xoc,Yoc,Zoc) of the center point of the output area according to the following expressions (23)-(25).

$$Xoc=(Xos+Xoe)/2 \quad (23)$$

$$Yoc=(Yos+Yoe)/2 \quad (24)$$

$$Zoc=(Zos+Zoe)/2 \quad (25)$$

Next, in step S306, the host terminal 150 calculates the coordinates (Xc,Yc,Zc) of the center point of all the cells covered by the N PEs (that is, the PE_o(1)-PE_o(N)) that are in charge of output in the row on which the host terminal 150 focuses. Meanwhile, assuming that a certain h exits, and PE(h+k)=PE_o(k) for each k where $1 \leq k \leq N$, using the description used in the expression (19) and the expression (20), the coordinates (Xc,Yc,Zc) are expressed as in the expressions (26)-(28).

$$Xc=(Xs(h+1)+Xe(h+N))/2 \quad (26)$$

$$Yc=(Ys(h+1)+Ye(h+N))/2 \quad (27)$$

$$Zc=(Zs(h+1)+Ze(h+N))/2 \quad (28)$$

Next, in step S307, the host terminal 150 judges whether or not Zoc is larger than Zc. When Zoc>Zc (for example, the case such as example E5 in FIG. 12), the host terminal 150 executes step S302 next. On the other hand, when ZocZc, the host terminal 150 executes step S304 next.

Meanwhile, the process in FIG. 13 is a process regarding the adjustment of the assignment in the Z direction. Therefore, in steps S305 and S306, the calculation of the X coordinate and the Y coordinate may be omitted.

For example, it is assumed that the initial assignment in step S104 in FIG. 5 is as in FIG. 8 and the host terminal 150 focuses on the row of the PE(1)-PE(5) in the PE(1)-PE(25) in step S111. This case is as follows.

ny=5
nz=5
N=1
PE_o(1)=PE_o(N)=PE(2)
Zoc=(5+8)/2=6.5
Zo=(4+8)/2=6

Therefore, steps S301, S303, S305, S306, S307, S302 are executed in this order, and the PE(3) is added to the set of PEs that are in charge of output.

Figure 14:
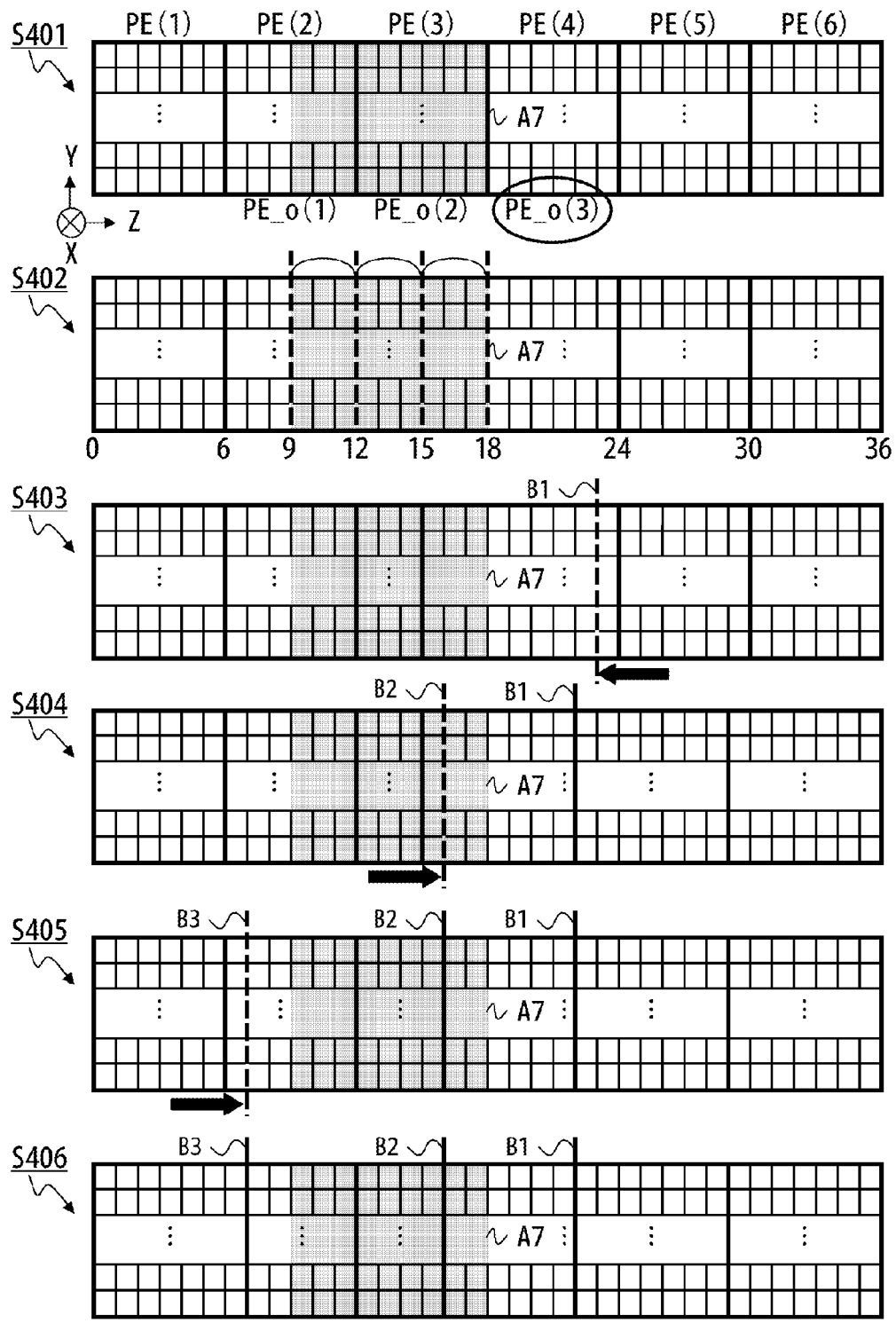
FIG. 14 is a diagram illustrating an outline of a reassigning process.

Next, with reference to FIGS. 14-18, step S112 in FIG. 5 is explained in greater detail. FIG. 14 is a diagram explaining the outline of the reassigning process in which the host terminal 150 changes the assignment in the nz PEs of the row on which the host terminal 150 focuses on step S111. To facilitate understanding, in FIG. 14, the reassigning process in a specific case as follows is illustrated.

The range in the Z direction in the analysis target area (more specifically, the range expressed by the grid coordinates) is expressed as follows: $0 \leq Z \leq 36$ The range in the Z direction of the output area A7 (more specifically, the range expressed by the grid coordinates) is expressed as follows: $9 \leq Z \leq 18$.

nz=6.

The row of the PE(1)-PE(6) is focused on in step S111.

According to the current tentative assignment, to all of the PE(1)-PE(6), six cells are assigned in the Z direction.

Therefore, N=2 and PE_o(1)=PE(2) and PE_o(2)=PE(3).

In such a case as described above, when step S111 in FIG. 5 (the process in FIG. 13) is executed, the PE(4) is added to the set of PEs that are in charge of output. This is because, since Zoc>Zc as described below, step S302 is executed.

$$Zoc=(9+18)/2=13.5$$

$$Zc=(6+18)/2=12$$

The step S401 in FIG. 14 represents the step in which the PE(4) described above is newly added to the set of PEs that are in charge of output as the PE_o(3).

Next, in step S402, the host terminal 150 assigns the range of the output area A7 in the Z direction equally to the (N+1) PEs that are in charge of output. In the example in FIG. 14, nine cells are included in the Z direction of the output area A7, and (N+1)=3. Therefore, the host terminal 150 tentatively assigns 3 (=9/3) cells in the Z direction to each of the PE_o(1)-PE_o(3). Meanwhile, when the number of cells of the output area A7 in the Z direction is not divisible by (N+1), the host terminal 150 appropriately performs fraction processing.

Meanwhile, in step S402, the assignment of the cells that do not belong to the output area A7, is not changed. For example, the cells belonging to the range of $6 \leq Z \leq 9$ remains tentatively assigned to PE_o(1) (that is, PE(2)). In the similar manner, the cells belonging to the range of $18 \leq Z \leq 24$ remains tentatively assigned to PE_o(3) (that is, PE(4)).

Next, in step S403, the host terminal 150 adjusts a boundary B1 between the following two cells.

The set of cells assigned to the newly added PE (that is, PE_o(3)) to the set of PEs that are in charge of output The set of cells assigned to PEs not in charge of output, that are in the direction moving away from the origin, viewed from the newly added PE In the example in FIG. 14, the Z coordinate of the boundary B1 immediately before the execution of step S403 is 24. In step S403, the host terminal 150 looks for a position of the boundary B1 that satisfies both of the following two conditions, while shifting the boundary B1 in the negative direction of the Z axis.

The first condition is a condition that "the total processing time T (4) of the PE_o(3) (that is, PE(4)) is smaller than the first threshold".

Meanwhile, it is assumed that the host terminal 150 equally assigns cells outside the output area A7 that exist beyond the output area A7 viewed from the origin to all the PEs (that is, the PE(5) and PE(6)) that are not in charge of output. The second condition is a condition that "the average value of the total processing time of these PEs to which cells are assigned equally in this way is smaller than the second threshold".

Hereinafter, the first threshold is described as "U1", and the second threshold is described as "U2". The thresholds U1 and U2 may be equal to each other, or may be different.

For example, the product of the average value of the total processing times estimated in step S107 regarding the n PEs used for analysis and an appropriate constant may be used as the threshold U1. The similar applies to the threshold U2. In addition, the "appropriate constant" mentioned above is a value that is larger than 1 but is not too large. For example, a value around 1.1 to 1.3 may be used as the "appropriate constant value" mentioned above.

In the example in FIG. 14, the Z coordinate (more specifically, the grid coordinate) of the boundary B1 at the stage of step S402 is 24. Therefore, the host terminal 150 checks whether or not the two conditions are both satisfied, while reducing the Z coordinate of the boundary B1 by 1. Then, when the position of the boundary B1 that satisfies the two conditions at the same time, the host terminal 150 fixes the boundary B1.

When the two conditions are not satisfied at the same time, the host terminal 150 performs the adjustment in step S404. Specifically, the host terminal 150 fixes the boundary B1 on the Z coordinate that is closest to the origin under the second condition being satisfied. Then, the host terminal 150 adjusts the boundary B2 between the following two sets of cells so that the first condition is satisfied.

The set of cells assigned to the PE_o(3)

The set of cells assigned to the PE (that is, the PE_o(2)) adjacent to the PE_o(3) added newly this time, in the PEs that are in charge of output Meanwhile, the adjustment in step S404 is, specifically, an adjustment by moving the boundary B2 in the positive direction of the Z axis by one cell. In the example in FIG. 14, the Z coordinate of the boundary B2 immediately before the execution of the adjustment in step S404 is 15.

After that, the host terminal 150 performs a similar adjustment to step S403-S404 for the PE_o(1) that is in charge of the nearest end cell of the output area A7. The adjustment in step S405 is a symmetrical adjustment to the adjustment in step S403-S404.

In other words, instead of the adjustment as in step S403 to move the boundary B1 in the negative direction of the Z axis, in step S405, an adjustment to move the boundary in the positive direction of the Z axis is performed. Meanwhile, instead of the adjustment as in step S404 to move the boundary B2 in the positive direction of the Z axis, in step S405, an adjustment to move the boundary in the negative direction of the Z axis is performed.

FIG. 14 illustrates the adjustment to move the boundary B3 between the set of cells assigned to the PE_o(1) (that is, PE(2)) and the set of cells assigned to the PE(1) in the positive direction of the Z axis (that is, the adjustment similar to step S403). In the similar manner as step S404 being executed when both of the two conditions described above are not satisfied at the same time, when the following two conditions are not satisfied at the same time, in step S405, an adjustment symmetrical to step S404 that is not illustrated in the drawing is performed.

The total processing time T(2) of the PE_o(1) (that is, PE(2)) is smaller than the threshold U1.

When cells outside the output area A7 that are closer to the output area A7 viewed from the origin are assigned equally to all the PEs that are not in charge of output and are placed near the origin viewed from PE_o(1), the average value of the total processing times of all the PEs mentioned above to which the cells are equally assigned is smaller than the threshold U2.

Lastly, in step S406, the host terminal 150 assigns the cells in the remaining area that is not assigned to the PE_o(1) and the PE_o(N+1) in the area of the Z direction of the output area A7 equally to the PE_o(2)-PE_o(N). In the example of FIG. 14, N=2, therefore, the cells in the remaining area are all assigned to the PE_o(2) (that is, PE(3)).

That is, according to the reassignment in FIG. 14, the tentative assignment changes as follows. The following change is a change that increases the uniformity in the total processing times among PEs.

The range of the cells assigned to the PE(1) that is not in charge of output is expanded from $0 \leq Z \leq 6$ to $0 \leq Z \leq 7$.

The range of the cells assigned to the PE(2) that is in charge of output is reduced from $6 \leq Z \leq 12$ to $7 \leq Z \leq 12$.

In the similar manner, the range of the cells assigned to the PE(3) that is in charge of output, is reduced from $12 \leq Z \leq 18$ to $12 \leq z \leq 16$.

The range of the cells assigned to the PE(4) that is newly decided to be in charge of output is changed from $18 \leq Z \leq 24$ to $16 \leq z \leq 22$.

The range of the cells assigned to the PE(5) that is not in charge of output is changed from $24 \leq Z \leq 30$ to $22 \leq Z \leq 29$ (that is, the range is expanded).

The range of the cells assigned to the PE(6) that is not in charge of output is expanded from $30 \leq Z \leq 36$ to $29 \leq Z \leq 36$.

Next, the above process explained with reference to FIG. 14 is explained in greater details by referring to flowcharts in FIGS. 15-18. In the process in FIG. 13 corresponding to step S111 in FIG. 5, when the addition of a new PE to the set of PEs that are in charge of output is performed in step S302, the reassignment in step S112 is performed according to the flowchart in FIGS. 15-16. On the other hand, when the addition of a new PE to the set of PEs that are in charge of output is performed in step S304, the reassignment in step S112 is performed according to the flowchart in FIGS. 17-18.

Figure 16:
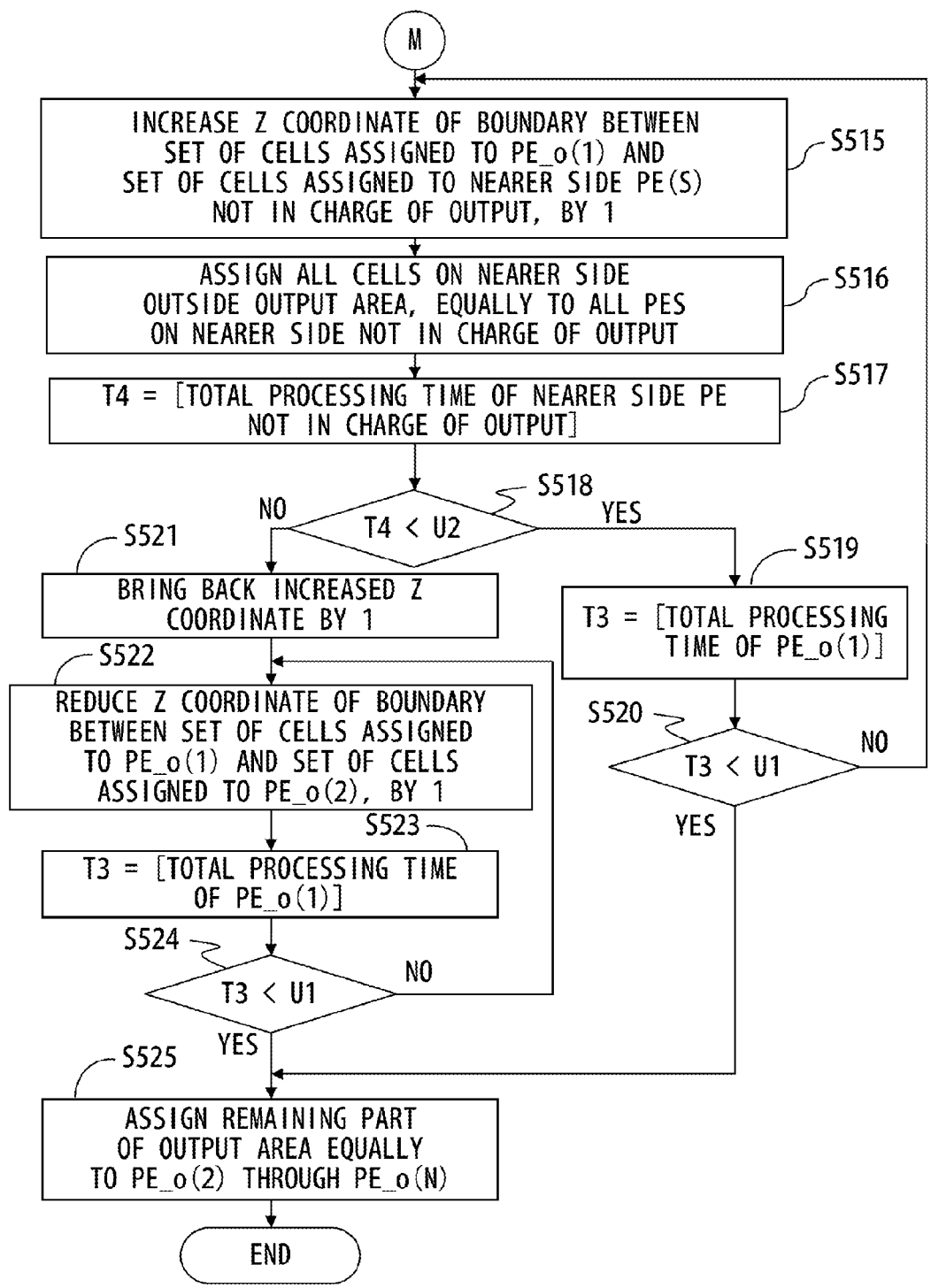
Figure 18:
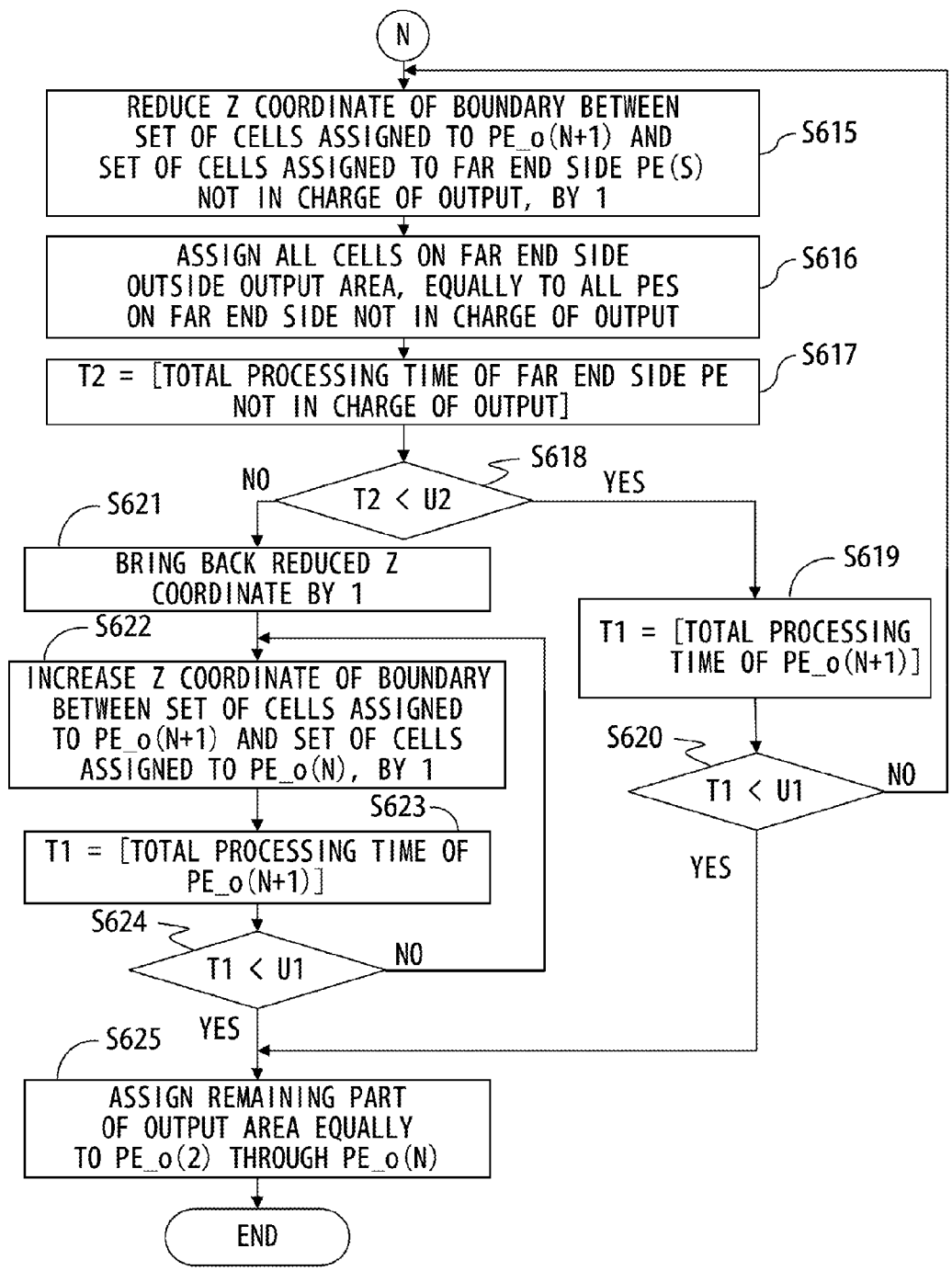

The flowchart in FIGS. 15-16 and the flowchart in FIGS. 17-18 are symmetrical with respect to "the positive direction or the negative direction of the Z axis". Meanwhile, as explained with respect to step S112, the host terminal 150 focuses on, in the n(=ny×nz) PEs, the nz PEs of a certain row, and performs the reassignment in those nz PEs. Then, when ny>1, the host terminal 150 changes the assignment of the remaining rows in the similar manner. In the following explanation regarding FIGS. 15-18, for the sake of convenience, it is assumed that the host terminal 150 has focused on the row of the PE(1)-PE(nz).

Now, in step S501 in FIG. 15, the host terminal 150 assigns the range (for example, in the example of FIG. 8, $5 \leq Z \leq 8$, and in the example of FIG. 14, $9 \leq Z \leq 18$) of the Z direction of the output area equally to the PE_o(1)-PE_o(N+1). Step S501 corresponds to step S402 in FIG. 14. As explained regarding step S402, in step S501, the assignment of the cells that do not belong to the output area is not changed.

Meanwhile, when the number of cells along the Z direction of the output area is not divisible by (N+1), the host terminal 150 performs appropriately fraction processing. Hereinafter, while not explicitly described, a certain fraction processing may be performed also in other steps (for example, step S504, S514, S516, S525 and the like) in some cases.

Next, in step S502, the host terminal 150 makes a judgment regarding the PE_o(N+1) added to the set of PEs that are in charge of output in step S302 in FIG. 13. Specifically, the host terminal 150 judges whether or not the PE_o(N+1) is PE(nz).

When the PE_o(N+1) is not the PE(nz), there is a room for adjusting the upper limit of the Z coordinate, regarding the range in the Z direction of cells assigned to the PE_o(N+1). For example, in FIG. 14, the PE_o(N+1) (that is, PE_o(3)) is not the PE(nz) (that is, PE(6)). Therefore, in FIG. 14, regarding the range in the Z direction of the cells assigned to the PE_o(3), there is a room for adjusting the upper limit of the Z coordinate (that is, the Z coordinate of the boundary B1). Therefore, when the PE_o(N+1) is not the PE(nz), the host terminal 150 executes step S503 next.

On the other hand, when the PE_o(N+1) is the PE(nz), regarding the range in the Z direction of the cells assigned to the PE_o(N+1), there is no room for adjusting the upper limit of the Z coordinate. Therefore, in this case, the host terminal 150 executes step S511 next, to decide whether or not to adjust the lower limit of the Z coordinate.

Now, the loop of step S503-S508 corresponds to step S403 in FIG. 14. In addition, the loop of step S509 and step S510-S512 corresponds to step S404.

Meanwhile, hereinafter, for the convenience of explanation, a PE that is closer, in the Z direction of the topology of PEs, to the origin than the PE_o(1) is (for example, PE(1) in FIG. 14 and the like) is referred to as a "PE on the near side that is not in charge of output", a "nearer side PE not in charge of output", or the like. On the other hand, a PE that is farther, in the Z direction of the topology of PEs, from the origin than the PE_o(N+1) is (for example, the PE(5) and the PE(6) in FIG. 14) is referred to as a "PE on the far side that is not in charge of output", a "far end side PE not in charge of output", or the like.

Meanwhile, cells on closer positions to the origin in the Z direction than the output area (for example, cells whose farthest end Z coordinate is 9 or smaller in FIG. 14) are referred to as "cells on the nearer side outside the output area". On the other hand, cells on farther positions from the origin in the Z direction than the output area (for example, cells whose nearest end Z coordinate is 18 or larger in FIG. 14) are referred to as "cells on the far end side outside the output area".

Specifically, in step S503, the host terminal 150 reduces the Z coordinate of the boundary between the set of the cells assigned to the PE_o(N+1) and the set of cells assigned to the PE(s) on the far end side that is/are not in charge of output, by 1. Step S503 corresponds to moving the boundary B1 in the leftward direction just by one cell in step S403 in FIG. 14.

Next, in step S504, the host terminal 150 assigns all the cells on the far end side outside the output area equally to all the PEs on the far end side that are not in charge of output. That is, the host terminal 150 assigns the cells included in the range, in the Z direction, from the Z coordinate of the boundary updated in step S503 to the upper limit of the Z coordinate of the analysis target area, equally to all the PEs on the far end side that are not in charge of output. Meanwhile, when step S504 is executed, the number of PEs on the far end side that are not in charge of output is or larger (because PE_o(N+1) ≠PE(nz) has already been confirmed in step S502).

Next, in step S505, the host terminal 150 calculates the total processing time (hereinafter, "T2") of the PEs on the far end side that are not in charge of output, based on the tentative assignment in step S504.

By the way, as described above, the number of PEs on the far end side that are not in charge of output is 1 or larger. The host terminal 150 may calculate the total processing time regarding any one of these PEs, and may use the calculation result as the total processing time T2.

Alternatively, the host terminal 150 may separately calculate the total processing time for every PE on the far end side that is not in charge of output, and may use the average value of the calculated total processing times as the total processing time T2.

As described above, the assignment in step S504 is equal assignment (in other words, uniform assignment) with respect to the number of cells. Therefore, when the influence of the fraction regarding the number of cells in the Z direction, and the influence from factors other than the number of cells are small, the host terminal 150 may use the total processing time of any one of the PEs on the far end side that are not in charge of output, as the total processing time T2.

On the other hand, in order to take the dispersion of the total processing times due to various influences as described below into consideration, the host terminal 150 may use the average value of the total processing times of the all the PEs on the far end side that are not in charge of output as the total processing time T2.

The influence of the fraction regarding the number of cells in the Z direction

The influence from whether or not there is a cell on which the wave source or the circuit element exists The influence from whether or not there is a cell in contact with the boundary between media or the absorbing boundary Meanwhile, the specific method by which the host terminal 150 calculates the total processing time regarding the individual PE in step S505 is similar to the method by which the control device 120 estimates the processing time of each PE in step S107 in FIG. 5. In addition, in steps such as S507, S511, S517, S519, S523 discussed later also, the host terminal 150 calculates the total processing time by a similar method to step S107.

Now, next, in step S506, the host terminal 150 compares the total processing time T2 with the threshold U2 explained regarding step S403 in FIG. 14.

When T2<U2, the second condition explained regarding step S403 is satisfied. Therefore, when T2<U2, in order to further check "whether or not the first condition is satisfied", the host terminal 150 executes step S507 next. On the other hand, when T2≥U2, the host terminal 150 executes step S509 next.

In step S507, the host terminal 150 calculates the total processing time (hereinafter, "T1") of the PE_o(N+1). The calculation of the total processing time T1 in step S507 is based on the assignment in step S501 and the boundary moved in step S503. That is, the total processing time T1 is calculated based on the change of the range of the cells assigned to the PE_o(N+1).

Next, in step S508, the host terminal 150 compares the total processing time T1 with the threshold U1 explained regarding step 403 in FIG. 14.

When T1<U1, the first condition explained regarding step S403 is also satisfied. Therefore, when T1<U1, the adjustment such as step S404 in FIG. 14 is omitted. Specifically, when T1<U1, the host terminal executes step S513 next.

On the other hand, when T1≥U1, the host terminal 150 executes step S503 again. That is, in some cases, the series of processes in steps S503-S508 are executed repeatedly twice or more. Then, by such repetition, the Z coordinate of the boundary between the set of the cells assigned to the PE_o(N+1) and the set of the cells assigned to the PE(s) on the far end side that is/are not in charge of output is reduced gradually.

Here, the reduction of the Z coordinate of the boundary means to reduce the number of cells assigned to the PE_o(N+1), and instead, to increase the number of cells assigned to the PE(s) on the far end side that is/are not in charge of output. Such shift of the boundary is performed in order to keep the total processing time of the PE_o(N+1) smaller than the threshold U1.

However, in some cases, there is a possibility that, before the total processing time of the PE_o(N+1) is reduced to be smaller than the threshold U1, the total processing time T2 of the PE on the far end side that is not in charge of output becomes equal to or larger than the threshold U2. That is, there is a possibility that, due to the host terminal 150 assigning too many cells to the PE on the far end side that is not in charge of output, the total processing time T2 becomes too long. In this case, it is determined as T2≥U2 in step S506.

That is, the case "when the two conditions are not satisfied same time" is, specifically, the case when it is determined as T2≥U2 in step S506.

As explained regarding step S404 in FIG. 14, when the two conditions are not satisfied at the same time, the host terminal 150 operates as follows.

The boundary on the far end side of the set of cells assigned to the PE_o(N+1) is fixed on the Z coordinate closest to the origin under the second condition being satisfied.

The boundary of the nearer side of the set of cells assigned to the PE_o(N+1) is adjusted, so that the first condition is satisfied.

The adjustment in step S404 in FIG. 14 corresponds to steps S509-S512 in FIG. 15.

Specifically, first, in step S509, the host terminal 150 brings back the Z coordinate reduced in the nearest step S503, by 1. That is, the host terminal 150 increases the Z coordinate of the boundary between the set of the cells assigned to the PE_o(N+1) and the set of the cells assigned to the far end side PE(s) that is/are not in charge of output, by 1. For example, as long as the threshold U2 is appropriately determined by the way as illustrated regarding FIG. 14, the second condition is satisfied again by the execution of step S509.

In addition, as a result of step S509, the boundary between the set of the cells assigned to the PE_o(N+1) and the set of the cells assigned to the far end side PE(s) that/are is not in charge of output is fixed. Meanwhile, it is to be noted that the term "fix" here means fixing the boundary merely in the reassigning process in FIGS. 15-16, and that the reassignment by the process in FIGS. 15-16 itself is still tentative.

Next, in step S510, the host terminal 150 increases the z coordinate of the boundary between the set of the cells assigned to the PE_o(N+1) and the set of the cells assigned to the PE_o(N), by 1. For example, the shift of the boundary B2 in step S404 in FIG. 14 corresponds to step S510.

Next, in step S511, the host terminal 150 calculates the total processing time T1 of the PE_o(N+1). In step S511, the total processing time T1 is calculated based on the boundary on the far end side fixed in step S509 and the boundary on the nearer side changed in step S510 (that is, based on the change of the range of the cells assigned to PE_o(N+1)).

Then, in step S512, the host terminal 150 compares the total processing time with the threshold U1.

When T1<U1, the first condition explained regarding step S403 is also satisfied. Therefore, when T1<U1, to check whether the adjustment as step S405 in FIG. 14 is applicable, the host terminal 150 executes step S513 next.

On the other hand, when T1≥U1, the host terminal 150 executes step S510 again. That is, in some cases, the series of processes in step S510-S512 are executed repeatedly twice or more. By such repetition, the number of the cells assigned to the PE_o(N+1) is reduced gradually. For example, as long as the threshold U1 is determined appropriately by the way as illustrated regarding FIG. 14, it is determined as T1<U1 in step S512 eventually, as the number of the cells decreases.

Meanwhile, as described regarding step S502, when the PE_o(N+1) is the PE(nz), step S511 is also executed, and step S512 is executed next. In this case, when the total processing time T1 is smaller than the threshold U1, there is no need to adjust the number of the cells assigned to the PE_o(N+1). Therefore, when T1<U1, the host terminal 150 executes step S513 next. On the other hand, when T1≥U1, by the execution of step S510, the number of cells assigned to the PE_o(N+1) is reduced.

Now, in step S513, the host terminal 150 judges whether or not the PE_o(1) is the PE(1). When the PE_o(1) is the PE(1), the host terminal 150 executes step S514. On the other hand, when the PE_o(1) is not the PE(1), the adjustment as step S405 in FIG. 14 is applicable, and the host terminal 150 executes step S515 in FIG. 16.

In step S514, the host terminal 150 assigns the remaining part of the output area equally to the PE_o(1)-PE_o(N). Here, "the remaining part of the output area" is the area spanning from the nearest end in the Z direction of the output area to the nearest end in the Z direction of the set of the cells that are assigned to the PE_o(N+1) at the point in time when step S514 is executed.

Meanwhile, when step S514 is executed, the PE_o(1) is the PE(1). Therefore, when one or more cells exist on the nearer side outside the output area, the one or more cells are assigned to the PE_o(1). In this case, as a result of the execution of step S514, the one or more cells on the nearer side outside the output area mentioned above, and one or more cells in the output area determined by the equal assignment in step S514 are assigned to the PE_o(1).

When the assignment in step S514 is completed, the reassigning process in FIGS. 15-16 is also completed.

Now, steps S515-S524 in FIG. 16 correspond to step S405 in FIG. 14, step S525 corresponds to step S406 and steps S515-S524 are symmetrical processes to step S503-S512.

Therefore, hereinafter, detail explanation about the meaning of steps S515-S524 is omitted.

In step S515, the host terminal 150 increases the Z coordinate of the boundary between the set of the cells assigned to the PE_o(1) and the set of the cells assigned to the nearer side PE(s) that is/are not in charge of output, by one. Next, in step S516, the host terminal 150 assigns all the cells on the nearer side outside the output area equally to all the PEs on the nearer side that are not in charge of output.

Then, in step S517, the host terminal 150 calculates the total processing time (hereinafter, "T4") of the PEs on the nearer side that are not in charge of output, based on the assignment in step S516. The host terminal 150 may use the total processing time of any one of PEs on the nearer side that are not in charge of output as the total processing time T4, or may use the average value of the total processing time of all the PEs on the nearer side that are not in charge of output as the total processing time T4.

Next, in step S518, the host terminal 150 compares the total processing time 14 with the threshold U2. When T4<U2, the host terminal 150 executes the step S519 next. On the other hand, when T4≥U2, the host terminal 150 executes step S521.

In step S519, the host terminal 150 calculates the total processing time (hereinafter, "T3") of the PE_o(1), based on the assignment in step S501 and the boundary shifted in step S515. Then, in step S520, the host terminal 150 compares the total processing time T3 and the threshold U1. When 13<U1, the host terminal 150 executes step S525 next. On the other hand, when T3≥U1, the host terminal 150 executes step S515 again.

Now, in step S521, the host terminal 150 brings back the Z coordinate increased in the latest step S515, by 1. That is, the host terminal 150 decreases the Z coordinate of the boundary between the set of the cells assigned to the PE_o(1) and the set of the cells assigned to the PE(s) on the nearer side that is/are not in charge of output, by 1.

Next, in step S522, the host terminal 150 reduces the Z coordinate of the boundary between the set of the cells assigned to the PE_o(1) and the set of the cells assigned to PE_o(2), by 1. Then, in step S523, the host terminal 150 calculates the total processing time T3 of the PE_o(1), based on the boundary of the nearer side fixed in step S521 and the boundary of the far end side changed in step S522.

Next, in step S524, the host terminal 150 compares the total processing time 13 with the threshold U1. When T3<U1, host terminal 150 executes step S525 next. On the other hand, when T3≥U1, the host terminal 150 executes step S522 next.

In step S525, the host terminal 150 assigns the remaining part of the output area equally to the PE_o(2)-PE_o(N). Here, "the remaining part of the output area" is the range spanning from the farthest end of the cells assigned to the PE_o(1) to the nearest end of the cells assigned to the PE_o(N+1). When the assignment in step S525 is completed, the reassigning process in FIGS. 15-16 is also completed.

Next, the flowchart in FIGS. 17-18 is explained. As described above, in the process in FIG. 13, the addition of a new PE to the set of PEs that are in charge of output is performed in step S304, the reassignment in step S112 in FIG. 5 is performed according to the flowchart in FIGS. 17-18. In addition, the flowchart in FIGS. 17-18 is symmetrical to the flowchart in FIGS. 15-16 with respect to "the positive direction or the negative direction of the Z axis". Therefore, the flowchart in FIGS. 17-18 is explained briefly.

The step S601 is the same as step S501.

Next, in step S602, the host terminal 150 judges whether or not the PE_o(1) is the PE(1). When the PE_o(1) is the PE(1), the host terminal 150 executes step S611 next. When the PE_o(1) is not the PE(1), the host terminal 150 executes step S603 next. The steps S603-S612 are the same as step S515-S524.

Upon judging as T3<U1 in step S608 or S612, the host terminal 150 executes step S613 next. Specifically, in step S613, the host terminal 150 judges whether or not the PE_o(N+1) is the PE(nz).

When the PE_o(N+1) is the PE(nz), the host terminal 150 executes step S614 next. On the other hand, when the PE_o(N+1) is not the PE(nz), the host terminal 150 executes step S615 in FIG. 18.

In step S614, the host terminal 150 assigns the remaining part of the output area equally to the PE_o(2)-PE_o(N+1). Here, "the remaining part of the output area" is the range from the farthest end in the Z direction of the set of the cells assigned to the PE_o(1) to the farthest end in the Z direction of the output area at the point of time when step S614 is executed. When the assignment in step S614 is completed, the reassigning process in FIGS. 17-18 is also completed.

Now, steps S615-S624 are the same as the step S503-S51. Upon judging T1<U1 in step S620 or S624, the host terminal 150 executes step S625 next. Step S625 is the same as step S525. When the assignment in step S625 is completed, the reassigning process in FIGS. 17-18 is also completed.

Now, FIG. 19 is a diagram illustrating an example of the eventual assignment according to the second embodiment. Specifically, FIG. 19 illustrates an example of the eventual assignment in a case in which the initial assignment as in FIG. 8 is performed in step S104. The analysis target area A1, the output area A2, and the object area A3 in FIG. 19 are the same as those in FIG. 8. In addition, FIG. 19 illustrates an example of a case in which only the change in the assignment in the Z axis direction is performed (that is, in which no change in the assignment in the Y direction is performed). The following holds true regarding each j where 0≤j≤4.

In FIG. 8, to the PE(5j+1), 16×XN cells with which grid coordinates (X,Y,Z) satisfy 0≤X≤XN and 4j≤Y≤4j+4 and 0≤Z≤4 are assigned. Meanwhile, in FIG. 19, to PE(5j+1), 20×XN cells with which grid coordinates (X,Y,Z) satisfy 0≤X≤XN and 4j≤Y≤4j+4 and 0≤Z≤5 are assigned.

In FIG. 8, to PE(5j+2), 16×XN cells with which grid coordinates (X, Y, Z) satisfy 0≤X≤XN and 4j≤Y≤4j+4 and 4≤Z≤8 are assigned. Meanwhile, in FIG. 19, to PE(5j+2), 8×XN cells with which grid coordinates (X, Y, Z) satisfy 0≤X≤XN and 4j≤Y≤4j+4 and 5≤Z≤7 are assigned.

In FIG. 8, to PE(5j+3), 16×XN cells with which grid coordinates (X,Y,Z) satisfy 0≤X≤XN and 4j≤Y≤4j+4 and 8≤Z≤12 are assigned. Meanwhile, in FIG. 19, to PE(5j+3), 12×XN cells with which grid coordinates (X,Y,Z) satisfy 0≤X≤XN and 4j≤Y≤4j+4 and 7≤Z≤10 are assigned.

In FIG. 8, to PE(5j+4), 16×XN cells with which grid coordinates (X,Y,Z) satisfy 0≤X≤XN and 4j≤Y≤4j+4 and 12≤Z≤16 are assigned. Meanwhile, in FIG. 19, to PE(5j+4), 20×XN cells with which grid coordinates (X,Y,Z) satisfy 0≤X≤XN and 4j≤Y≤4j+4 and 10≤Z≤15 are assigned.

In FIG. 8, to PE(5j+5), 16×XN cells with which grid coordinates (X,Y,Z) satisfy 0≤X≤XN and 4j≤Y≤4j+4 and 16≤Z≤20 are assigned. Meanwhile, in FIG. 19, to PE(5j+5), 20×XN with which grid coordinates (X,Y,Z) satisfy 0≤X≤XN and 4j≤Y≤4j+4 and 15≤Z≤20 are assigned.

As described above, according to the eventual assignment in FIG. 19, to the PE to which the cells included in the output area A2 are assigned, only a relatively small number 8×XN–12×XN of cells are assigned. Meanwhile, to the PE to which the cell included in the output area A2 are not assigned, a relatively large number 20×XN of cells are assigned. As a result, the uniformity in the total processing times among PEs as a whole is increased, and the unnecessary wait time is reduced. Therefore, the entire analysis becomes faster too.

Now, FIG. 20 is a diagram illustrating an effect of shortening the analysis time according to the second embodiment. In FIG. 20, example E6 of a case in which the initial assignment in FIG. 8 is eventually adopted, and example E7 of a case in which the assignment in FIG. 19 is adopted are compared. In the similar manner as in FIG. 2, in the FIG. 20, the part painted black represents the output process, and the part with the oblique line pattern represents the wait time. In addition, while FIGS. 8 and 19 illustrate the assignment of cells to the PE(1)-PE(25), FIG. 20 illustrates the breakdown of the total processing time only for the PE(1)-PE(5), due to space limitations.

In example E7, the time taken for the analysis with respect to one step time is L1 seconds. On the other hand, in example E6, the time taken for the analysis with respect to one step time is (L1+L2) seconds. That is, according to the second embodiment, the time L2 seconds per one step time is reduced.

Hereinafter, examples E6 and E7 are explained in greater details. FIG. 20 illustrates a case in which Cal (h,g) of the expression (9) is almost constant regardless of the position of the cells. In addition, the convenience of explanation, let the number XN of cells in the X direction explained regarding FIGS. 8 and 19 be 10.

In the assignment in FIG. 8, to all of the PE(1)-PE(5), 160(=10×4×4) cells are assigned. Therefore, in example E6, the PE(1)-PE(5) finish the calculation of the electric field approximately in the same time.

Meanwhile, in example E6, while the PE(2) is in charge of output of data of 120 (=10×4×3) cells, the PE(1) and the PE(3)-PE(5) are not in charge of output. Here, it is assumed that the output interval (see the expression (21)) is specified by a user. In addition, it is assumed that the output processing is spread over the time. Specifically, it is assumed that the PE(2) outputs data of 120/Intv cells for each process with respect to one step time. In example E6, the PE(2) outputs data of the electric field of 120/Intv cells after the calculation of the electric field, and outputs data of the magnetic field of the 120/Intv cells after the calculation of the magnetic field.

While the PE(2) outputs data of the electric field of the 120/Intv cells, the PE(1) and the PE(3)-PE(5) do nothing and just wait until the PE(2) to finish the output process. Then, when the PE(2) finishes outputting data of the electric field of the 120/Intv cells, each PE performs a process to transmit/receive data of the electric field.

Here, in the topology T2 in FIG. 4, there are up to four adjacent PEs for one PE. The PE may be configured to be able to communicate in parallel with the four adjacent PEs. In this case, the time taken for the PE to perform transmission/reception of data is the maximum value in the times taken for transmission/reception of data with the adjacent PEs.

According to FIG. 8, each of the PE(1)-PE(5) transmits data of 40(=10×4) cells to the adjacent PE in the Y direction, and to the adjacent PE in the Z direction, transmits data of 40(=10×4) cells. The similar applies to the reception. Therefore, in any of the PE(1)-PE(5), the time taken for transmission/reception of data of the electric field is the time taken to transmit/receive data of 40 cells.

In addition, after completion of data transmission/reception, each of the PE(1)-PE(5) calculates the magnetic field for each of the assigned 160 cells. In example E6, the PE(1)-PE(5) finish calculation of the magnetic field approximately in the same time.

After that, the PE(2) outputs data of the magnetic field of 120/Intv cells, but the PE(1) and the PE(3)-PE(5) does not do anything during the output process. Then, when the PE(2) finishes outputting data of the magnetic field of the 120/Intv cells, each PE performs a process to transmit/receive data of the magnetic data. The time taken for each PE to transmit/receive data of the magnetic field is similar to the time taken to transmit/receive data of the electric field.

Therefore, in example E6, per analysis with respect to one step time, an unnecessary waiting time corresponding to the time taken for the PE(2) to output data of 240/Into (=120/Intv+120/Intv) cells is generated for the other four PEs. On the other hand, example E7 is an example of the case in which the assignment as in FIG. 19 is decided eventually so as to let the uniformity in the total processing time be high. In example E7, the wait time is small, and therefore the time taken for the entire analysis is short.

Specifically, in the assignment in FIG. 19, to each of the PE(1) and PE(4) and PE(5), 200(=10×4×5) cells that do not belong to the output area are assigned. In addition, each of the PE(1) and PE(4) and PE(5) transmits data of 50(=10×5) cells to the adjacent PE in the Y direction, and receives data of 50 cells from the adjacent PE in the Y direction. Then, each of the PE(1) and PE(4) and PE(5) transmits data of 40(=10×4) cells to the adjacent PE in the Z direction, and receives data of 40 cells from the adjacent PE in the Z direction.

Therefore, in example E7, the time taken for each of the PE(1) and PE(4) and PE(5) to calculate the electric field is the time taken to calculate the electric field regarding 200 cells. In addition, the time taken for each of the PE(1) and PE(4) and PE(5) to transmit/receive data of the electric field is the time taken to transmit/receive data of 50 cells. This is because, max(50,40)=50.

In the similar manner, in example E7, the time taken for each of the PE(1) and PE(4) and PE(5) to calculate the magnetic field is the time taken to calculate the magnetic field for 200 cells. In addition, the time taken for each of the PE(1) and PE(4) and PE(5) to transmit/receive data of the magnetic field is the time taken to transmit/receive data of 50 cells.

On the other hand, in the assignment in FIG. 19, to the PE(2), 80 (=10×4×2) cells belonging to the output area are assigned. In addition, the PE(2) transmits data of 20(=10×2) cells to the adjacent PE in the Y direction, and receives data of 20 cells from the adjacent PE in the Y direction. Then, the PE(2) transmits data of 40(=10×4) cells to the adjacent PE in the Z direction, and receives data of 40 cells from the adjacent PE in the Z direction.

Therefore, in example E7, the time taken for the PE(2) to calculate the electric field is the time taken to calculate the electric field regarding 80 cells. In addition, the time taken for the PE(2) to transmit/receive data of the electric data is the time taken to transmit/receive data of 40 cells.

In the similar manner, in example E7, the time taken for the PE(2) to calculate the magnetic field is the time taken to calculate the magnetic field regarding 80 cells. In addition, the time taken for the PE(2) to transmit/receive data of the magnetic data is the time taken to transmit/receive data of 40 cells.

Meanwhile, in example E7, after calculating the electric field, the PE(2) outputs data of the electric field of 80/Intv cells. In the similar manner, after calculating the magnetic field, the PE(2) outputs data of the electric field of 80/Intv cells.

Now, in the assignment in FIG. 19, to the PE(3), 40 (=10×4×1) cells belonging to the output area and 80 (=10×4×2) cells that do not belong to the output area are assigned. In addition, the PE(3) transmits data of 30(=10×3) cells to the adjacent PE in the Y direction, and receives data of 30 cells from the adjacent PE in the Y direction. Then, the PE3 transmits data of 40 (=10×4) cells to the adjacent PE in the Z direction, and receives data of 40 cells from the adjacent PE in the Z direction.

Therefore, in example E7 the time taken for the PE(3) to calculate the electric field is the time taken to calculate the electric field regarding 120 (=40+80) cells. In addition, the time taken for the PE(3) to transmit/receive data of the electric field is the time taken to transmit/receive data of 40 cells.

In the similar manner, in example E7, the time taken for the PE(3) to calculate the magnetic field is the time taken to calculate the electric field regarding 120 cells. In addition, the time taken for the PE(3) to transmit/receive data of the magnetic field is the time taken to transmit/receive data of 40 cells.

Meanwhile, in example E7, after calculating the electric field, the PE(3) outputs data of the electric field of 40/Intv cells. In the similar manner, after calculating the magnetic field, the PE(3) outputs data of the electric field of 40/Intv cells.

In example E7, the time taken to calculate the electric field regarding 200 cells is a little longer than the sum of the time taken to calculate the electric field regarding 80 cells and the time taken to output data of the electric field of 80/Into cells. In addition, in example E7, the time taken to calculate the electric field regarding 200 cells is a little longer than the sum of the time taken to calculate the electric field regarding 120 cells and the time taken to output data of the electric field of 40/Intv cells. Therefore, in example E7, the PE(2) and PE(3) both wait, after finishing the output process, until the PE(1) and PE(4) and PE(5) finish the calculation of the electric field. However, this wait time is not so long. The similar applies to the calculation of the magnetic field and the output of data of the magnetic field.

In addition, the time taken for each of the PE(1) and PE(4) and PE(5) is the time taken to transmit/receive data of 50 cells. However, the time taken for each of the PE(2) and PE(3) is the time taken to transmit/receive data of 40 cells. Therefore, the PE(2) and PE(3) both wait, after finishing transmission/reception of data, until the PE(1) and PE(4) and PE(5) finish transmission/reception of data. However, this wait time is small.

Therefore, compared with example E6 in which four PEs are idle for a relatively long time, the resources of the PE(1)-PE(5) are used with a better efficiency in example E7 in which two PEs are idle only for a short time. As a result, in example E7, the analysis per one step time is finished in L1 seconds.

Next, the third embodiment is explained with reference to FIGS. 21-23. Meanwhile, for the common points with the second embodiment, explanation may be omitted. As described before, the third embodiment corresponds to the case in which "the second number" (of processing devices) is changed dynamically in step S2 in FIG. 1. That is, the third embodiment is preferable in a case in which there are extra available PEs.

Figure 21:
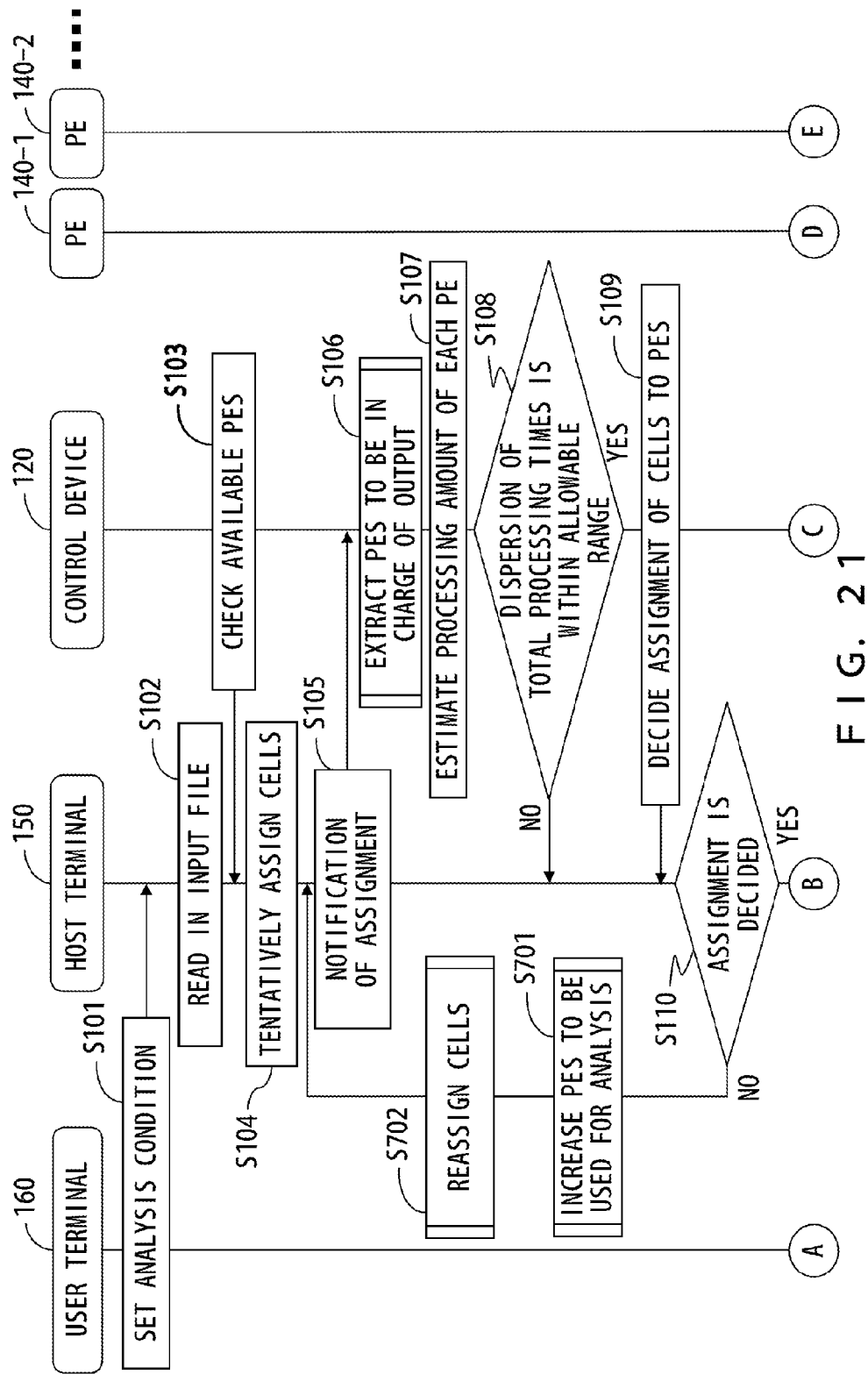
FIG. 21 is an operation sequence diagram of the third embodiment.

FIG. 21 is an operation sequence diagram of the system of the third embodiment. As is understood by comparing FIG. 21 with FIG. 5, in the third embodiment, the process in step S111 in the second embodiment is replaced with the process in step S701. In addition, in the third embodiment, the process in step S112 in the second embodiment is replaced with the process in step S702.

Meanwhile, in the second embodiment, the number n of the PEs to be used for analysis is decided in step S104 and fixed. However, in the third embodiment, the number n of the PEs to be used for analysis is decided only tentatively, and the number n may be increased later in step S701.

However, in the other points (the other steps in FIG. 21, and the steps in FIGS. 6-7), the third embodiment is similar to the second embodiment. Hereinafter, the differences over the second embodiment are explained.

In step S701, the host terminal 150 increases the number n of PEs to be used for analysis.

As described above, in step S111 of the second embodiment, the host terminal 150 focuses on the PEs of a certain row that include PEs in charge of the output area, from among the n PEs. In the similar manner, in step S701, the PEs of a certain row is focused.

Specifically, the host terminal 150 increases the number of columns of PEs from nz to (nz+M) based on imbalance in the total processing time among the nz PEs of the focused row. That is, the host terminal 150 increases, in step S701, the number of PEs to be used for analysis from n(=ny×nz) to ny×(nz+M). In step S701, the host terminal 150 may increase the PEs to be used for analysis, according to the flowchart in FIG. 22 discussed later for example.

Then, in step S702, the host terminal 150 executes reassignment of cells to the ny×(nz+M) PEs. More specifically, the host terminal 150 changes the assignment of cells to PEs in step S702 so that (N+M) PEs of the (nz+M) PEs in each row are in charge of the output process. That is, the host terminal 150 changes the assignment regarding a certain row, and then applies the changed assignment to the other rows. After the reassignment in step S702, the host terminal 150 executes step S105 again.

In the third embodiment, in the manner similar to that in the second embodiment, an appropriate assignment is found under the condition that the criterion in step S2 in FIG. 1 is met. This is because, after the dispersion of the total processing times being within the allowable range is confirmed in step S108, the assignment is eventually decided in step S109. Therefore, according to the third embodiment, the effect of making the analysis faster is obtained as well.

Figure 22:
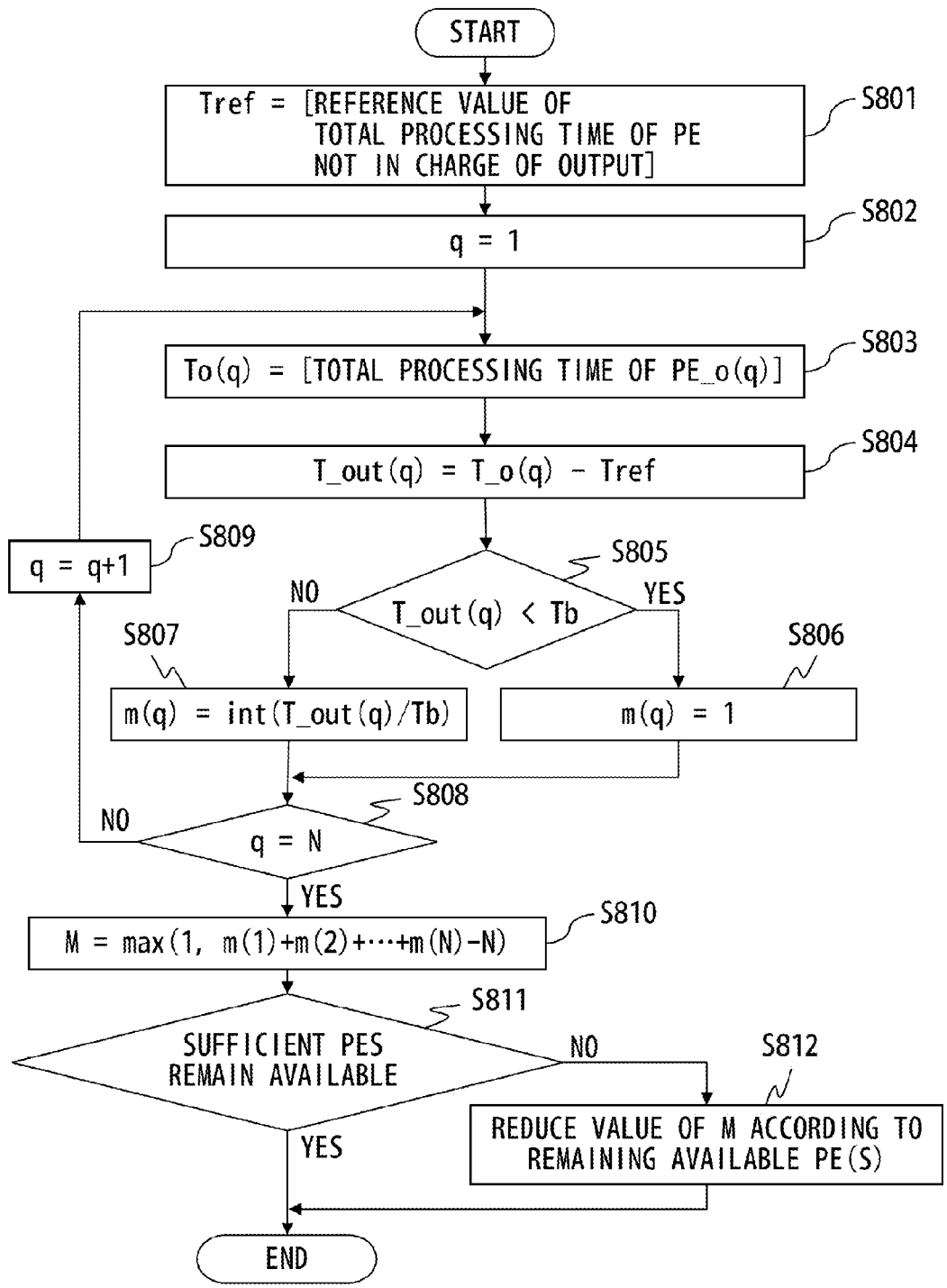
FIG. 22 is a flowchart of a process to increase the number of PEs used for analysis.

Now, FIG. 22 is a flowchart of the process to increase the number of PEs to be used for analysis.

In step S801, the host terminal 150 calculates the reference value Tref of the total processing time T (h) of the PEs that are not in charge of output, in nz PEs of the focused row. The host terminal 150 calculates the reference Tref in the manner similar to the manner in which the control device 120 calculates the reference value Tref in step S108.

That is, the host terminal 150 may use the total processing time of any one of PEs that are not in charge of output as the reference value Tref, or may use a statistic of the total processing times T(h) of the PEs that are not in charge of output as the reference value Tref. The statistic may be, specifically, the minimum value.

Next, in step S802, the host terminal 150 initializes the index variable q to 1.

Next, in step S803, the host terminal 150 calculates the total processing time of the PE_o(q) (that is, the q-th PE that is in charge of output in the current tentative assignment). Hereinafter, for the convenience of explanation, the total processing time of the PE_o(q) is described as "To(q)". The calculation method of the total processing time To (q) in step S803 is the same as the method by which the control device 120 calculates the total processing time in step S107.

Furthermore, in step S804, the host terminal 150 calculates the difference between the total processing time To (q) of the PE_o(q) and the reference value Tref. Hereinafter, for the convenience of explanation, the calculated difference is "T_out(q)".

Next, in step S805, the host terminal 150 compares the difference T_out(q) and a threshold (for convenience, described as "Tb"). The Tb may be a value according to the reference value Tref. For example, the threshold Tb may be a value obtained by multiplying the reference value Tref with a relatively small positive constant value (0.1 for example).

When T_out(q)<Tb, the host terminal 150 determines that "compared with the other PEs that are not in charge output, the PE_o(q) is not subject to any excessive load". Therefore, when T_out(q)<Tb, the host terminal 150 executes step S806 next.

On the other hand, when T_out(q)≥Tb, the host terminal 150 determines that "according to the current tentative assignment, compared with the other PEs that are not in charge output, an excessive load is put on the PE_o(q)". That is, the host terminal 150 determines that "it is appropriate to disperse the cells assigned to the PE_o(q) by the current tentative assignment to the PE_o(q) and further another one or more PEs". Therefore, when T_out(q)≥Tb, in order to decide "how many PEs are to be newly added for dispersion", the host terminal 150 executes step S807 next.

Hereinafter, for the convenience of explanation, let "m(q)" be the number of PEs to which the cells currently assigned to the PE_o(q) by the current tentative assignment are to be reassigned.

In step S806, the host terminal 150 sets m(q) to 1. On the other hand, in step S807, the host terminal 150 sets the m(q) as in the expression (29).

$$m(q)=\text{int}(T\_\text{out}(q)/Tb) \quad (29)$$

Meanwhile, the function int(r) in the expression (29) may be a function that returns an integer closest to the argument, or may be a ceil function, or may be a floor function. After setting m(q) in step S806 or S807, the host terminal 150 judges, in step S808, whether or not the index variable q is equal to the number N of the PEs in charge of output under the current tentative assignment among the nz PEs of one row.

If q≠N, (specifically, if q<N), the host terminal 150 executes step S809 next. On the other hand, if q=N, the host terminal 150 executes step S810 next.

In step S809, the host terminal 150 increments the index variable q by 1. Then, the host terminal 150 executes step S803 again.

Meanwhile, in step S810, the host terminal 150 calculates the number M of PEs to be increased per row, according to the expression (30).

$$M=\max(1,m(1)+m(2)+\ldots+m(N)-N) \quad (30)$$

By the way, whether it is actually feasible to add M PEs per row or not depends on the number of the remaining available PEs (more precisely, it depends on at which positions in the network topology of PEs the available PEs remain). Therefore, next to step S810, in step S811, the host terminal 150 judges whether or not sufficient PEs remain available.

For example, it is assumed that the PEs are two-dimensionally connected together as in the topology T2 in FIG. 4, and that ny=3, nz=4, and M=2. In this case, the host terminal 150 judges whether or not it is possible to increase the number of columns from 4 to 6(=4+2). That is, the host terminal 150 judges whether 18 PEs arranged in the range of "3 rows×6 columns" remain available or not. The judgment in step S811 is based on the notification from the control device 120 in step S103.

When it is possible to increase the number of columns from nz to (nz+M) (that is, when ny×(nz+M) PEs in the range of "ny rows×(nz+M) columns" are in the available state), sufficient PEs remain available. Therefore, in this case, there is no need to reduce the value M calculated in step S810, and therefore the process in FIG. 22 is also terminated.

On the other hand, when the number of available PEs is less than ny×(nz+M), or when the available PEs are not successive in the range of "ny rows×(nz+M) columns", the host terminal 150 determines that available PEs do not remain sufficiently. Then, upon determining that available PEs do not remain sufficiently, the host terminal 150 reduces the value of M in step S812 according to the remaining available PE(s).

For example, it is assumed that the PEs are two-dimensionally connected together as in the topology T2 in FIG. 4, and that ny=3 and nz=4. In addition, it is assumed that the host terminal 150 calculates the value of M in step S810 as 2. Then, it is assumed that according to the notification in step S103, 15 successive PEs in the range of "3 rows×(4+1) columns" are available. However, it is assumed that the part in which 18 available PEs remain in the range of "3 rows×(4+2) columns" does not exist in the topology T2. In this case, the host terminal 150 reduces the value of M to 1 in step S811. When the change of the value of M in step S811 is terminated, the process in FIG. 22 is also terminated.

As described above, in step S701 in FIG. 21, the host terminal 150 decides to increase the number of PEs to be used for analysis from n(=ny×nz) to ny×(nz+M).

Meanwhile, as a result of execution of step S812, there may be a case in which the value of M becomes 0. In this case, in step S702 in FIG. 21, the process similar to that in the second embodiment is performed. That is, when M=0, the host terminal 150 increases the number of PEs that are in charge of output, without increasing the number of PEs to be used for analysis.

Hereinafter, details of step S702 in the case where M>0 are explained.

It is assumed that, according to the current tentative assignment, in each row, sequentially from the one closer the origin in the Z direction, a total of nz PEs as described below are included.

u1 PEs that are not in charge of output (where 0≤u1≤nz−N)

N PEs that are in charge of output u2 PEs that are not in charge of output (where 0≤u2≤nz−N and u1+u2=nz−N)

For example, in the row of the PE(1) through the PE(nz), the PE(1) through the PE(u1) are not in charge of output, and the PE(u1+1) through the PE(u1+N) are in charge of output, and the PE(u1+N+1) through the PE(nz) are not in charge of output.

The host terminal 150 performs the reassignment in step S702 in FIG. 21, specifically, so that the u1 PEs that are not in charge of output, the (N+M) PEs that are in charge of output, and the u2 PEs that are in charge of output are included in each row. When M>0 in the third embodiment, the host terminal 150 is modified as follows according to the flowchart in FIGS. 15-16. Alternatively, according to the flowchart in FIGS. 17-18, the reassignment is performed regarding the focused row.

Specifically, the reassigning process in FIGS. 15-16 is modified as follows in the third embodiment. Meanwhile, for the convenience of explanation, the modified process in FIGS. 15-16 is assumed to be executed regarding the row of the PE(1)-PE(nz+M).

In step S501, the range in the Z direction of the output area is assigned equally to the PE_o(1)-PE_o(N+M). In addition, at least part of cells positioned relatively closer to the output area in the nearer side cells outside the output area are assigned to the PE_o(1). In the similar manner, at least part of cells positioned relatively closer to the output area in the far end side cells outside the output area are assigned to the PE_o(N+M). Meanwhile, the number of "at least part of cells" (specifically, the number of cells in the Z direction) may be determined arbitrarily by the host terminal 150.

In step S502, whether or not PE_o(N+M) and PE(nz+M) are the same is judged.

The process in steps S503-S509 and S511 regarding the PE_o(N+1) is replaced by a process regarding the PE_o(N+M).

The process in step S510 regarding the PE_o(N+1) and the PE_o(N) is replaced by a process regarding the PE_o(N+M) the PE_o(N+M−1).

In step S514, the remaining part of the output area is assigned equally to the PE_o(1)-PE_o(N+M−1).

In step S525, the remaining part of the output area is assigned equally to the PE_o(2)-PE_o(N+M−1).

In addition, the reassigning process in FIGS. 17-18 is modified as follows in the third embodiment. Meanwhile, for the convenience of explanation, it is assumed that the modified process in FIGS. 17-18 is executed regarding the row of the PE(1)-PE(nz+M).

In step S601, the range in the Z direction of the output area is assigned equally to the PE_o(1)-PE_o(N+M). In addition, at least part of cells positioned relatively closer to the output area in the nearer side cells outside the output area are assigned to the PE_o(1). In the similar manner, at least part of cells positioned relatively closer to the output area in the far end side cells outside the output area are assigned to the PE_o(N+M). Meanwhile, the number of "at least part of cells" (specifically, the number of cells in the Z direction) may be determined arbitrarily by the host terminal 150.

In step S613, whether the PE_o(N+M) and the PE(nz+M) are the same is judged. Then, when the two are the same, in step S614, the remaining part of the output area is assigned equally to the PE_o(2)-PE_o(N+M).

The process in the steps S615-S621 and S623 regarding the PE_o(N+1) is replaced by a process regarding the PE_o(N+M).

The process in step S622 regarding the PE_o(N+1) and PE_o(N) is replaced by a process regarding the PE_o(N+M) と PE_o(N+M−1)

In step S625, the remaining part of the output area is assigned equally to the PE_o(2)-PE_o(N+M−1).

Meanwhile, the host terminal 150 may decide which of the flowcharts, namely "the modified flowchart in FIGS. 15-16" and the modified flowchart in FIGS. 17-18" to follow in performing the reassignment, in the following manner.

There may be a first case in which the PE_o(1) in the current tentative assignment immediately before executing the reassignment in step S702 is the PE that is closest to the origin in the Z direction (for example, when the PE_o(1) is the PE(1)). In this case, the host terminal 150 performs the reassignment in step S702 according to the modified flowchart in FIGS. 15-16.

There may be a case in which the PE_o(N) in the current tentative assignment is the PE that is farthest from the origin in the Z direction (for example, when the PE_o(N) is PE(nz)). In this case, the host terminal 150 performs the reassignment in step S702 according to the modified flowchart in FIGS. 17-18.

Then, in a case which is neither of the above two cases, the host terminal 150 may select one of the modified flowchart in FIGS. 15-16 and the modified flowchart in FIGS. 17-18.

The Z coordinate Zc of the center point of all the cells assigned to the PE_o(1)-PE_o(N) under the current tentative assignment The Z coordinate Zoc of the center point of the output area For example, when Zoc>Zc, the host terminal 150 performs the reassignment in step S702 according to the modified flowchart in FIGS. 15-16. On the other hand, when Zoc≤Zc, the host terminal 150 performs the reassignment in step S702 according to the modified flowchart in FIGS. 17-18.

In any case, by adjusting the boundary by a similar method as in the second embodiment, the host terminal 150 performs the reassignment in a certain row in step S702. Then, the host terminal 150 applies the result of the reassignment to the other rows. After that, the host terminal 150 performs the notification in step S105 again.

Figure 23:
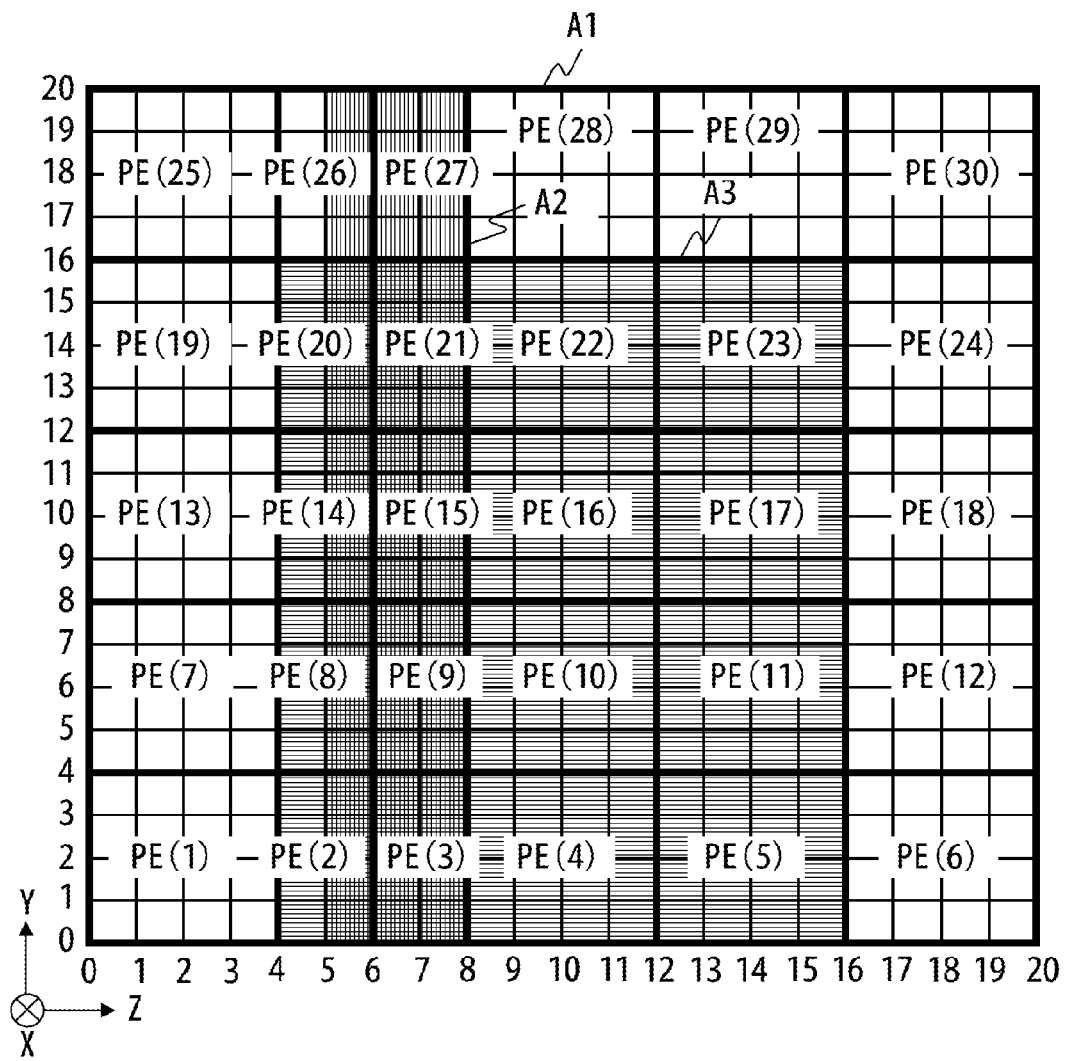
FIG. 23 is a diagram illustrating an example of the eventual assignment according to the third embodiment.

Now, FIG. 23 is a diagram illustrating an example of the eventual assignment according to the third embodiment. Specifically, FIG. 23 illustrates an example of the eventual assignment in a case in which the initial assignment as in FIG. 8 is performed in step S104. The analysis target area A1, the output area A2, and the object area A3 in FIG. 23 are the same as those in FIG. 8. In addition, FIG. 23 is an example of a case in which only the change of the assignment in the Z axis direction is performed (that is, no change of the assignment in the Y axis direction is performed).

Meanwhile, in both of the FIG. 8 and FIG. 23, description such as "PE(6)" is present. However, in FIG. 23, numbers such as "(6)" are renumbered, and therefore, the PE(6) in FIG. 8 and the PE(6) in FIG. 23 are not the same.

For example, it is assumed that the range of the PEs used for the analysis is expanded in the positive direction of the Z axis in the topology T2 in FIG. 4. In this case, The PE(1), PE(7), PE(13), PE(19), PE(25) in FIG. 23 respectively correspond to the PE(1), PE(6), PE(11), PE(16), PE(21) in FIG. 8. In addition, in this case, PE(5), PE(11), PE(17), PE(23), PE(29) in FIG. 23 respectively correspond to the PE(5), PE(10), PE(15), PE(20), PE(25) in FIG. 8.

On the other hand, there may also be a case where the range of PEs for use in the analysis is expanded in the negative direction of the Z axis in the topology T2 in FIG. 4. In this case, the PE(6), PE(12), PE(18), PE(24), PE(30) in FIG. 23 respectively correspond to the PE(5), PE(10), PE(15), PE(20), PE(25) in FIG. 8. In addition, in this case, the PE(2), PE(8), PE(14), PE(20), PE(26) in FIG. 23 respectively correspond to the PE(1), PE(6), PE(11), PE(16), PE(21) in FIG. 8.

Either the range of the PEs to be used for the analysis is expanded in the positive direction or the negative direction of the Z axis, regarding j where $0 \le j \le 4$, the following holds true.

In FIG. 8, 80×XN cells with which the grid coordinates (X,Y,Z) satisfy $0 \le X \le XN$ and $4j \le Y \le 4j+4$ and $0 \le Z \le 20$ are assigned equally to five PEs (that is, PE(5j+1)-PE(5j+5)). Meanwhile, in FIG. 23 these 80×XN cells are assigned to six PEs (that is, PE(6j+1)-PE(6j+6)).

Specifically, in FIG. 23, to the PE(6j+1), 16×XN cells in a range that satisfies $0 \le Z \le 4$ are assigned, to the PE(6j+2), 8×XN cells in a range that satisfies $4 \le Z \le 6$ are assigned. In addition, to the PE(6j+3), 8×XN cells in a range that satisfies $6 \le Z \le 8$ are assigned, to the PE(6j+4), 16×XN cells in a range that satisfies $8 \le Z \le 12$ are assigned. Then, to the PE(6j+5), 16×XN cells in a range that satisfies $12 \le Z \le 16$ are assigned, to the PE(6j+6), 16×XN cells in a range that satisfies $16 \le Z \le 20$ are assigned.

As described above, to the PE to which the cells included in the output area A2 are assigned, only a relatively small number 8×XN of cells are assigned. Meanwhile, to the PE to which the cells included in the output area A2 are not assigned, a relatively large number 16×XN of cells are assigned. As a result, as a whole, the uniformity in total processing times among PEs is improved, and the unnecessary wait time is reduced. Therefore, the entire analysis is also made faster.

By the way, the present invention is not limited to the first through third embodiments described above. While in the explanation above, some modifications are explained, the first through third embodiments may further be modified variously from the following viewpoint. Any combination of the various modifications described above and below is possible, as long as there is no contradiction with each other.

There may be various methods to estimate the total processing time according to how the analysis by the parallel FDTD method is programmed. In addition, there may also be various criterion with respect to the uniformity in the total processing time, according to the embodiment.

In the embodiments described above, for example, in some steps as follows, two numerical values are compared.

Step S108 in FIG. 5 and FIG. 21

Step S307 in FIG. 13

Steps S506, S508, S512, S518, S520, S524 in the reassigning process in FIGS. 15-16

Steps S606, S608, S612, S618, S620, S624 in the reassigning process FIGS. 17-18

The comparison of two numerical values in these steps may be a process to judge "whether the first numerical value exceeds the second numerical value", or may be a process to judge "whether the first numerical value is equal to or more than the second numerical value" depending on an embodiment.

In addition, the system configuration illustrated in FIGS. 3-4 is an example. The embodiments described above may be applied to a system of another configuration. Depending on the network, the host terminal 150 may include two or more network interfaces, while the control device 120 may include only one network interface. Depending on an embodiment, a certain particular PE may operate not only as a PE for analysis, but also may operate as the host terminal 150 and/or the control device 120.

In addition, regarding the second through third embodiments, the process to apply the change regarding PEs of a certain row to the other rows has been described. However, depending on the topology of the connection between PEs, a change of assignment may be performed independently for each row.

In addition, whether to divide the analysis target area into a plurality of one-dimensional cells, or into a plurality of two-dimensional cells, or into a plurality of three-dimensional cells may be appropriately decided according to an embodiment. There may be various kinds of connection topology of PEs depending on an embodiment.

Regarding the second through third embodiments, the reassignment by adjustment in the Z direction has been explained. Depending on an embodiment, before or after the repetition of the reassignment by the adjustment in the Z direction, the host terminal 150 may perform reassignment by adjustment in the Y direction. For example, regarding the initial assignment as in FIG. 8, the host terminal 150 may reduce the Y coordinate of the boundary between the set of cells assigned to the PE(17) and the set of cells assigned to the PE(22). Such movement of the boundary in the Y direction corresponds to the process in step S503 in the case in which a similar process in FIGS. 15-16 is performed regarding the Y direction.

In the similar manner, the host terminal 150 may perform reassignment by adjustment in the X direction. By appropriately modifying the flowchart in FIGS. 15-18, the flowchart in FIGS. 15-18 is made applicable to the reassignment by adjustment in the Y direction, and is also made applicable to the reassignment by adjustment in the X direction. As described above, the reassignment may include only the adjustment along a certain one coordinate axis, or may include the adjustment along each of two or three coordinate axes.

Meanwhile, the flowchart in FIGS. 15-18 illustrates a specific procedure to adjust the boundary of the assignment of cells to the PEs by each one cell along one coordinate axis (specifically, the Z axis). However, the procedure of adjustment by moving the boundary is not limited to the procedure illustrated in the flowchart in FIGS. 15-18. For example, the boundary may be moved per a plurality of cells.

In addition, the policy for deciding "whether to apply the procedure in FIGS. 15-16 or the procedure in FIGS. 17-18" is not limited to the policy as in the second through third embodiments. For example, an embodiment in which the procedure in FIGS. 15-16 is always applied, an embodiment in which the procedure in FIGS. 17-18 is always applied, and the like are possible.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An assigning method comprising:

calculating, by a computer, a position-dependent processing load to be caused by a process that depends on a position of a cell, for each of a plurality of cells into which a spatial area specified as a target of an analysis to be executed by two or more processing devices that are included in a first number of processing devices and synchronize for each unit of the analysis in time domain is divided; and assigning, by the computer, the plurality of cells to a second number of processing devices which are part or all of the first number of processing devices, under a condition where a criterion determined with respect to uniformity in a total processing time among processing devices used for the analysis is met, the total processing time of each individual processing device used for the analysis including a length of time to be taken for the individual processing device to execute each process depending on the position of each of one or more cells to be assigned to the individual processing device among the plurality of cells, wherein when calculating the position-dependent processing load of a cell included in an output area that is included in the spatial area and is specified as a target about which a result of the analysis is to be output, the computer includes an output load to be caused by an output process to output data, into the position-dependent processing load.

2. The assigning method according to claim 1, wherein the computer allows the criterion to be met by assigning first cells including one or more cells included in the output area, to a first processing device of the second number of devices, and by assigning only second cells not included in the output area, to a second processing device of the second number of processing devices, and a number of the second cells is larger than a number of the first cells.

3. The assigning method according to claim 1, further comprising:
deciding the second number;
tentatively assigning the plurality of cells to the decided second number of processing devices;
when the criterion is not met among the second number of processing devices under tentative assignment, increasing a third number that is a number of processing devices to which cells belonging to a certain group for which the position-dependent processing load is relatively heavy among the plurality of cells are to be assigned; and
tentatively reassigning the plurality of cells to the second number of processing devices, according to the increased third number.

4. The assigning method claim 3, wherein
when at least one of the cells belonging to the certain group is tentatively assigned to a first processing device, and none of the cells belonging to the certain group is tentatively assigned to a second processing device that is adjacent to the first processing device in a network topology of the first number of processing devices, the computer increases the third number by assigning at least one of the cells belonging to the certain group to the second processing device.

5. The assigning method according to claim 3, wherein
the computer allows the criterion to be met
by assigning first cells including one or more cells belonging to the certain group, to a first processing device of the second number of processing devices, and
by assigning only second cells not included in the certain group, to a second processing device of the second number of processing devices, and a number of the second cells is larger than a number of the first cells.

6. The assigning method according to claim 3, wherein the criterion is that a ratio, a difference or both the ratio and the difference between the total processing times stay within a determined allowable range among the decided second number of processing devices.

7. The assigning method according to claim 1, further comprising:
tentatively deciding the second number;
tentatively assigning the plurality of cells to the tentatively-decided second number of processing devices;
increasing the second number when the criterion is not met among the second number of processing devices under tentative assignment; and
tentatively reassigning the plurality of cells to the increased second number of processing devices.

8. The assigning method according to claim 7, wherein
when tentatively reassigning the plurality of cells to the increased second number of processing devices, the computer increases a number of processing devices to which cells belonging to a certain group for which the position-dependent processing load is relatively heavy among the plurality of cells are to be tentatively assigned.

9. The assigning method according to claim 8, wherein
the computer allows the criterion to be met
by assigning first cells including one or more cells belonging to the certain group, to a first processing device of the increased second number of processing devices, and
by assigning only second cells not included in the certain group, to a second processing device of the increased second number of processing devices, and
a number of the second cells is larger than a number of the first cells.

10. The assigning method according to claim 7, wherein the criterion is that a ratio, a difference or both the ratio and the difference between the total processing times stay within a determined allowable range among the tentatively decided second number of processing devices.

11. The assigning method according to claim 1, wherein
when calculating the position-dependent processing load of a cell which is one of the plurality of cells and for which one or more input parameters specific to a position are specified, the computer includes a reading-in load to be caused by a reading-in process to read in the one or more input parameters, into the position-dependent processing load.

12. The assigning method according to claim 11, wherein the one or more input parameters include at least one of:
a parameter that defines a wave source positioned in the spatial area; and
a parameter that defines a characteristic of a circuit element positioned in the spatial area.

13. The assigning method according to claim 1, wherein the position-dependent processing load of a cell that is in contact with a boundary between two different media is calculated, by the computer, to be larger than the position-dependent processing load of a cell positioned inside one medium.

14. The assigning method according to claim 1, wherein the analysis is an analysis according to a parallel finite-difference time-domain method.

15. The assigning method according to claim 1, wherein the position-dependent processing load of a cell that is in contact with an absorbing boundary is calculated, by the computer, to be larger than the position-dependent processing load of a cell that is not in contact with the absorbing boundary.

16. The assigning method according to claim 1, wherein the total processing time includes a length of time to be taken to transmit and receive data to and from one or more other processing devices.

17. A non-transitory computer-readable recording medium having stored therein a program for causing a computer to execute a process comprising:
calculating a position-dependent processing load to be caused by a process that depends on a position of a cell, for each of a plurality of cells into which a spatial area specified as a target of an analysis to be executed by two or more processing devices that are included in a first number of processing devices and synchronize for each unit of the analysis in time domain is divided; and
assigning the plurality of cells to a second number of processing devices which are part or all of the first number of processing devices, under a condition where a criterion determined with respect to uniformity in a total processing time among processing devices used for the analysis is met, the total processing time of each individual processing device used for the analysis including a length of time to be taken for the individual processing device to execute each process depending on the position of each of one or more cells to be assigned to the individual processing device among the plurality of cells, wherein
when calculating the position-dependent processing load of a cell included in an output area that is included in the spatial area and is specified as a target about which a result of the analysis is to be output, the computer includes an output load to be caused by an output process to output data, into the position-dependent processing load.

18. An information processing apparatus comprising:

a processor that:

calculates a position-dependent processing load to be caused by a process that depends on a position of a cell, for each of a plurality of cells into which a spatial area specified as a target of an analysis to be executed by two or more processing devices that are included in a first number of processing devices and synchronize for each unit of the analysis in time domain is divided; and assigns the plurality of cells to a second number of processing devices which are part or all of the first number of processing devices, under a condition where a criterion determined with respect to uniformity in a total processing time among processing devices used for the analysis is met, the total processing time of each individual processing device used for the analysis including a length of time to be taken for the individual processing device to execute each process depending on the position of each of one or more cells to be assigned to the individual processing device among the plurality of cells, wherein when calculating the position-dependent processing load of a cell included in an output area that is included in the spatial area and is specified as a target about which a result of the analysis is to be output, the processor includes an output load to be caused by an output process to output data, into the position-dependent processing load.

* * * * *